(12) United States Patent
Song et al.

(10) Patent No.: US 10,916,700 B2
(45) Date of Patent: Feb. 9, 2021

(54) MEMORY DEVICE WITH MEMORY CELL PILLAR HAVING RESISTIVE MEMORY LAYER WITH WEDGE MEMORY PORTION AND BODY MEMORY PORTION, AND METHOD OF FABRICATING THE SAME

(71) Applicant: Samsung Electronics Co., Ltd., Suwon-si (KR)

(72) Inventors: Seul-ji Song, Yongin-si (KR); Sung-won Kim, Hwaseong-si (KR); Il-mok Park, Seoul (KR); Jong-chul Park, Seongnam-si (KR); Ji-hyun Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/513,014

(22) Filed: Jul. 16, 2019

(65) Prior Publication Data

US 2019/0341547 A1 Nov. 7, 2019

Related U.S. Application Data

(63) Continuation of application No. 15/867,951, filed on Jan. 11, 2018, now Pat. No. 10,403,817.

(30) Foreign Application Priority Data

Jun. 27, 2017 (KR) ........................ 10-2017-0081387

(51) Int. Cl.
*H01L 45/00* (2006.01)
*H01L 27/24* (2006.01)
*H01L 27/22* (2006.01)

(52) U.S. Cl.
CPC .......... *H01L 45/126* (2013.01); *H01L 27/224* (2013.01); *H01L 27/2427* (2013.01);
(Continued)

(58) Field of Classification Search
CPC ... H01L 45/126; H01L 45/06; H01L 45/1233; H01L 27/224; H01L 27/2427; H01L 27/2463
(Continued)

(56) References Cited

U.S. PATENT DOCUMENTS 8,507,353 B2 8/2013 Oh et al.
8,633,528 B2 1/2014 Xu et al.
(Continued)

FOREIGN PATENT DOCUMENTS

JP 2008-085204 A 4/2008
KR 10-2011-0086453 A 7/2011
(Continued)

OTHER PUBLICATIONS

German Office Action dated Aug. 5, 2020 for corresponding German Patent Application No. DE 102018103436.9 and English translation thereof.

*Primary Examiner* — Andy Huynh
(74) *Attorney, Agent, or Firm* — Harness, Dickey & Pierce, P.L.C.

(57) ABSTRACT

A method of fabricating a memory device may include forming a first conductive line extending over a substrate in a first direction, forming a memory cell pillar on the first conductive line, and forming a second conductive line extending over the memory cell pillar in a second direction that intersects the first direction, such that the first and second conductive lines vertically overlap with the memory cell pillar interposed between the first and second conductive lines. The memory cell pillar may include a heating electrode layer and a resistive memory layer. The resistive memory layer may include a wedge memory portion and a body memory portion. The wedge memory portion may contact the heating electrode layer and may have a width that that changes with increasing distance from the heating (Continued)

electrode layer. The body memory portion may be connected to the wedge memory portion.

20 Claims, 52 Drawing Sheets

(52) U.S. Cl.
CPC .......... *H01L 27/2463* (2013.01); *H01L 45/06* (2013.01); *H01L 45/1233* (2013.01); *H01L 45/1683* (2013.01)

(58) Field of Classification Search
USPC .......................................................... 257/4
See application file for complete search history.

(56) References Cited

U.S. PATENT DOCUMENTS

| | | | |
|---|---|---|---|
| 8,790,976 | B2 | 7/2014 | Oh et al. |
| 8,859,385 | B1 | 10/2014 | Bae et al. |
| 8,988,926 | B2 | 3/2015 | Pellizzer et al. |
| 2006/0097341 | A1 | 5/2006 | Pellizzer et al. |
| 2007/0262301 | A1* | 11/2007 | Cowburn ............... B82Y 25/00 257/40 |
| 2008/0089104 | A1 | 4/2008 | Tanaka et al. |
| 2008/0128675 | A1 | 6/2008 | Magistretti et al. |
| 2008/0272355 | A1 | 11/2008 | Cho et al. |
| 2011/0073829 | A1 | 3/2011 | Park et al. |
| 2011/0240950 | A1 | 10/2011 | Ryu et al. |
| 2011/0266516 | A1 | 11/2011 | Park |
| 2012/0040508 | A1 | 2/2012 | Oh et al. |
| 2012/0305875 | A1 | 12/2012 | Shim |
| 2012/0305876 | A1 | 12/2012 | Baek et al. |
| 2013/0302966 | A1 | 11/2013 | Oh et al. |
| 2013/0313503 | A1 | 11/2013 | Xu et al. |
| 2013/0336046 | A1 | 12/2013 | Oh |
| 2014/0198565 | A1 | 7/2014 | Pellizzer et al. |
| 2014/0301137 | A1 | 10/2014 | Kim et al. |
| 2014/0353569 | A1 | 12/2014 | Lee et al. |
| 2015/0108422 | A1 | 4/2015 | Pellizzer et al. |
| 2015/0372135 | A1* | 12/2015 | Park .................. H01L 29/66666 257/2 |
| 2016/0049447 | A1 | 2/2016 | Jung et al. |
| 2016/0056376 | A1 | 2/2016 | Horii et al. |

FOREIGN PATENT DOCUMENTS

| | | |
|---|---|---|
| KR | 10-2013-0141949 A | 12/2013 |
| KR | 10-2016-0023974 A | 3/2016 |

\* cited by examiner

MEMORY DEVICE WITH MEMORY CELL PILLAR HAVING RESISTIVE MEMORY LAYER WITH WEDGE MEMORY PORTION AND BODY MEMORY PORTION, AND METHOD OF FABRICATING THE SAME

CROSS-REFERENCE TO RELATED APPLICATIONS

This application is a continuation of U.S. application Ser. No. 15/867,951, filed on Jan. 11, 2018, which claims the benefit, under 35 U.S.C. § 119, of Korean Patent Application No. 10-2017-0081387, filed on Jun. 27, 2017, in the Korean Intellectual Property Office, the disclosure of each of which is incorporated herein in its entirety by reference.

BACKGROUND

The inventive concepts relate to memory devices and methods of fabricating the same, and more particularly, to memory devices having a cross-point array structure and methods of fabricating the same.

With the continuous trend of producing lighter, thinner, and smaller electronics, there is increasing demand for increased integration of semiconductor devices. 3-dimensional (3D) cross-point stack-structured memory devices, in which a memory cell is arranged at a cross-point between two electrodes crossing each other, are proposed as next-generation non-volatile memory devices that may enable such increased integration. As the increased integration and down-scaling ("miniaturization") of cross-point stack-structured memory devices are continuously required, reduction in sizes of components comprising a memory device is required, and thus, there is a need to develop a structure configured to minimize power consumption of a highly integrated memory device and improve the reliability thereof.

SUMMARY

The inventive concepts include a cross-point stack-structured memory device having a structure configured to minimize power consumption and improve reliability even though sizes of components constituting the memory device are reduced due to demand for high integration.

The inventive concepts also provides a method of fabricating a cross-point stack-structured memory device, which has a structure configured to minimize power consumption and improve reliability of the memory device, the method allowing the memory device to be realized using a simplified process, even though sizes of components constituting the memory device are reduced due to demand for high integration.

According to some example embodiments, a memory device may include a first conductive line extending over a substrate in a first direction, a second conductive line extending over the first conductive line in a second direction that intersects the first direction, such that the first conductive line and the second conductive line vertically overlap at a cross-point between the first conductive line and the second conductive line, and a memory cell pillar at the cross-point between the first conductive line and the second conductive line. The memory cell pillar may be connected at opposite ends to the first conductive line and the second conductive line, respectively. The memory cell pillar may include a heating electrode layer and a resistive memory layer. The resistive memory layer may contact the heating electrode layer. The resistive memory layer may include a wedge memory portion having an inclined sidewall such that the wedge memory portion has a width that increases continuously in proportion with increasing distance from the heating electrode layer, and a body memory portion connected to the wedge memory portion such that the body memory portion and the wedge memory portion comprise an individual and continuous layer, the body memory portion having a greater width than the wedge memory portion.

According to some example embodiments, a memory device may include a first conductive line extending over a substrate in a first direction, a pair of second conductive lines extending over the first conductive line in a second direction that intersects the first direction, such that the first conductive line vertically overlaps each second conductive line at a separate cross-point of a pair of cross-points, a pair of memory cell pillars, each separate memory cell pillar of the pair of memory cell pillars at a separate cross-point of the pair of cross-points between the first conductive line and the pair of second conductive lines, a heating electrode layer shared by the pair of memory cell pillars, a first resistive memory layer comprising a first memory cell pillar of the pair of memory cell pillars, and a second resistive memory layer comprising a second memory cell pillar of the pair of memory cell pillars. The first resistive memory layer may include a first wedge memory portion contacting a first portion of the heating electrode layer and having a first sidewall that is inclined such that the first wedge memory portion has a width that increases continuously in proportion with increasing distance from the first portion, and a first body memory portion connected to the first wedge memory portion such that the first body memory portion and the first wedge memory portion comprise an individual and continuous layer, the first body memory portion having a greater width than the first wedge memory portion. The second resistive memory layer may include a second wedge memory portion contacting a second portion of the heating electrode layer and having a second sidewall that is inclined such that the second wedge memory portion has a width that increases continuously in proportion with increasing distance from the second portion, and a second body memory portion integrally connected to the second wedge memory portion such that the second body memory portion and the second wedge memory portion comprise another individual and continuous layer, the second body memory portion having a greater width than the second wedge memory portion.

According to some example embodiments, a method of fabricating a memory device may include forming a first conductive line over a substrate, forming a pair of first insulating walls over the first conductive line, the pair of first insulating walls are spaced apart from each other with a filling space therebetween, forming a preliminary heating electrode layer, an insulating spacer layer and a gap-fill insulating film in the filling space, such that the preliminary heating electrode layer conformally covers the pair of first insulating walls and the first conductive line, and the insulating spacer layer and the gap-fill insulating film sequentially cover the preliminary heating electrode layer, forming a lowered insulating spacer layer based on performing a first etching process in which an upper portion of the insulating spacer layer in the filling space is selectively etched as much as a certain thickness, forming a heating electrode layer and a first insulating spacer in the filling space based on performing a second etching process in which a portion of the lowered insulating spacer layer is removed while an upper portion of the preliminary heating electrode layer is selectively etched, wherein the heating electrode layer has a top surface that is at a lower level than a top surface of the lowered insulating spacer layer, and the first insulating spacer has an inclined sidewall, and forming a resistive memory layer in a region at least partially defined by the heating electrode layer, the inclined sidewall of the first insulating spacer, the pair of first insulating walls, and the gap-fill insulating film in the filling space.

The memory device according to the inventive concepts may minimize power consumption and exhibit improved reliability by improving heating efficiency upon switching operation even though sizes of components constituting the memory device having a cross-point stack structure are reduced.

The method of fabricating a memory device, according to the inventive concepts, allows a cross-point stack-structured memory device, which has a structure configured to improving heating efficiency upon switching operation by minimized power consumption, to be formed by a simplified process, even though sizes of components constituting the memory device are reduced.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
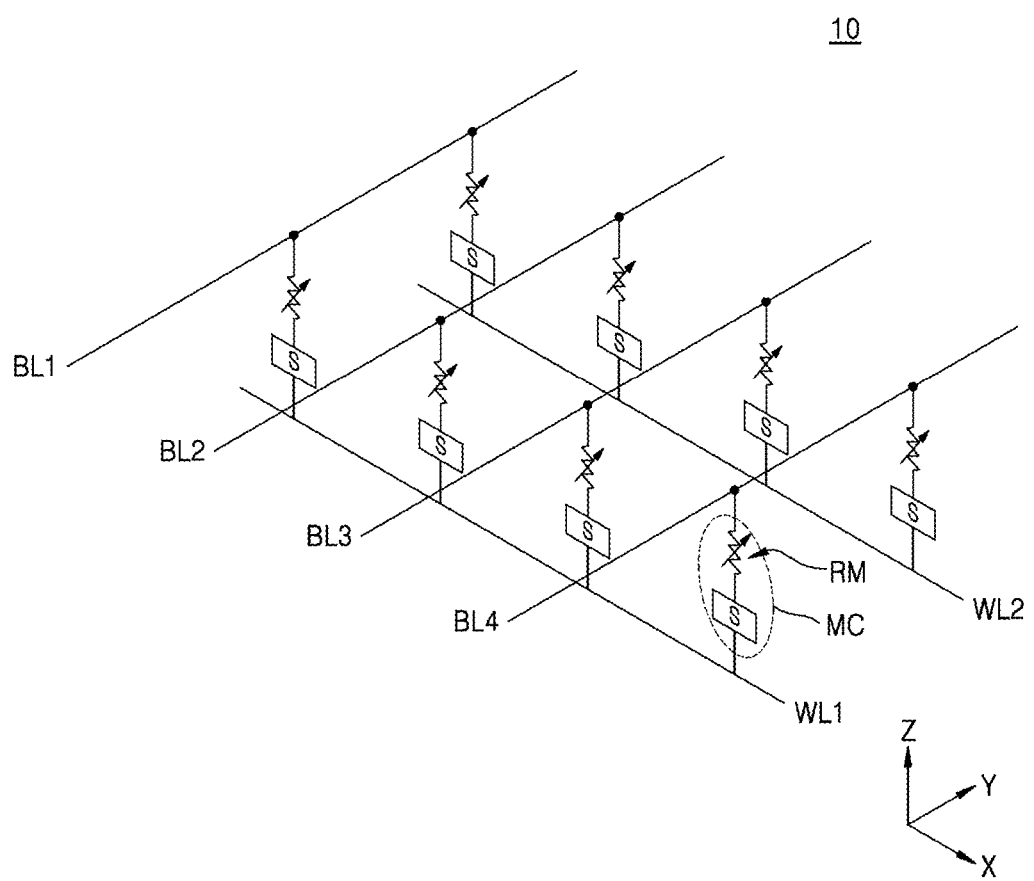
FIG. 1 is an equivalent circuit diagram of a portion of a memory device according to some example embodiments.

Hereinafter, embodiments of the inventive concepts will be described in detail with reference to the accompanying drawings. Like components will be denoted by like reference numerals throughout the specification, and repeated descriptions thereof will be omitted.

FIG. 1 is an equivalent circuit diagram of a portion of a memory device 10 according to some example embodiments.

Referring to FIG. 1, the memory device 10 includes word lines WL1 and WL2, which extend along a first direction (X direction) and are spaced apart from each other in a second direction (Y direction) that is perpendicular to the first direction, and bit lines BL1, BL2, BL3, and BL4, which are spaced apart from the word lines WL1 and WL2 in a third direction (Z direction) and extend along the second direction.

The memory device 10 includes a plurality of memory cells MC, which are respectively arranged at cross-points between the word lines WL1 and WL2 and the bit lines BL1, BL2, BL3, and BL4. Each of the plurality of memory cells MC may include a resistive memory layer RM for storing information ("configured to store information") and a selection device layer S for selecting a memory cell ("configured to select a memory cell"). The selection device layer S may be electrically connected to one of the word lines WL1 and WL2, the resistive memory layer RM may be electrically connected to one of the bit lines BL1, BL2, BL3, and BL4, and the resistive memory layer RM and the selection device layer S may be connected to each other in series. However, the inventive concepts is not limited thereto, the resistive memory layer RM may be connected to a word line, and the selection device layer S may be connected to a bit line.

To drive the memory device, voltage may be applied to the resistive memory layer RM of each memory cell MC through the word lines WL1 and WL2 and the bit lines BL1, BL2, BL3, and BL4, whereby current may flow through the resistive memory layer RM. An arbitrary memory cell MC may be addressed by performing selection from the word lines WL1 and WL2 and the bit lines BL1, BL2, BL3, and BL4, and the memory cell MC may be programmed by applying a certain signal between the word lines WL1 and WL2 and the bit lines BL1, BL2, BL3, and BL4. In addition, a value of current may be measured through the bit lines BL1, BL2, BL3, and BL4, whereby information according to a value of resistance of the resistive memory layer RM of the corresponding memory cell MC, that is, programmed information may be read.

Figure 2:
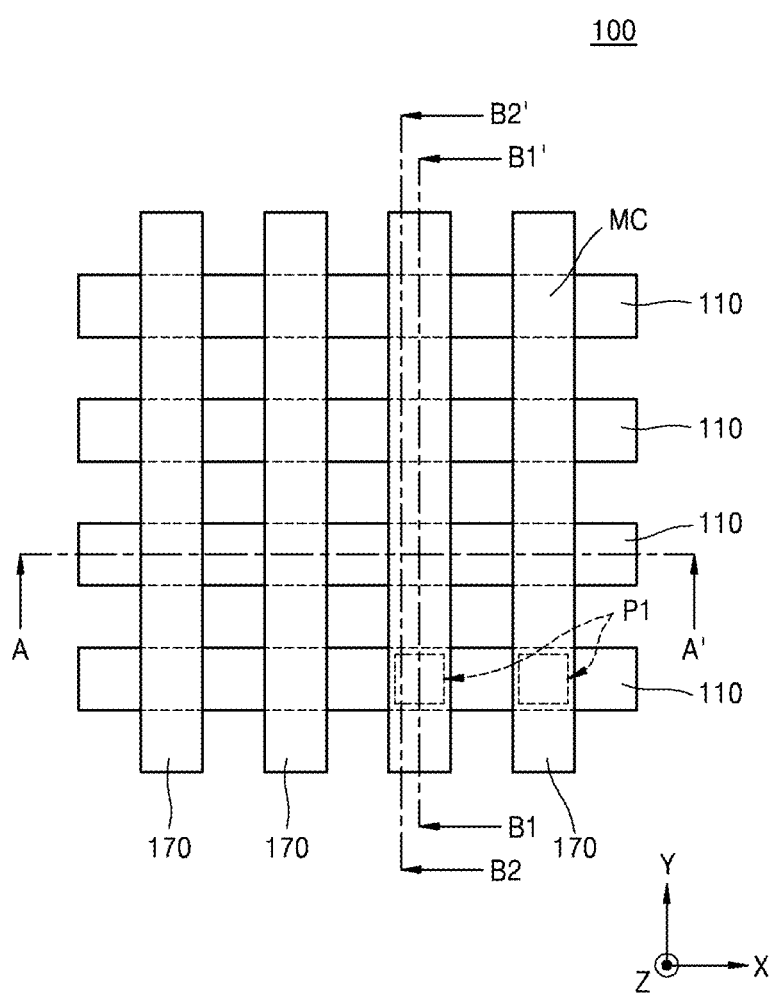
FIG. 2 is a schematic planar layout diagram illustrating main components of a memory device according to some example embodiments.
Figure 3A:
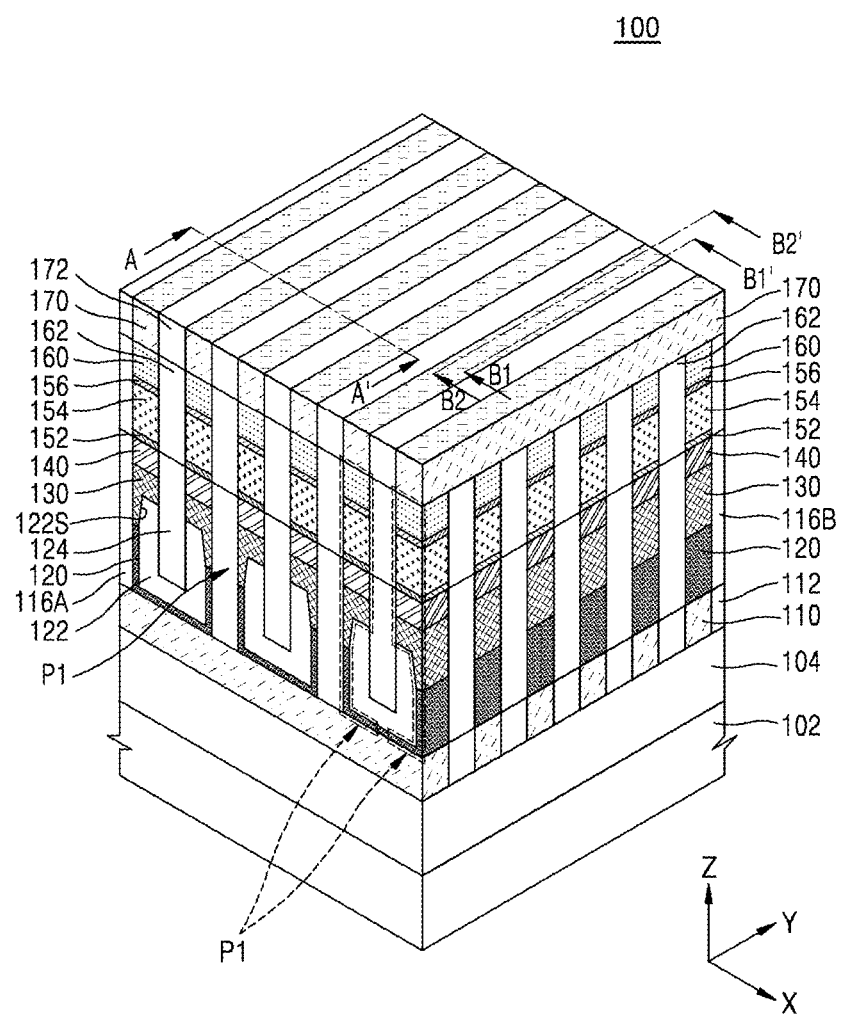
FIG. 3A is a perspective view illustrating main components of a memory device according to some example embodiments.
Figure 3B:
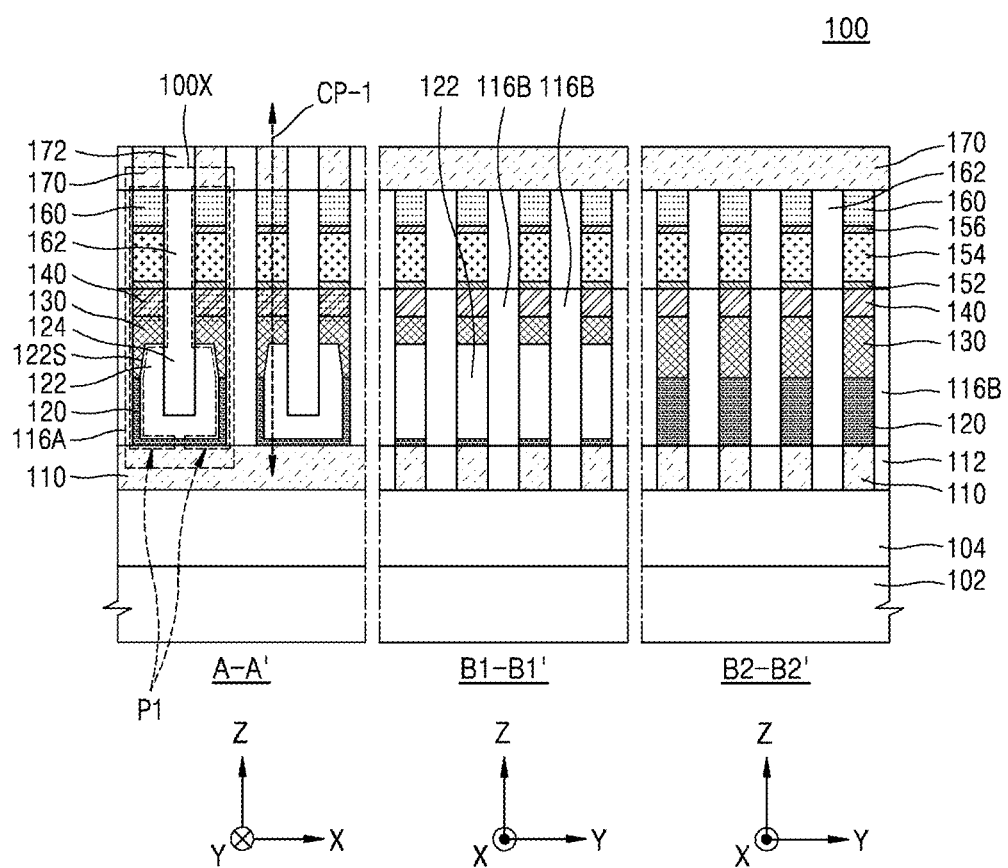
FIG. 3B illustrates cross-sectional views respectively taken along lines A-A', B1-B1', and B2-B2' of FIGS. 2 and 3A.
Figure 3C:
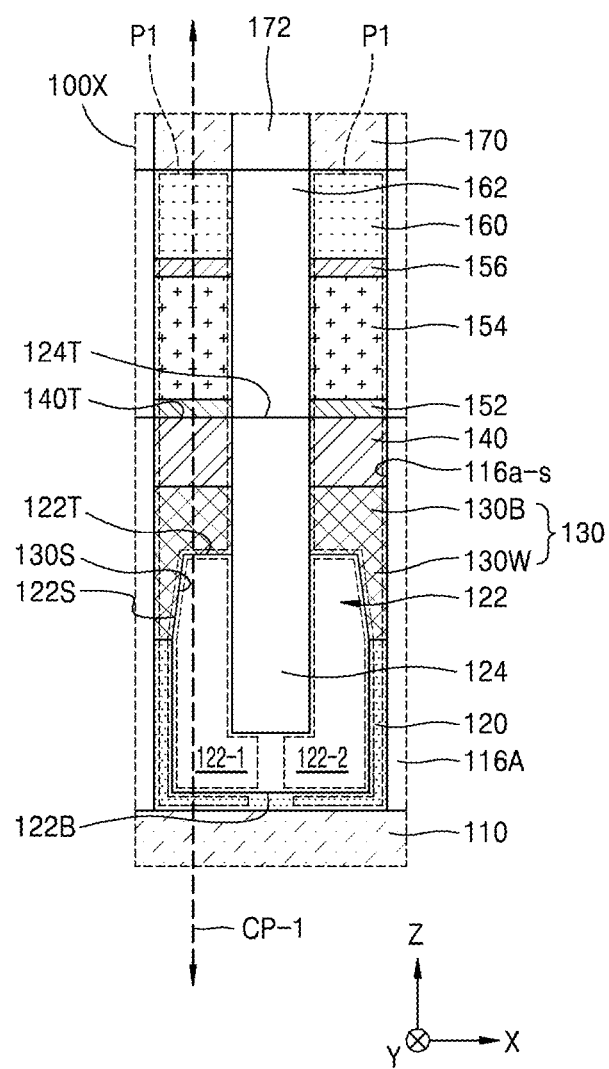
FIG. 3C is an enlarged cross-sectional view of a partial region of FIG. 3B.

FIGS. 2 to 3C are diagrams illustrating a memory device according to some example embodiments, and in particular, FIG. 2 is a schematic planar layout diagram illustrating main components of a memory device 100, FIG. 3A is a perspective view illustrating the main components of the memory device 100, and FIG. 3B illustrates cross-sectional views respectively taken along lines A-A', B1-B1', and B2-B2' of FIGS. 2 and 3A. FIG. 3C is an enlarged cross-sectional view of a dashed-line region 100X of FIG. 3B. The memory device 100 shown in FIGS. 2 to 3C may have the same equivalent circuit configuration as the memory device 10 shown in FIG. 1.

Referring to FIGS. 2 to 3B, the memory device 100 includes a plurality of first conductive lines 110 extending parallel to each other over a substrate 102 in a first direction (X direction), and a plurality of second conductive lines 170 extending parallel to each other in a second direction (Y direction) that intersects the first direction. Although the case that the first direction and the second direction are orthogonal to each other is illustrated in this example, the inventive concepts are not limited thereto.

An interlayer dielectric 104 may be arranged on the substrate 102. The interlayer dielectric 104 is configured to electrically isolate the plurality of first conductive lines 110 from the substrate 102, and may include an oxide film, a nitride film, or combinations thereof.

In some example embodiments, the plurality of first conductive lines 110 may constitute a plurality of word lines WL1 and WL2 shown in FIG. 1, and the plurality of second conductive lines 170 may constitute a plurality of bit lines BL1, BL2, BL3, and BL4 shown in FIG. 1. In some example embodiments, the plurality of first conductive lines 110 may constitute the plurality of bit lines BL1, BL2, BL3, and BL4, and the plurality of second conductive lines 170 may constitute the plurality of word lines WL1 and WL2. A plurality of first insulating patterns 112 may each be formed between two (adjacent) conductive lines of the plurality of first conductive lines 110, and a plurality of second insulating patterns 172 may each be formed between two (adjacent) conductive lines of the plurality of second conductive lines 170. Each insulating pattern of the plurality of first insulating patterns 112 and the plurality of second insulating patterns 172 may include a silicon oxide film, a silicon nitride film, or combinations thereof.

Each conductive line of the plurality of first conductive lines 110 and the plurality of second conductive lines 170 may include a metal, a conductive metal nitride, a conductive metal oxide, or combinations thereof. Each conductive line of the plurality of first conductive lines 110 and the plurality of second conductive lines 170 may include W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, ITO, alloys thereof, or combinations thereof. Each of the plurality of first conductive lines 110 and the plurality of second conductive lines 170 may further include a conductive barrier film. The conductive barrier film may include, for example, Ti, TiN, Ta, TaN, or combinations thereof.

A memory cell pillar P1 constituting a memory cell MC may be arranged at each cross-point CP-1 of a plurality of cross-points CP-1 between the plurality of first conductive lines 110 and the plurality of second conductive lines 170. Each cross-point CP-1 may be represented as a vertically-extending volume that extends through each of a particular first conductive line 110 and a particular second conductive line 170. As shown in FIG. 3B and FIG. 3C, each cross-point CP-1 may be represented as a vertically-extending axis that intersects both a particular first conductive line 110 and a particular second conductive line 170. A plurality of memory cell pillars P1 may be insulated from each other by a plurality of first insulating walls 116A and a plurality of second insulating walls 116B. Each insulating wall of the plurality of first insulating walls 116A and the plurality of second insulating walls 116B may include a silicon nitride film or a silicon oxide film.

A pair of memory cell pillars P1 is arranged between the plurality of first insulating walls 116A arranged in a row along the first direction (X direction). The plurality of second insulating walls 116B extend parallel to each other in the first direction (X direction), and the plurality of second insulating walls 116B and the plurality of memory cell pillars P1 are alternately arranged one by one along the second direction (Y direction). As shown in FIGS. 2-3C, a first insulating wall 116A may contact a memory cell pillar P1.

Each of the plurality of memory cell pillars P1 may include a heating electrode layer 120, a resistive memory layer 130, and an electrode layer 140, which are stacked on a first conductive line 110 in this stated order (e.g., "sequentially").

Figure 3D:
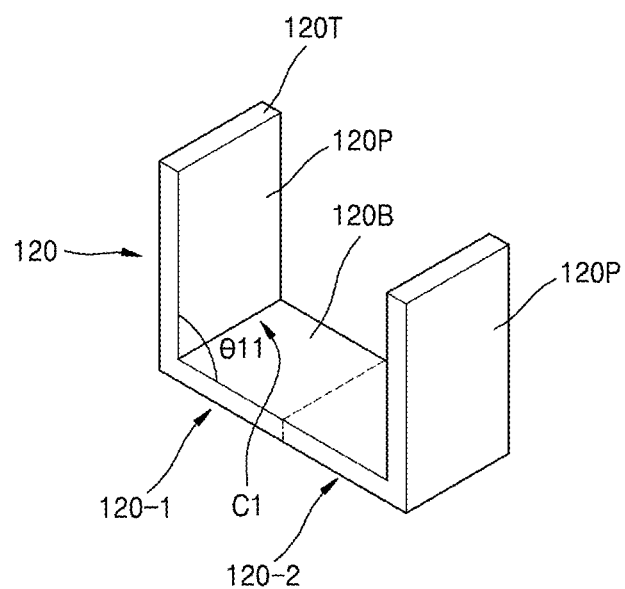
FIG. 3D is a schematic perspective view of a heating electrode layer of the memory device of FIG. 3A.

FIG. 3D is a schematic perspective view of the heating electrode layer 120.

Referring to FIGS. 3A to 3D, the heating electrode layer 120 may have an approximately U-shaped cross-section. The heating electrode layer 120 may include a base portion 120B extending parallel or substantially parallel (e.g., parallel within manufacturing tolerances and/or material tolerances) to the first conductive line 110, and two fin portions 120P (a first fin portion and a second fin portion, respectively) extending from both ("opposite") ends of the base portion 120B in a direction away from the first conductive line 110. As shown in FIG. 3D, each fin portion 120P may include including a top contact surface 120T that is distal in the fin portion 120P from the first conductive line 110, the top contact surface 120T of the fin portion 120P contacting a bottom contact surface 130C of the wedge memory portion 130W. A fin portion 120P may extend in a direction that is approximately perpendicular (e.g., perpendicular within manufacturing tolerances and/or material tolerances) to a main surface of the substrate 102, and an included angle θ11 between the base portion 120B and the fin portion 120P may be approximately a right angle (e.g., a right angle within manufacturing tolerances and/or material tolerances). In the memory device 100, one heating electrode layer 120 may be shared by two memory cell pillars P1, as shown in at least FIG. 3C. A first insulating spacer 122 and a gap-fill insulating film 124 are stacked on the one heating electrode layer 120 shared by the two memory cell pillars P1 in this stated order (e.g., "sequentially"). The two memory cell pillars P1 sharing the one heating electrode layer 120 may be insulated from each other by the first insulating spacer 122 and the gap-fill insulating film 124. The first insulating spacer 122 may have an approximately U-shaped cross-section.

As shown in at least FIG. 3C, a pair of memory cell pillars P1 are on opposite sides of the first insulating spacer 122 and gap-fill insulating film 124, such that one memory cell pillar P1 includes a first resistive memory layer 130 and the other memory cell pillar P1 includes a second resistive memory layer 130. As shown in at least FIG. 3C, each memory cell pillar P1 may be connected at opposite ends to the first conductive line 110 and the second conductive line 170, respectively. As shown in at least FIGS. 3C and 3D, the first resistive memory layer 130 may include a first wedge memory portion 130W contacting a first portion 120-1 of the heating electrode layer 120 and having a first inclined sidewall 130S that is inclined such that the first wedge memory portion 130W has a width that increases continuously in proportion with increasing distance from the first portion 120-1, a first body memory portion 130B connected to the first wedge memory portion 130W such that the first body memory portion 130B and the first wedge memory portion 130W comprise an individual and continuous layer, the first body memory portion 130B having a greater width than the first wedge memory portion 130W. The second resistive memory layer 130 may include a second wedge memory portion 130W contacting a second portion 120-2 of the heating electrode layer 120 and having a second inclined sidewall 130S that is inclined such that the second wedge memory portion 130 has a width that increases continuously in proportion with increasing distance from the second portion 120-2, and a second body memory portion 130B integrally connected to the second wedge memory portion 130W such that the second body memory portion 130B and the second wedge memory portion 130W comprise another individual and continuous layer, the second body memory portion 130B having a greater width than the second wedge memory portion 130W. As shown in FIG. 3C, where the first insulating spacer 122 is between the heating electrode layer 120 and a gap-fill insulating film 124 that is between a first memory cell pillar P1 and a second memory cell pillar P1, the first insulating spacer 122 may include a first portion 122-1 contacting the first inclined sidewall 130S of the first wedge memory portion 130W and a second portion 122-2 contacting the second inclined sidewall 130S of the second wedge memory portion 130W.

The first insulating spacer 122 may include a material having etch selectivity that is different from that of a material constituting the plurality of first insulating walls 116A and the plurality of second insulating walls 116B, and the gap-fill insulating film 124 may include a material having etch selectivity that is equal or similar to that of the material constituting the plurality of first insulating walls 116A and the plurality of second insulating walls 116B. For example, the plurality of first insulating walls 116A, the plurality of second insulating walls 116B, and the gap-fill insulating film 124 may include a silicon nitride film, and the first insulating spacer 122 may include a silicon oxide film, without being limited thereto. As shown in at least FIG. 3C, the first insulating spacer 122 may contact each element of the base portion 120B, a fin portion 120P, a wedge memory portion 130W, and a body memory portion 130B, and the first insulating spacer 122 has a bottom surface 122B contacting the base portion 120B and a top surface 122T contacting the body memory portion 130B.

The heating electrode layer 120 may heat the resistive memory layer 130 in a set or reset operation. The heating electrode layer 120 may include a material configured to generating sufficient heat for phase-change of the resistive memory layer 130 while not reacting with the resistive memory layer 130. The heating electrode layer 120 may include a metal, a metal nitride, an alloy, or a carbon-based conductive material. For example, the heating electrode layer 120 may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or combinations thereof.

Figure 3E:
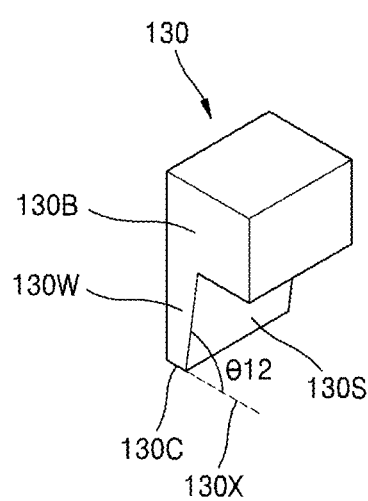
FIG. 3E is a schematic perspective view of a resistive memory layer of the memory device of FIG. 3A.

FIG. 3E is a schematic perspective view of the resistive memory layer 130.

Referring to FIGS. 3A to 3E, the resistive memory layer 130 includes a wedge memory portion 130W, which has an inclined sidewall 130S so as to have a gradually decreasing width with decreasing distance from the heating electrode layer 120, and a body memory portion 130B, which is integrally connected to the wedge memory portion 130W and has a greater width than the wedge memory portion 130W. Restated, the wedge memory portion 130W has an inclined sidewall 130S such that the wedge memory portion 130W has a width that increases continuously in proportion with increasing distance from the heating electrode layer 120, and the body memory portion 130B has a greater width than the wedge memory portion 130W. As shown in FIG. 3E, by being integrally connected with each other, the wedge memory portion 130W and the body memory portion 130B comprise an individual and continuous resistive memory layer 130. The wedge memory portion 130W has a bottom contact surface 130C that is farthest therein ("distal in the wedge memory portion 130W") from the body memory portion 130B. The bottom contact surface 130C may contact a top contact surface 120T that is farthest ("distal") in the fin portion 120P of the heating electrode layer 120 from the first conductive line 110.

An included angle θ12 between the inclined sidewall 130S of the wedge memory portion 130W and a horizontal plane 130X parallel or substantially parallel to the main surface (X-Y plane) of the substrate 102 may be an acute angle. In some example embodiments, the included angle θ12 may be selected from a range of about 80° to about 88°, without being limited thereto. The body memory portion 130B may have an approximately, or "substantially," constant width (e.g., constant width within manufacturing tolerances and/or material tolerances) with increasing distance from the substrate 102.

When the terms "about," "approximately," or "substantially" are used in this specification in connection with a numerical value, it is intended that the associated numerical value include a tolerance of ±10% around the stated numerical value. When ranges are specified, the range includes all values therebetween such as increments of 0.1%.

The resistive memory layer 130 may include a phase-change material, which is configured to reversibly change between an amorphous state ("phase") and a crystalline state ("phase") depending upon heating time (e.g., duration of heating of the resistive memory layer 130). For example, the resistive memory layer 130 may include a material, which is configured to have a reversible change in phase due to Joule heat generated by a voltage applied to both ends of the resistive memory layer 130 and having a change in resistance due to such phase change.

Referring back to FIG. 3C, where a pair of memory cell pillars P1 are present and include respective first and second resistive memory layers 130 that share a heating electrode layer 120, the first wedge memory portion 130W may contact a first top contact surface 120T of the first fin portion 120P, and the second wedge memory portion 130W may contact a second top contact surface 120T of the second fin portion 120P. A first included angle θ12 between the first inclined sidewall 130S and a horizontal plane substantially parallel to a main surface of the substrate 102 may be an acute angle, and a second included angle θ12 between the second inclined sidewall 130S and the horizontal plane may also be an acute angle. At least one element of the first wedge memory portion 130W and the second wedge memory portion 130W may have a width that increases continuously in proportion with increasing distance from the heating electrode layer 120.

In some example embodiments, the resistive memory layer 130 may include a chalcogenide material as the phase-change material. In some example embodiments, the resistive memory layer 130 may include Ge—Sb—Te (GST). For example, Ge—Sb—Te of the resistive memory layer 130 may include a material such as $Ge_2Sb_2Te_5$, $Ge_2Sb_2Te_7$, $Ge_1Sb_2Te_4$, or $Ge_1Sb_4Te_7$. The resistive memory layer 130 may include various chalcogenide materials other than Ge—Sb—Te set forth above. For example, the resistive memory layer 130 may include, as the chalcogenide material, a material including at least two elements selected from among Si, Ge, Sb, Te, Bi, In, Sn, and Se. In some example embodiments, the resistive memory layer 130 may further include at least one impurity selected from among B, C, N, O, P, and S. The at least one impurity may change a driving current of the memory device 100. In addition, the resistive memory layer 130 may further include a metal. For example, the resistive memory layer 130 may include at least one metal selected from among Al, Ga, Zn, Ti, Cr, Mn, Fe, Co, Ni, Mo, Ru, Pd, Hf, Ta, Ir, Pt, Zr, Tl, Pd, and Po. In some example embodiments, the resistive memory layer 130 may have a multilayer structure, in which two or more layers having different properties are stacked. The number or thicknesses of a plurality of layers constituting the multilayer structure may be freely selected. For example, the resistive memory layer 130 may have a superlattice structure, in which a plurality of layers including different materials are alternately stacked.

A material constituting the resistive memory layer 130 is not limited to phase-change materials. The resistive memory layer 130 may include various materials having resistance-change properties. In some example embodiments, the resistive memory layer 130 may include a transition metal oxide, and in this case, the memory device 100 may constitute a resistive RAM (ReRAM) device. In some example embodiments, the resistive memory layer 130 may have a magnetic tunnel junction (MJT) structure, which includes: two electrodes including magnetic substances; and a dielectric between the two electrodes, and in this case, the memory device 100 may constitute a magnetic RAM (MRAM) device.

The electrode layer 140 may include a metal, a conductive metal nitride, a conductive metal oxide, or combinations thereof. For example, the electrode layer 140 may include W, Ti, Ta, Al, Cu, C, CN, TiN, TiAlN, TiSiN, TiCN, TiCSiN, WN, CoSiN, WSiN, TaN, TaCN, TaSiN, or combinations thereof.

In one memory cell pillar P1, the heating electrode layer 120, the resistive memory layer 130, and the electrode layer 140 may be aligned with a sidewall 116a-s of a first insulating wall 116A. The fin portion 120P, the wedge memory portion 130W, and the body memory portion 130B may each contact a sidewall 116a-s of the first insulating wall 116A and vertically overlap each other between a first conductive line 110 and a second conductive line 170. The first insulating spacer 122 may contact the fin portion 120P of the heating electrode layer 120, and the wedge memory portion 130W and the body memory portion 130B of the resistive memory layer 130. The fin portion 120P and the wedge memory portion 130W are spaced apart from the gap-fill insulating film 124 with the first insulating spacer 122 therebetween. The fin portion 120P, the wedge memory portion 130W, and the body memory portion 130B may vertically overlap each other (e.g., overlap each other along an axis extending between the overlapping first and second conductive lines 110 and 170), as shown in at least FIG. 3C. The first insulating spacer 122 may have a bottom surface 122B, which contacts the base portion 120B of the heating electrode layer 120, and a top surface 122T, which contacts the body memory portion 130B of the resistive memory layer 130, and the height of the first insulating spacer 122 may be defined by the base portion 120B and the body memory portion 130B.

The first insulating spacer 122 may at least partially fill a reentrant corner portion C1 between (e.g., at least partially defined by) the base portion 120B and the fin portion 120P of the heating electrode layer 120. The first insulating spacer 122 may have inclined sidewalls 122S respectively contacting and covering inclined sidewalls 130S of two wedge memory portions 130W that are on both (opposite) sides with the first insulating spacer 122 therebetween. A top surface 140T of the electrode layer 140 and a top surface 124T of the gap-fill insulating film 124 may extend on the same ("common") plane.

The plurality of memory cell pillars P1 may each further include a plurality of stacked structures each including a first interfacial layer 152, a selection device layer 154, a second interfacial layer 156, and an electrode layer 160, which are stacked on the electrode layer 140 in this stated order, and an insulating film 162 filling spaces between the plurality of stacked structures.

Each of the first interfacial layer 152 and the second interfacial layer 156 may include a conductive material, for example, carbon (C). In some example embodiments, the first interfacial layer 152 and the second interfacial layer 156 may be omitted. The selection device layer 154 may correspond to the selection device layer S shown in FIG. 1. The selection device layer 154 may include an amorphous chalcogenide switching material. The selection device layer 154 may include a material layer configured to have resistance varying depending upon amplitudes of voltages applied to both ends of the selection device layer 154. For example, the selection device layer 154 may include an Ovonic threshold switching (OTS) material. The OTS material may include a chalcogenide switching material. In some example embodiments, the selection device layer 154 may include Si, Te, As, Ge, In, or combinations thereof. The selection device layer 154 may further include a nitrogen atom (N). A material constituting the selection device layer 154 is not limited to the examples set forth above, and the selection device layer 154 may include various material layers configured to function to select a device. Descriptions of the electrode layer 160 are substantially the same as the descriptions of the electrode layer 140. The insulating film 162 may include an oxide film, a nitride film, or combinations thereof.

In the memory device 100 described with reference to FIGS. 2 to 3E, the top contact surface 120T of the fin portion 120P included in the heating electrode layer 120 contacts the bottom contact surface 130C of the wedge memory portion 130W included in the resistive memory layer 130, whereby a contact area between the heating electrode layer 120 and the resistive memory layer 130 may be minimized, and heating efficiency may be improved when current is applied through the heating electrode layer 120. Therefore, in a cross-point stack-structured memory device, even though sizes of components constituting the memory device are reduced due to the demand for high integration, power consumption may be minimized by reducing reset current, and reliability may be improved by improving heating efficiency upon switching operation. As a result, the functioning of a device that includes the cross-point stack-structured memory device, including an electronic device, may be improved.

Figure 4:
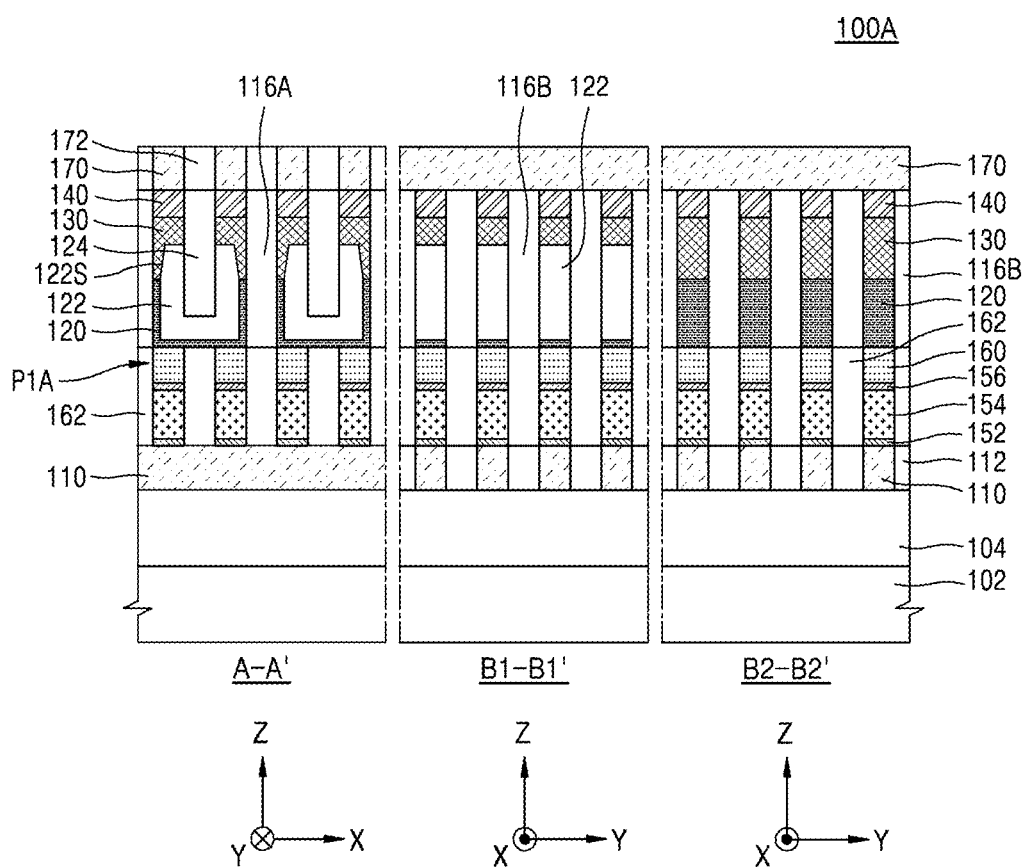
FIG. 4 illustrates cross-sectional views of a memory device according to some example embodiments.

FIG. 4 illustrates cross-sectional views of a memory device according to some example embodiments.

Referring to FIG. 4, a memory device 100A has substantially the same configuration as the memory device 100 shown in FIGS. 3A and 3B. However, in a plurality of memory cell pillars P1A of the memory device 100A, the plurality of stacked structures, in which the first interfacial layer 152, the selection device layer 154, the second interfacial layer 156, and the electrode layer 160 are stacked in this stated order ("sequentially"), and the insulating film 162 filling the spaces between the plurality of stacked structures are arranged between the plurality of first conductive lines 110 and a plurality of heating electrode layers 120. Thus, each of the plurality of memory cell pillars P1A may have a structure in which the first interfacial layer 152 contacts the first conductive line 110 and the electrode layer 140 contacts the second conductive line 170.

Figure 5A:
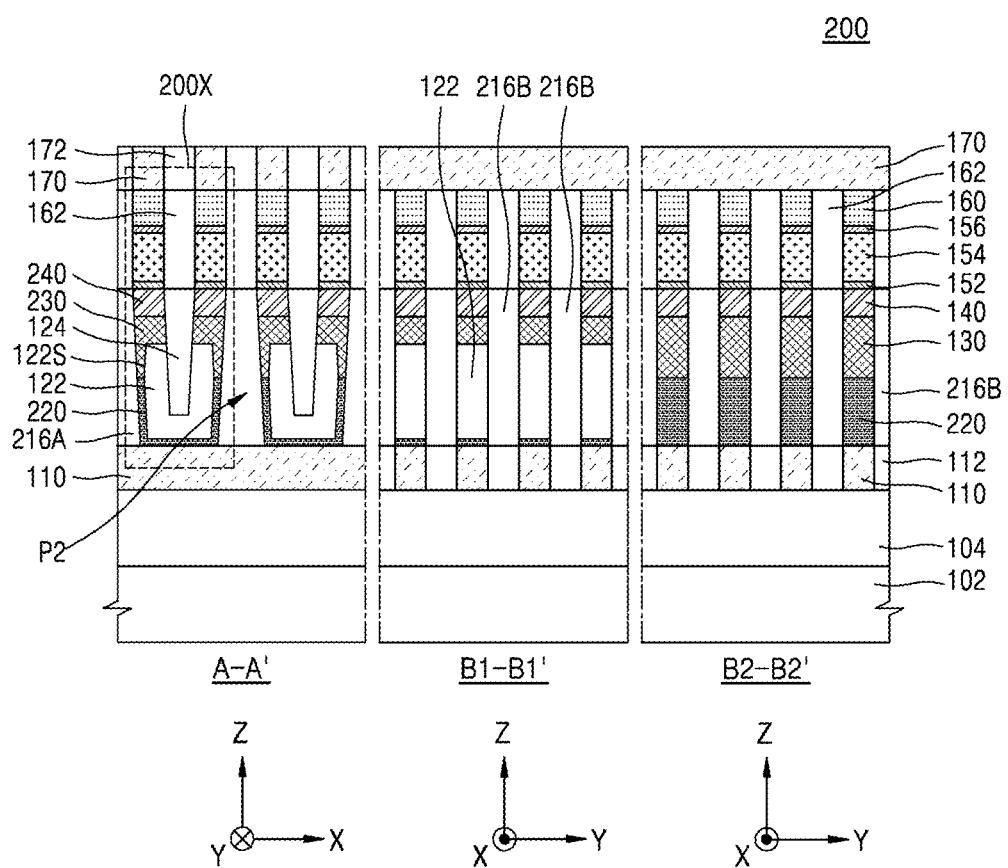
FIG. 5A illustrates cross-sectional views of a memory device according to some example embodiments.
Figure 5B:
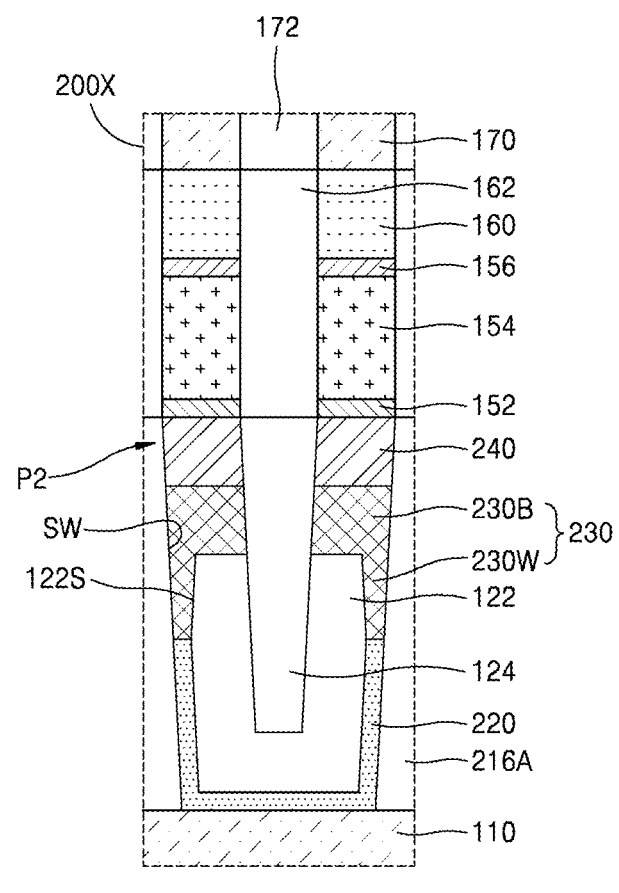
FIG. 5B is an enlarged cross-sectional view of a partial region of FIG. 5A.

FIGS. 5A and 5B are diagrams illustrating a memory device according to some example embodiments, and in particular, FIG. 5A illustrates cross-sectional views of main components, which correspond to cross-sections respectively taken along the lines A-A', B1-B1', and B2-B2' of FIG. 2. FIG. 5B is an enlarged cross-sectional view of a dashed-line region 200X of FIG. 5A.

Referring to FIGS. 5A and 5B, a memory device 200 has substantially the same configuration as the memory device 100 shown in FIGS. 3A and 3B. However, in the memory device 200, a plurality of first insulating walls 216A have inclined sidewalls SW facing a plurality of memory cell pillars P2. The plurality of first insulating walls 216A may each have an increasing width in the X direction with decreasing distance from the substrate 102. In the plurality of memory cell pillars P2, a heating electrode layer 220, a resistive memory layer 230, and an electrode layer 240 may contact an inclined sidewall SW of a first insulating wall 216A to be aligned with the inclined sidewall SW, and may vertically overlap each other.

Figure 5C:
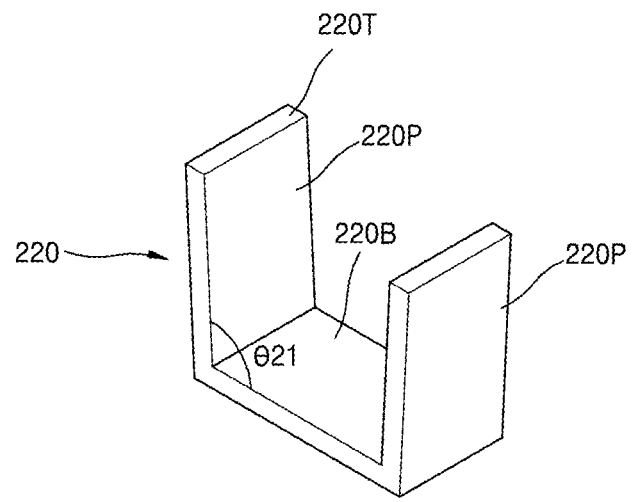
FIG. 5C is a schematic perspective view of a heating electrode layer of the memory device of FIG. 5A.
Figure 5D:
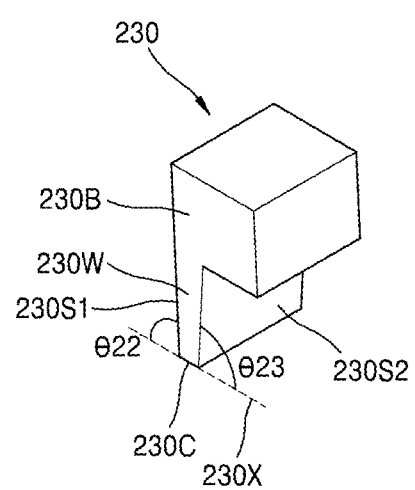
FIG. 5D is a schematic perspective view of a resistive memory layer of the memory device of FIG. 5A.

FIG. 5C is a schematic perspective view of the heating electrode layer 220, and FIG. 5D is a schematic perspective view of the resistive memory layer 230.

Referring to FIGS. 5A to 5D, the heating electrode layer 220, the resistive memory layer 230, and the electrode layer 240 may respectively have substantially the same configurations as the heating electrode layer 120, the resistive memory layer 130, and the electrode layer 140 described with reference to FIGS. 3A to 3E. However, the heating electrode layer 220 includes a base portion 220B extending parallel or substantially parallel to the plurality of first conductive lines 110, and two inclined fin portions 220P each extending in a direction away from the substrate 102 along the inclined sidewall SW of the first insulating wall 216A. An included angle θ21 between the base portion 220B and an inclined fin portion 220P may be an obtuse angle. In the memory device 200, one heating electrode layer 220 may be shared by two memory cell pillars P2.

The resistive memory layer 230 includes a wedge memory portion 230W, which has both inclined sidewalls 230S1 and 230S2 (a first sidewall and a second sidewall, respectively) facing in opposite directions to each other so as to have a gradually decreasing width with decreasing distance from the heating electrode layer 220, and a body memory portion 230B, which is integrally connected to the wedge memory portion 230W and has a greater width than the wedge memory portion 230W. The wedge memory portion 230W has a bottom contact surface 230C that is farthest therein from the body memory portion 230B. The bottom contact surface 230C may contact a top contact surface 220T that is farthest ("distal") in the fin portion 220P of the heating electrode layer 220 from the first conductive line 110. The fin portion 220P, the wedge memory portion 230W, and the body memory portion 230B may vertically overlap each other.

Included angles θ22 and θ23 between both the inclined sidewalls 230S1 and 230S2 of the wedge memory portion 230W and a horizontal plane parallel to the main surface (X-Y plane) of the substrate 102 may be respectively acute angles. Restated, a first included angle θ22 between the first sidewall 230S1 and a horizontal plane 230X that is substantially parallel to a main surface of the substrate is an acute angle, and a second included angle θ23 between the second sidewall 230S2 and the horizontal plane 230X is also an acute angle. The included angle θ22 between the sidewall 230S1 and the horizontal plane may be equal to or different from the included angle θ23 between the sidewall 230S2 and the horizontal plane. In some example embodiments, one or more of the included angles θ22 and θ23 may be an obtuse angle.

In the memory device 200, descriptions of the heating electrode layer 220, the resistive memory layer 230, the electrode layer 240, the first insulating wall 216A, and a second insulating wall 216B are substantially the same as the descriptions made as to the heating electrode layer 120, the resistive memory layer 130, the electrode layer 140, the first insulating wall 116A, and the second insulating wall 116B with reference to FIGS. 3A to 3C.

Figure 6:
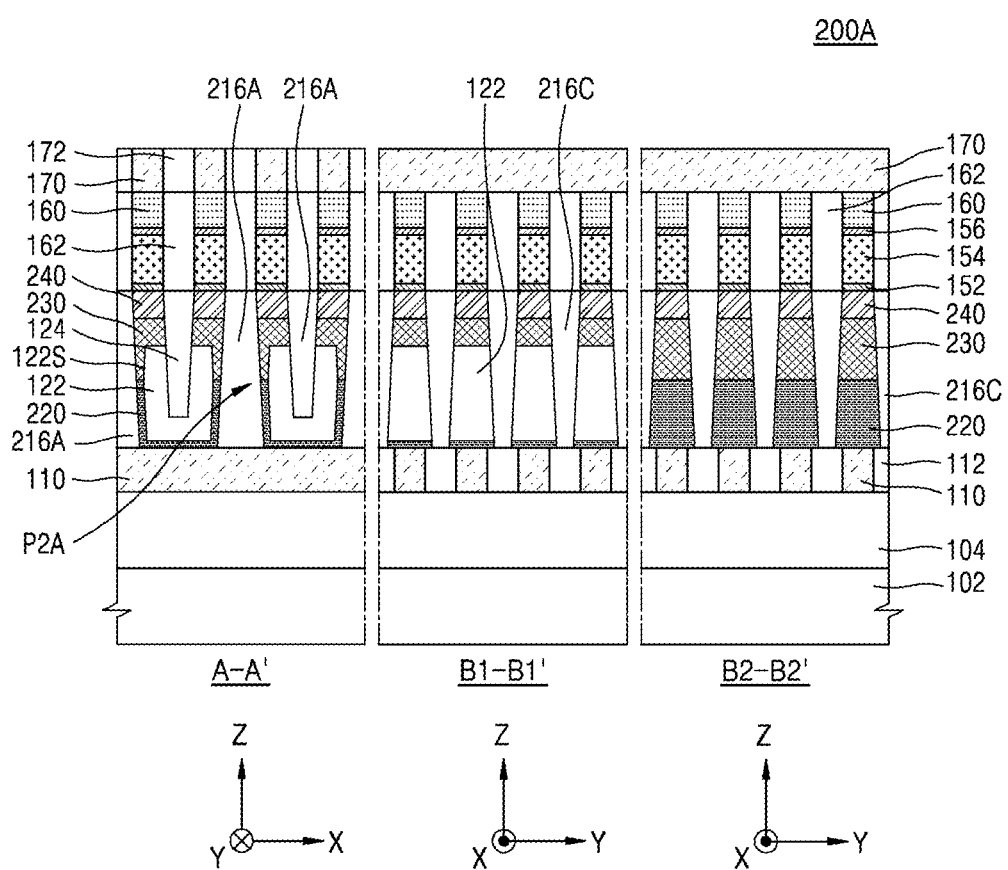
FIG. 6 illustrates cross-sectional views of a memory device according to some example embodiments.

FIG. 6 illustrates cross-sectional views of a memory device according to some example embodiments.

Referring to FIG. 6, a memory device 200A has substantially the same configuration as the memory device 200 shown in FIG. 5A. However, the memory device 200A includes a plurality of second insulating walls 216C defining widths of a plurality of memory cell pillars P2A in the second direction (Y direction). As shown in FIG. 6, the plurality of second insulating walls 216C may each have an inclined sidewall so as to have an increasing width in the second direction (Y direction) with increasing distance from the substrate 102. Thus, in the second direction (Y direction), the width of each of the heating electrode layer 220, the resistive memory layer 230, and the electrode layer 240 may gradually increase with decreasing distance from the substrate 102. Descriptions of the plurality of second insulating walls 216C are substantially the same as the descriptions made as to the plurality of second insulating walls 116B with reference to FIGS. 3A to 3C.

Figure 7A:
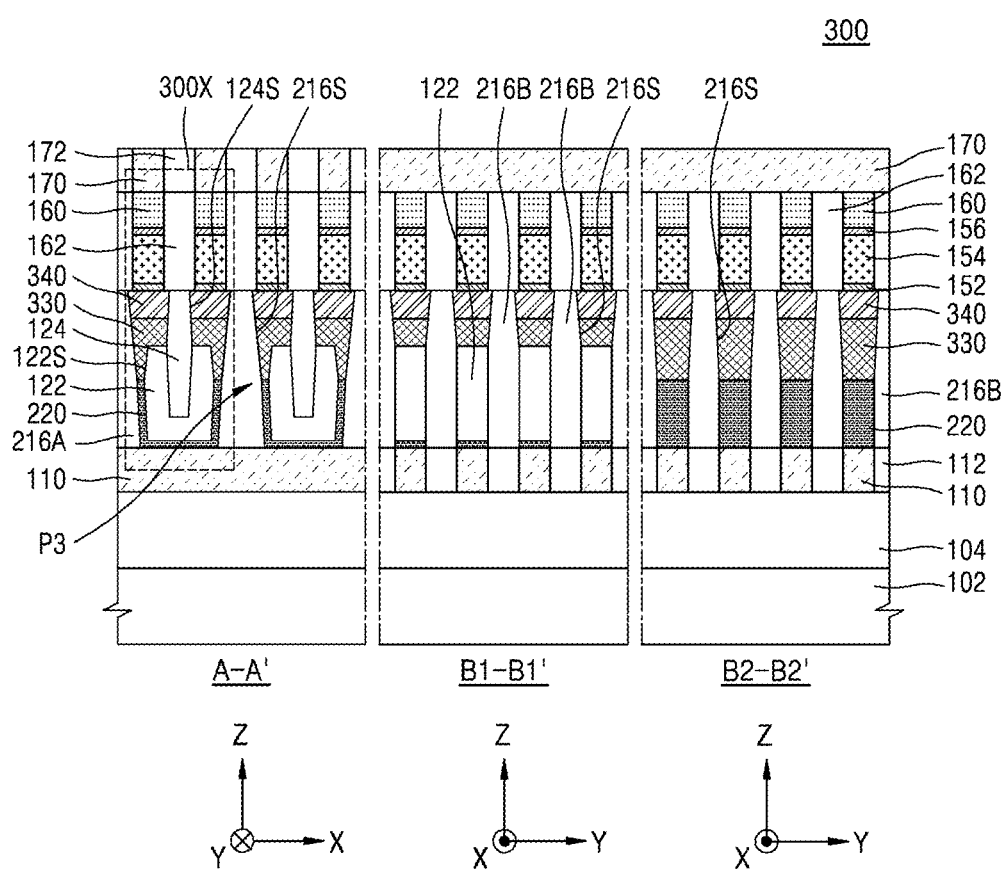
FIG. 7A illustrates cross-sectional views of a memory device according to some example embodiments.
Figure 7B:
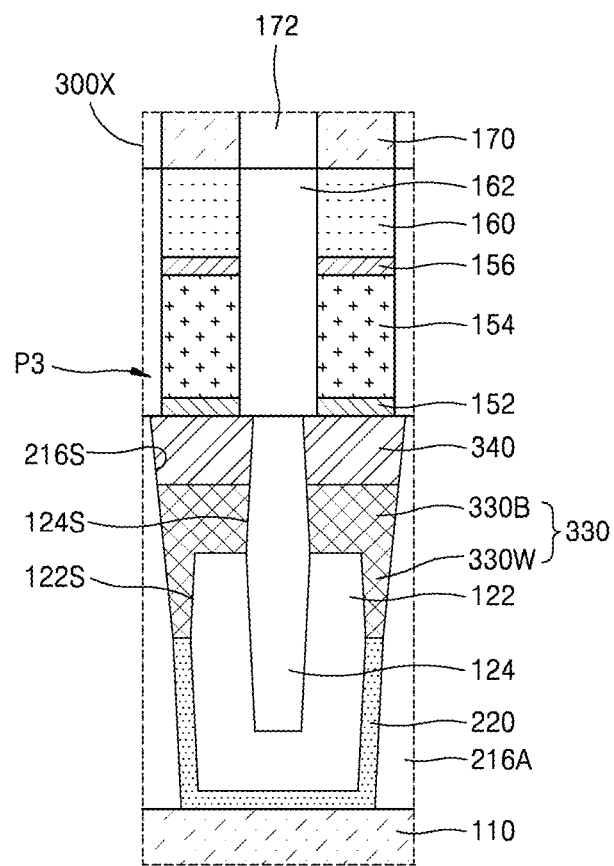
FIG. 7B is an enlarged cross-sectional view of a partial region of FIG. 7A.
Figure 7C:
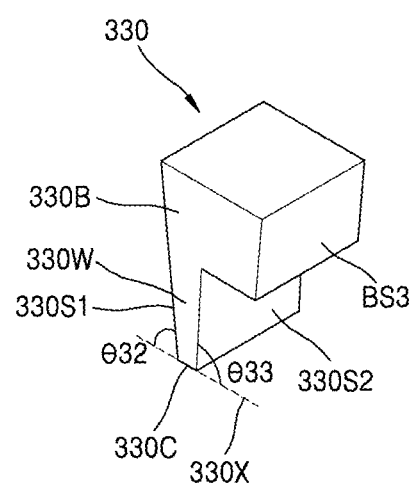
FIG. 7C is a schematic perspective view of a resistive memory layer of the memory device of FIG. 7A.

FIGS. 7A to 7C are diagrams illustrating a memory device according to some example embodiments, and in particular, FIG. 7A illustrates cross-sectional views of main components, which correspond to cross-sections respectively taken along the lines A-A', B1-B1', and B2-B2' of FIG. 2. FIG. 7B is an enlarged cross-sectional view of a dashed-line region 300X of FIG. 7A. FIG. 7C is a schematic perspective view of a resistive memory layer of a memory device of FIG. 7A.

Referring to FIGS. 7A and 7B, a memory device 300 has substantially the same configuration as the memory device 200 shown in FIGS. 5A and 5B. However, in the memory device 300, an upper portion of each of the plurality of first insulating walls 216A and a plurality of second insulating walls 216B may have an inclined sidewall 216S. In addition, an upper portion of the gap-fill insulating film 124 may have an inclined sidewall 124S.

Each of a plurality of memory cell pillars P3 includes a resistive memory layer 330 and an electrode layer 340, which are stacked on the heating electrode layer 220 in this stated order. Each of the resistive memory layer 330 and the electrode layer 340 may contact and be aligned with the inclined sidewall 216S and the inclined sidewall 124S, and may have gradually increasing widths in the X direction and the Y direction with increasing distance from the substrate 102.

The heating electrode layer 220 has the same configuration as described with reference to FIGS. 5A to 5C. The resistive memory layer 330 and the electrode layer 340 may respectively have substantially the same configurations of the resistive memory layer 130 and the electrode layer 140, which have been described with reference to FIGS. 3A to 3E. However, each of the resistive memory layer 330 and the electrode layer 340 may have gradually decreasing widths in the X direction and the Y direction with decreasing distance from the heating electrode layer 220.

FIG. 7C is a schematic perspective view of the resistive memory layer 330.

Referring to FIGS. 7A to 7C, the resistive memory layer 330 may include a wedge memory portion 330W, which has both inclined sidewalls 330S1 and 330S2, and a body memory portion 330B, which is integrally connected to the wedge memory portion 330W and has a greater width than the wedge memory portion 330W. The wedge memory portion 330W has a bottom contact surface 330C that is farthest therein from the body memory portion 330B. The bottom contact surface 330C may contact the top contact surface 220T (see FIG. 5C) included in the fin portion 220P of the heating electrode layer 220. The fin portion 220P of the heating electrode layer 220, and the wedge memory portion 330W and the body memory portion 330B of the resistive memory layer 330 may vertically overlap each other.

Included angles θ32 and θ33 between both the inclined sidewalls 330S1 and 330S2 of the wedge memory portion 330W and a horizontal plane 330X parallel or substantially parallel to the main surface (X-Y plane) of the substrate 102 may be respectively acute angles. In some example embodiments, the included angle θ32 between the sidewall 330S1 and the horizontal plane may be equal to or different from the included angle θ33 between the sidewall 330S2 and the horizontal plane. The body memory portion 330B may include an inclined sidewall BS3, and the body memory portion 330B thus may have a width that increases continuously in proportion with increasing distance from the wedge memory portion 330W, as shown in at least FIGS. 7A-7C.

In the memory device 300, descriptions of the resistive memory layer 330 and the electrode layer 340 are substantially the same as the descriptions made as to the resistive memory layer 130 and the electrode layer 140 with reference to FIGS. 3A to 3C.

Figure 8A:
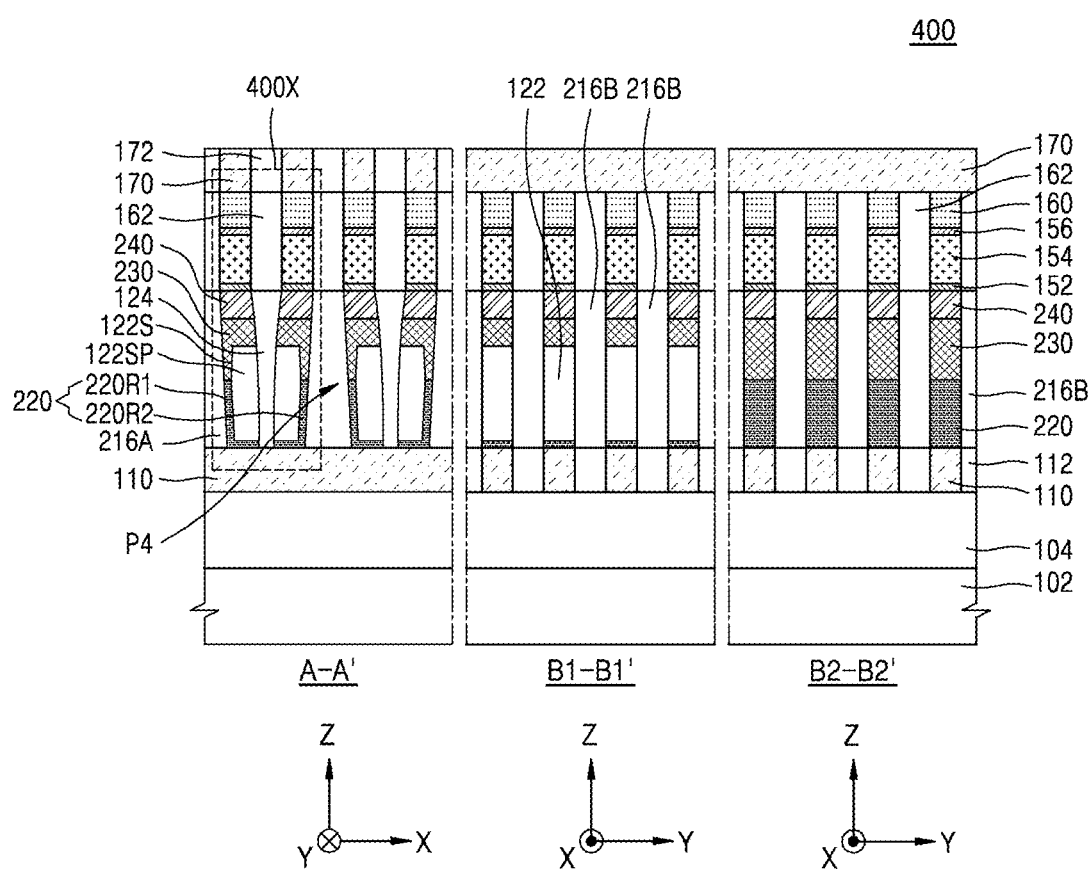
FIG. 8A illustrates cross-sectional views of a memory device according to some example embodiments.
Figure 8B:
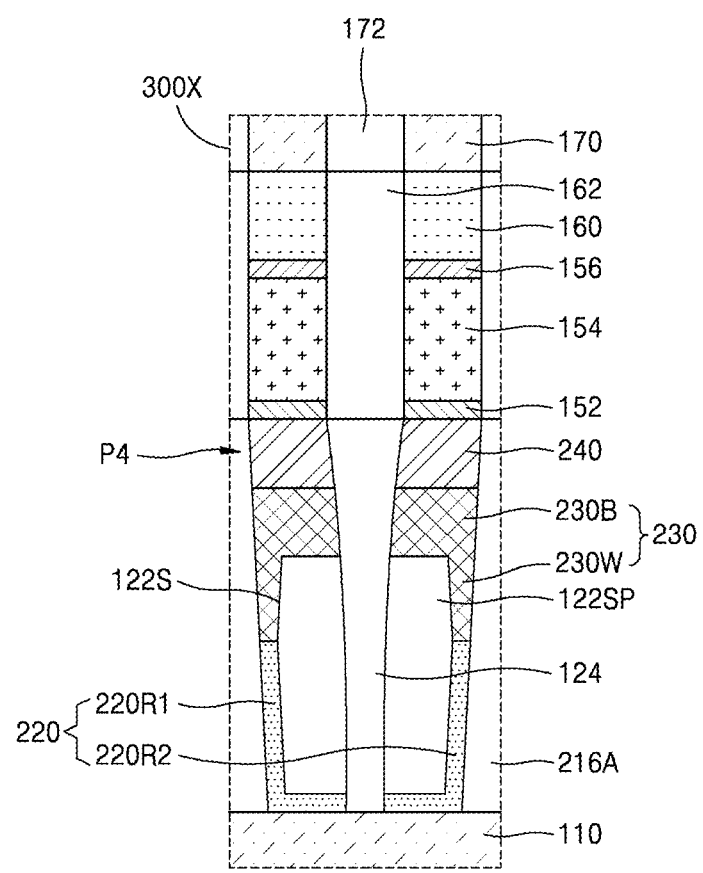
FIG. 8B is an enlarged cross-sectional view of a partial region of FIG. 8A.

FIGS. 8A and 8B are diagrams illustrating a memory device according to some example embodiments, and in particular, FIG. 8A illustrates cross-sectional views of main components, which correspond to cross-sections respectively taken along the lines A-A', B1-B1', and B2-B2' of FIG. 2. FIG. 8B is an enlarged cross-sectional view of a dashed-line region 400X of FIG. 8A.

Referring to FIGS. 8A and 8B, a memory device 400 has substantially the same configuration as the memory device 200 shown in FIGS. 5A and 5B. However, in the memory device 400, the heating electrode layer 220 in each of spaces between the plurality of first insulating walls 216A includes a pair of heating electrode layers 220R1 and 220R2 spaced apart from each other. Each of the pair of heating electrode layers 220R1 and 220R2 constitutes a different memory cell pillar P4.

The gap-fill insulating film 124 contacting the first conductive line 110 is arranged between the pair of separated heating electrode layers 220R1 and 220R2. Each separated insulating spacer 122SP is arranged between a separated heating electrode layer 220R1 and the gap-fill insulating film 124 and between a separated heating electrode layer 220R2 and the gap-fill insulating film 124. The separated insulating spacer 122SP contacts one of the pair of separated heating electrode layers 220R1 and 220R2 and also contacts the wedge memory portion 230W and the body memory portion 230B of the resistive memory layer 230. Descriptions of the separated insulating spacer 122SP are substantially the same as the descriptions made as to the first insulating spacer 122 with reference to FIGS. 3A to 3C.

Figure 9A:
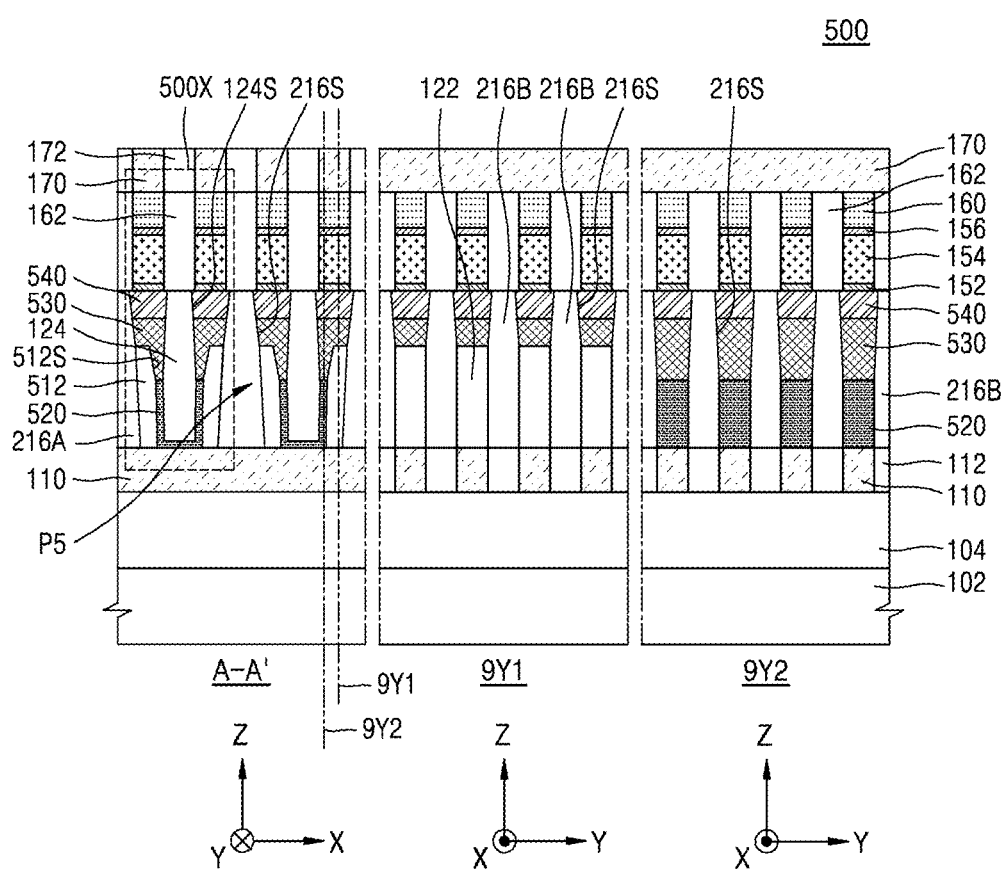
FIG. 9A illustrates cross-sectional views of a memory device according to some example embodiments.
Figure 9B:
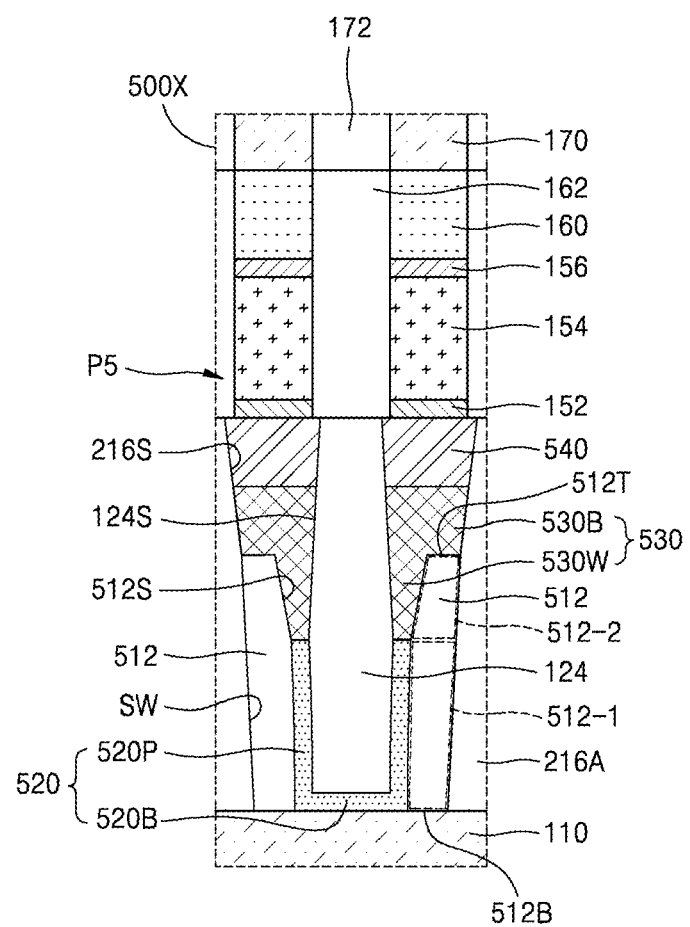
FIG. 9B is an enlarged cross-sectional view of a partial region of FIG. 9A.

FIGS. 9A and 9B are diagrams illustrating a memory device according to some example embodiments, and in particular, FIG. 9A illustrates a cross-sectional view corresponding to a cross-section taken along a line A-A' of FIG. 2, and Y-direction cross-sectional views respectively taken along lines marked by 9Y1 and 9Y2 in the above A-A'-line cross-sectional view. FIG. 9B is an enlarged cross-sectional view of a dashed-line region 500X of FIG. 9A.

Referring to FIGS. 9A and 9B, a memory device 500 has substantially the same configuration as the memory device 200 shown in FIGS. 5A and 5B. However, in the memory device 500, a plurality of memory cell pillars P5 each includes a first insulating spacer 512 covering the inclined sidewall SW of the first insulating wall 216A, and a heating electrode layer 520, a resistive memory layer 530, and an electrode layer 540, which are stacked on the first conductive line 110 in this stated order. The heating electrode layer 520 includes a base portion 520B and a fin portion 520P. The resistive memory layer 530 includes a wedge memory portion 530W and a body memory portion 530B. The wedge memory portion 530W contacts the fin portion 520P. The fin portion 520P and the wedge memory portion 530W are spaced apart from the first insulating wall 216A, with the first insulating spacer 512 being between both of the fin portion 520P and the wedge memory portion 530W and the first insulating wall 216A. The body memory portion 530B contacts the first insulating wall 216A. The fin portion 520P and the wedge memory portion 530W contact the gap-fill insulating film 124. The fin portion 520P, the wedge memory portion 530W, and the body memory portion 530B may vertically overlap each other between the first conductive line 110 and the second conductive line 170.

The upper portion of each of the plurality of first insulating walls 216A and the plurality of second insulating walls 216B may have the inclined sidewall 216S. In addition, the upper portion of the gap-fill insulating film 124 may have the inclined sidewall 124S. Each of the resistive memory layer 530 and the electrode layer 540 may contact and be aligned with the inclined sidewall 216S and the inclined sidewall 124S, and may have gradually increasing widths in the X direction and the Y direction with increasing distance from the substrate 102.

As shown in at least FIG. 9B, the first insulating spacer 512 may include a first portion 512-1 covering a sidewall facing in an opposite direction to the base portion 520B out of both sidewalls of the fin portion 520P, and a second portion 512-2 covering the wedge memory portion 530W. The first insulating spacer 512 has a bottom surface 512B contacting the first conductive line 110 and a top surface 512T contacting the body memory portion 530B, and the height of the first insulating spacer 512 may be defined by the first conductive line 110 and the body memory portion 530B.

Descriptions of the first insulating spacer 512, the heating electrode layer 520, the resistive memory layer 530, and the electrode layer 540 are respectively substantially the same as the descriptions made as to the first insulating spacer 122, the heating electrode layer 120, the resistive memory layer 130, and the electrode layer 140 with reference to FIGS. 3A to 3C.

Figure 10A:
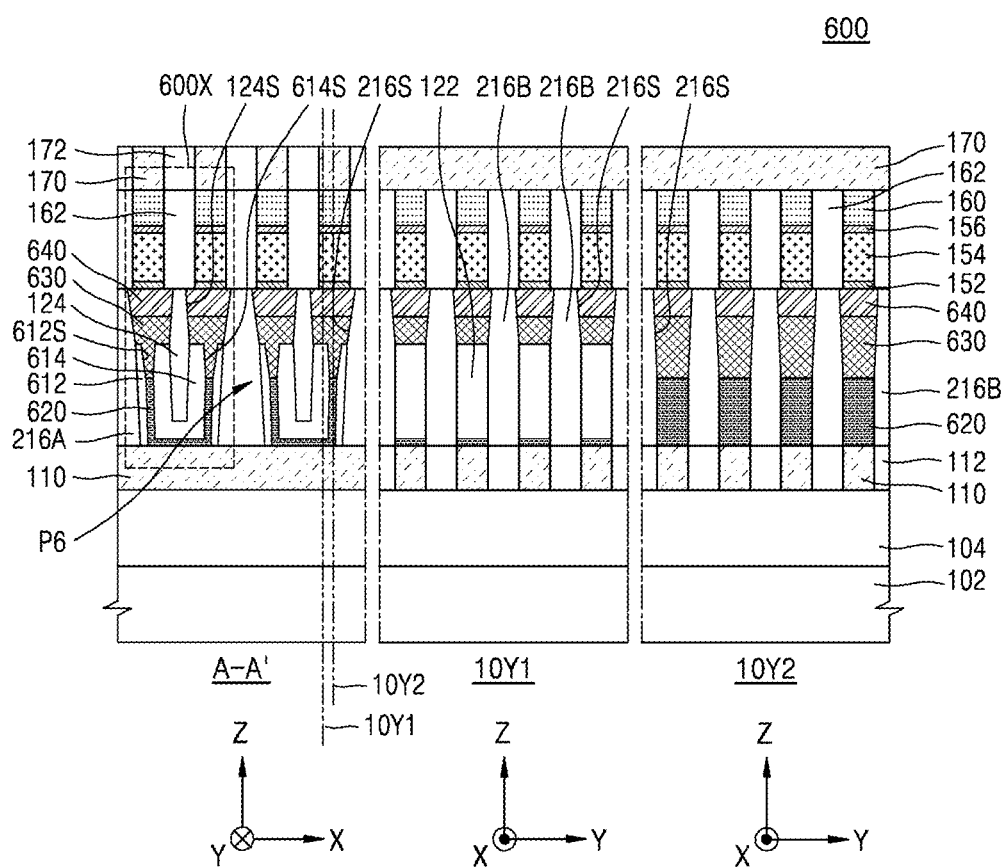
FIG. 10A illustrates cross-sectional views of a memory device according to some example embodiments.
Figure 10B:
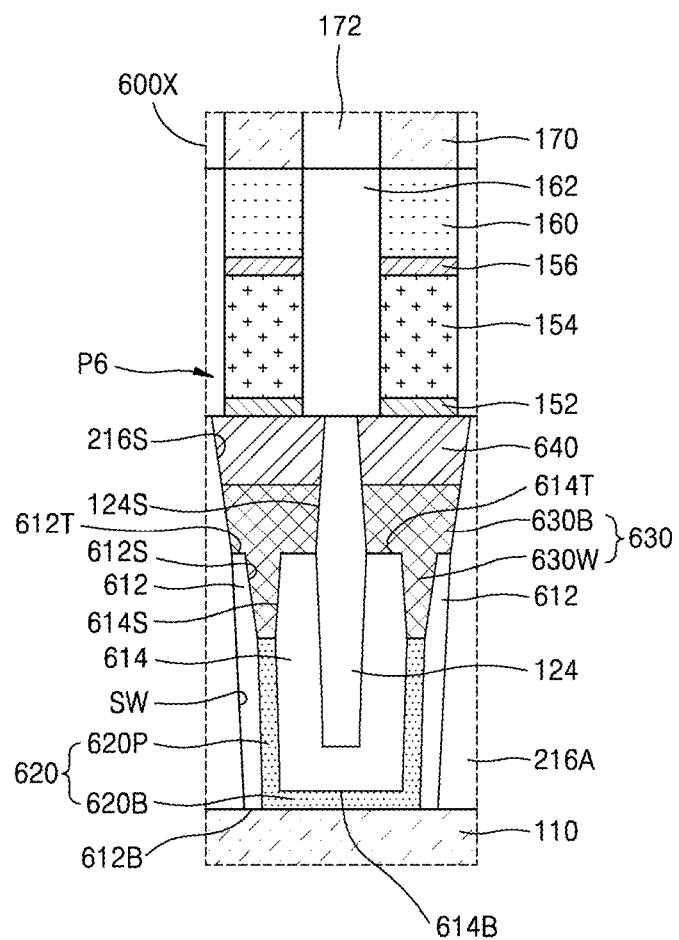
FIG. 10B is an enlarged cross-sectional view of a partial region of FIG. 10A.

FIGS. 10A and 10B are diagrams illustrating a memory device according to some example embodiments, and in particular, FIG. 10A illustrates a cross-sectional view corresponding to the cross-section taken along the line A-A' of FIG. 2, and Y-direction cross-sectional views respectively taken along lines marked by 10Y1 and 10Y2 in the above A-A'-line cross-sectional view. FIG. 10B is an enlarged cross-sectional view of a dashed-line region 600X of FIG. 10A.

Referring to FIGS. 10A and 10B, a memory device 600 has substantially the same configuration as the memory device 200 shown in FIGS. 5A and 5B. However, in the memory device 600, a plurality of memory cell pillars P6 each includes: a first insulating spacer 612 covering the inclined sidewall SW of the first insulating wall 216A; a second insulating spacer 614 surrounding a lower portion of the gap-fill insulating film 124; and a heating electrode layer 620, a resistive memory layer 630, and an electrode layer 640, which are stacked on the first conductive line 110 in this stated order.

The heating electrode layer 620 includes a base portion 620B and a fin portion 620P. The resistive memory layer 630 includes a wedge memory portion 630W and a body memory portion 630B. The wedge memory portion 630W contacts the fin portion 620P. The fin portion 620P and the wedge memory portion 630W are arranged between the first insulating spacer 612 and the second insulating spacer 614. The fin portion 620P and the wedge memory portion 630W are spaced apart from the first insulating wall 216A with the first insulating spacer 612 being between both of the fin portion 620P and the wedge memory portion 630W and the first insulating wall 216A, and are also spaced apart from the gap-fill insulating film 124, with the second insulating spacer 614 being between both of the fin portion 620P and the wedge memory portion 630W and the gap-fill insulating film 124. The first insulating spacer 612 has an inclined sidewall 612S facing the wedge memory portion 630W of the resistive memory layer 630, and the second insulating spacer 614 has an inclined sidewall 614S facing the wedge memory portion 630W. The body memory portion 630B of the resistive memory layer 630 contacts the first insulating wall 216A and the gap-fill insulating film 124. The fin portion 620P, the wedge memory portion 630W, and the body memory portion 630B may vertically overlap each other.

The resistive memory layer 630 and the electrode layer 640 may contact and be aligned with the inclined sidewall 216S of each of the plurality of first insulating walls 216A and the plurality of second insulating walls 216B, and the inclined sidewall 124S of the gap-fill insulating film 124, and may have gradually increasing widths in the X direction and the Y direction with increasing distance from the substrate 102.

The first insulating spacer 612 may have a bottom surface 612B contacting the first conductive line 110, and a top surface 612T contacting the body memory portion 630B. The height of the first insulating spacer 612 may be defined by the first conductive line 110 and the body memory portion 630B. The first insulating spacer 612 and the second insulating spacer 614 may be spaced apart from each other with the fin portion 620P therebetween. The second insulating spacer 614 may have a bottom surface 614B contacting the base portion 620B, and a top surface 614T contacting the body memory portion 630B. The height of the second insulating spacer 614 may be defined by the base portion 620B and the body memory portion 630B. The first insulating spacer 612 and the second insulating spacer 614 may each include a silicon oxide film, without being limited thereto.

Descriptions of the heating electrode layer 620, the resistive memory layer 630, and the electrode layer 640 are respectively substantially the same as the descriptions made as to the heating electrode layer 120, the resistive memory layer 130, and the electrode layer 140 with reference to FIGS. 3A to 3C.

Figure 11:
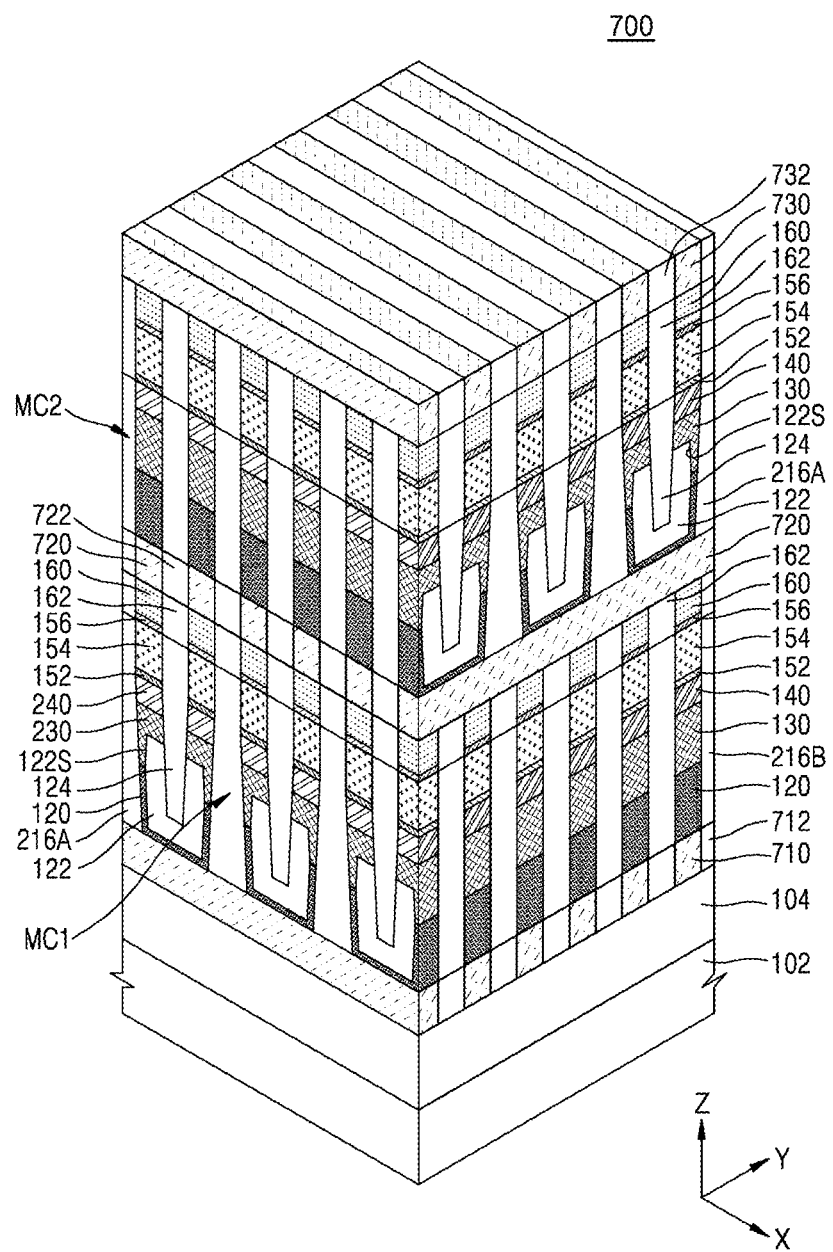
FIG. 11 is a perspective view of a memory device according to some example embodiments.

FIG. 11 is a perspective view of a memory device according to some example embodiments.

Referring to FIG. 11, a memory device 700 may include, over the substrate 102, a plurality of lower word lines 710 extending parallel to each other in the first direction (X direction), a plurality of common bit lines 720 extending parallel to each other in the second direction (Y direction), and a plurality of upper word lines 730 extending parallel to each other in the first direction (X direction). The plurality of lower word lines 710 and the plurality of common bit lines 720 may respectively correspond to the plurality of first conductive lines 110 and the plurality of second conductive lines 170, which are shown in FIGS. 3A and 3B.

A plurality of first memory cells MC1 may be respectively arranged at a plurality of cross-points between the plurality of lower word lines 710 and the plurality of common bit lines 720. A plurality of second memory cells MC2 may be respectively arranged at a plurality of cross-points between the plurality of common bit lines 720 and the plurality of upper word lines 730.

Each of the plurality of first memory cells MC1 and the plurality of second memory cells MC2 may include the memory cell pillar P2 described with reference to FIGS. 5A and 5B.

In the memory device 700, the plurality of first memory cells MC1 and the plurality of second memory cells MC2 may be congruent with each other as a whole by performing 90° rotation with respect to each other. The rotation angle of the plurality of second memory cells MC2 with respect to the plurality of first memory cells MC1 is not limited to the example shown in FIG. 11, and may be variously selected, as needed.

Although FIG. 11 shows that each of the plurality of first memory cells MC1 and the plurality of second memory cells MC2 includes the memory cell pillar P2 shown in FIGS. 5A and 5B, the inventive concepts is not limited thereto. For example, each of the plurality of first memory cells MC1 and the plurality of second memory cells MC2 may include a memory cell pillar selected from among the memory cell pillars P1, P2, P3, P4, P5, and P6 and structures modified and changed therefrom without departing from the spirit and scope of the inventive concepts.

Figure 12A:
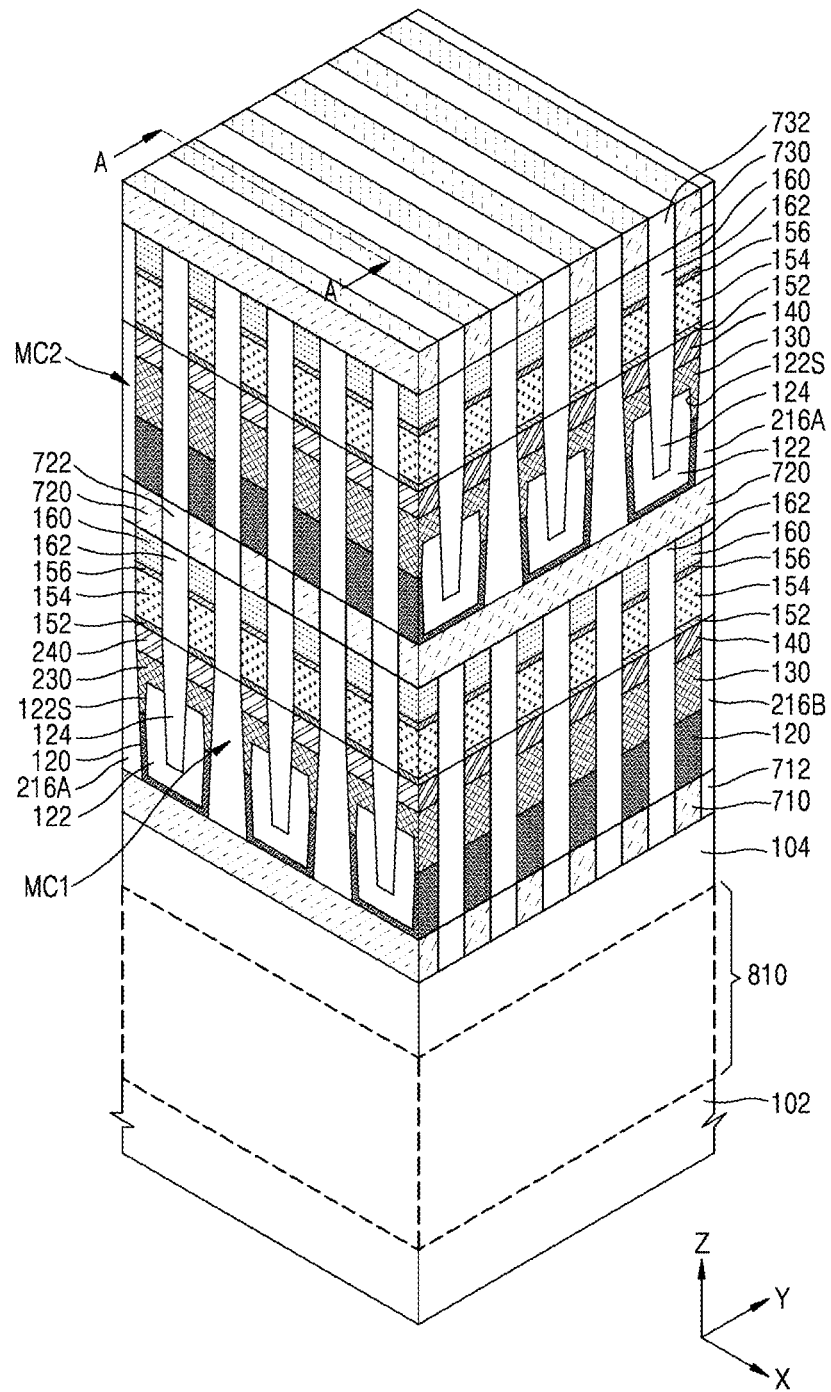
FIG. 12A is a perspective view of a memory device according to some example embodiments.
Figure 12B:
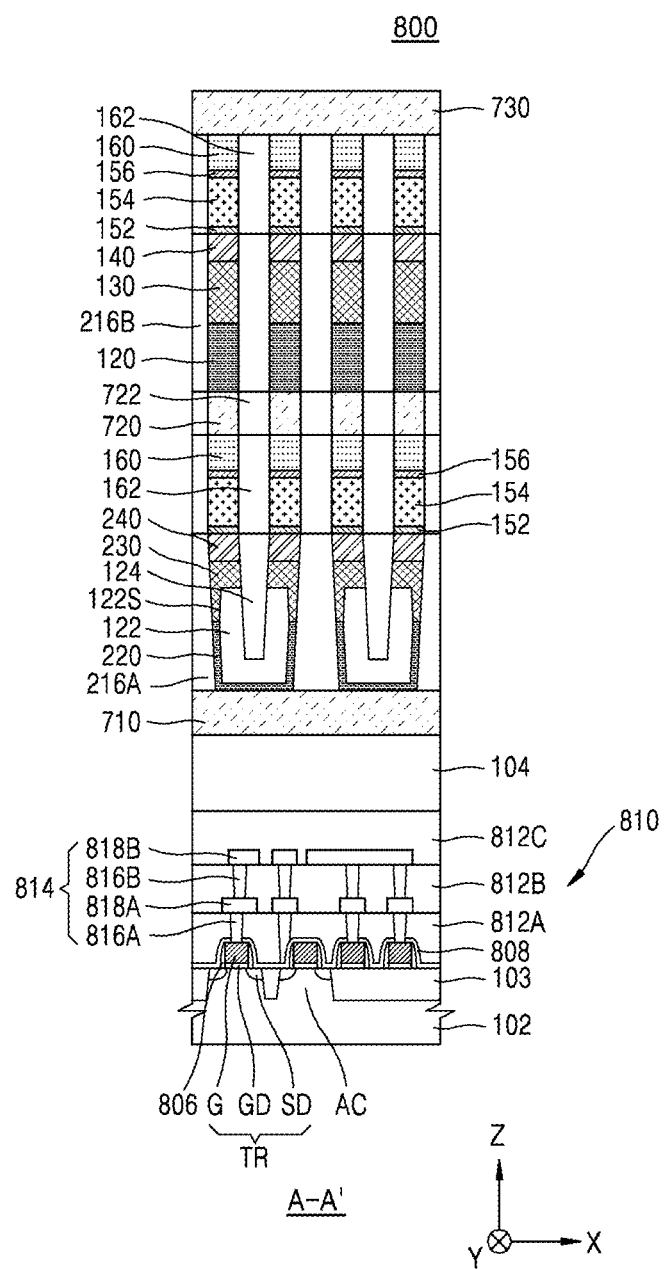
FIG. 12B is a cross-sectional view taken along a line A-A' of FIG. 12A.

FIGS. 12A and 12B are diagrams illustrating a memory device according to some example embodiments, and in particular, FIG. 12A is a perspective view illustrating main components of a memory device 800 according to some example embodiments, and FIG. 12B illustrates a cross-sectional view of the main components, taken along a line A-A' of FIG. 12A. In FIGS. 12A and 12B, the same reference numerals as in FIGS. 5A and 5B denote the same members, and descriptions thereof will be omitted.

Referring to FIGS. 12A and 12B, the memory device 800 includes a driving circuit area 810 on the substrate 102 and has a cell-on-peri (COP) structure, in which memory cells are arranged over the driving circuit area 810.

In more detail, the memory device 800 includes the driving circuit area 810 at a first level over the substrate 102, and the plurality of first memory cells MC1 and the plurality of second memory cells MC2, which are at higher levels than the first level over the substrate 102.

The driving circuit area 810 may be an area in which peripheral circuits or driving circuits for driving the plurality of first memory cells MC1 and the plurality of second memory cells MC2 are arranged. The peripheral circuits arranged in the driving circuit area 810 may be circuits configured to processing data at high speed, the data being input/output to drive the plurality of first memory cells MC1 and the plurality of second memory cells MC2. In some example embodiments, the peripheral circuits may include a page buffer, a latch circuit, a cache circuit, a column decoder, a sense amplifier, a data in/out circuit, a row decoder, or the like.

As shown in FIG. 12B, an active region AC may be defined in the substrate 102 by a device isolation film 103. A plurality of transistors TR constituting the driving circuit area 810 may be formed on the active region AC of the substrate 102. Each of the plurality of transistors TR may include a gate G, a gate insulating film GD, and a source/drain region SD. An insulating spacer 806 may cover both sidewalls of the gate G, and an etch stop film 808 may be formed on the gate G and the insulating spacer 806. The etch stop film 808 may include an insulating material such as silicon nitride, silicon oxynitride, or the like. A plurality of interlayer dielectrics 812A, 812B, and 812C may be stacked on the etch stop film 808 in this stated order. The plurality of interlayer dielectrics 812A, 812B, and 812C may include silicon oxide, silicon nitride, silicon oxynitride, or the like.

The driving circuit area 810 includes a multilayer wiring structure 814 electrically connected to the plurality of transistors TR. Structures of the multilayer wiring structure 814 may be insulated from each other by the plurality of interlayer dielectrics 812A, 812B, and 812C. The multilayer wiring structure 814 may include a first contact 816A, a first wiring layer 818A, a second contact 816B, and a second wiring layer 818B, which are stacked over the substrate 102 in this stated order and electrically connected to each other. Each of the first wiring layer 818A and the second wiring layer 818B may include a metal, a conductive metal nitride, a metal silicide, or combinations thereof. Although the multilayer wiring structure 814 is shown in FIGS. 12A and 12B as being a double-layer wiring structure including the first wiring layer 818A and the second wiring layer 818B, the inventive concepts is not limited thereto. For example, the multilayer wiring structure 814 may include three or more layers depending upon layouts of the driving circuit area 810 and kinds and arrangements of gates G.

The interlayer dielectric 104 may be formed on the plurality of interlayer dielectrics 812A, 812B, and 812C. Although not shown, a wiring structure connecting the plurality of first memory cells MC1 and the plurality of second memory cells MC2 to the driving circuit area 810 may be arranged through the interlayer dielectric 104.

In the memory device 800, since the plurality of first memory cells MC1 and the plurality of second memory cells MC2 are arranged over the driving circuit area 810, the degree of integration of the memory device 800 may be further increased.

Next, a method of fabricating a memory device, according to some example embodiments, will be described in detail.

Figure 13A:
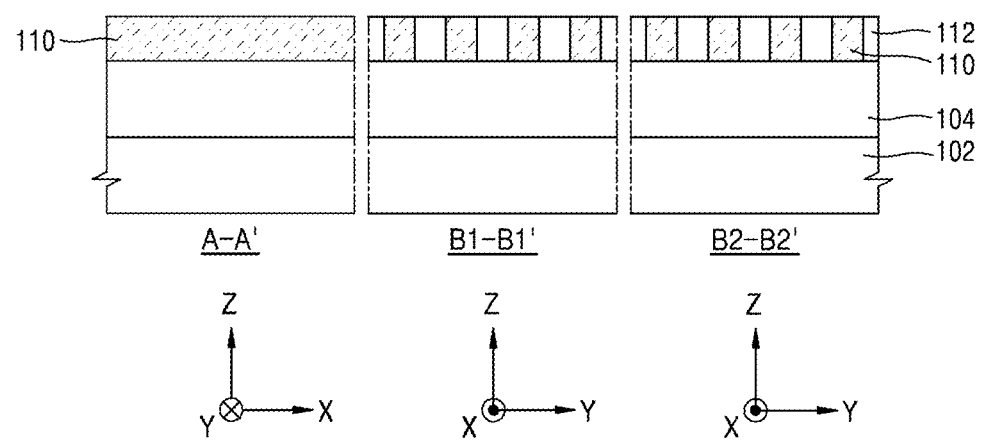
FIGS. 13A to 13N are cross-sectional views illustrating a method of fabricating a memory device, according to some example embodiments.
Figure 13B:
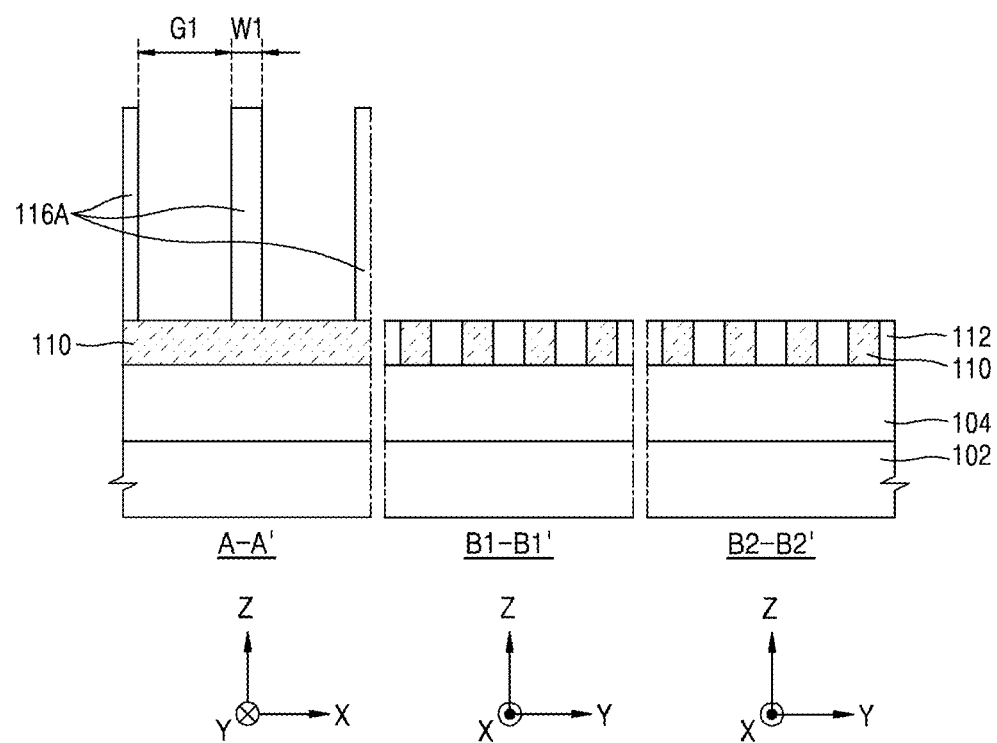
Figure 13C:
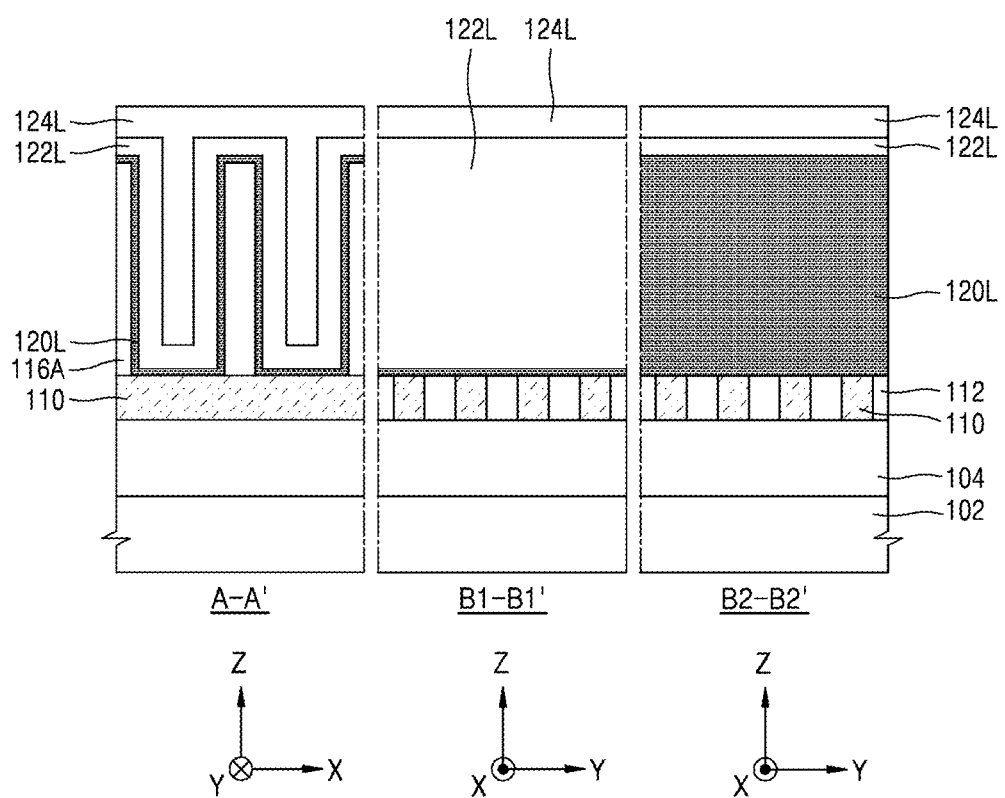
Figure 13D:
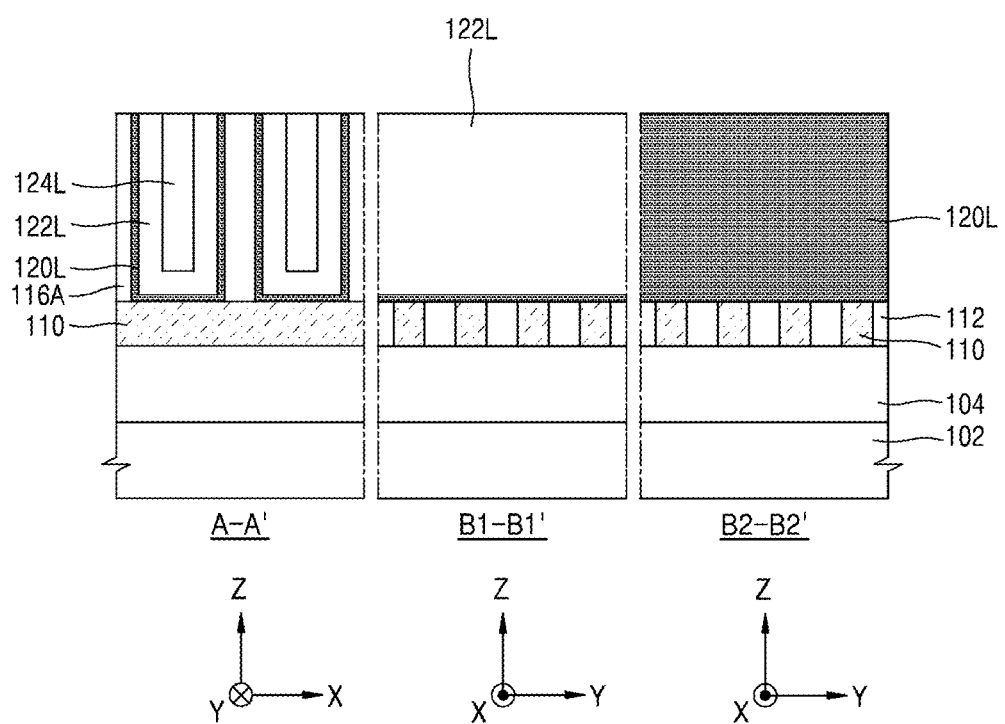
Figure 13E:
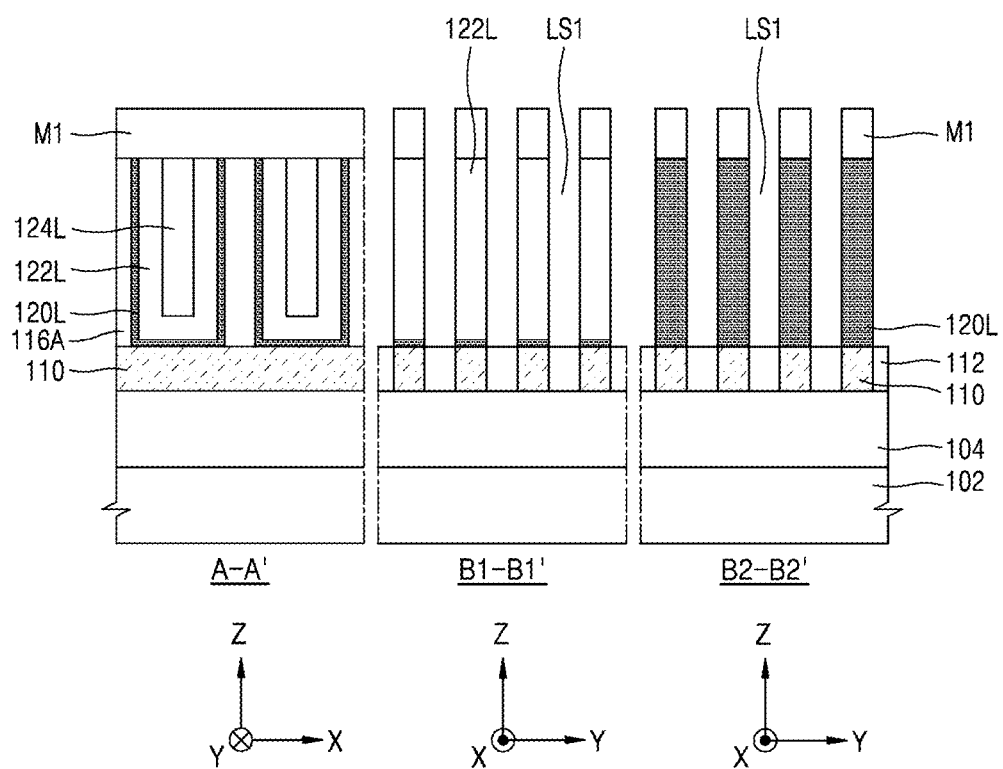
Figure 13F:
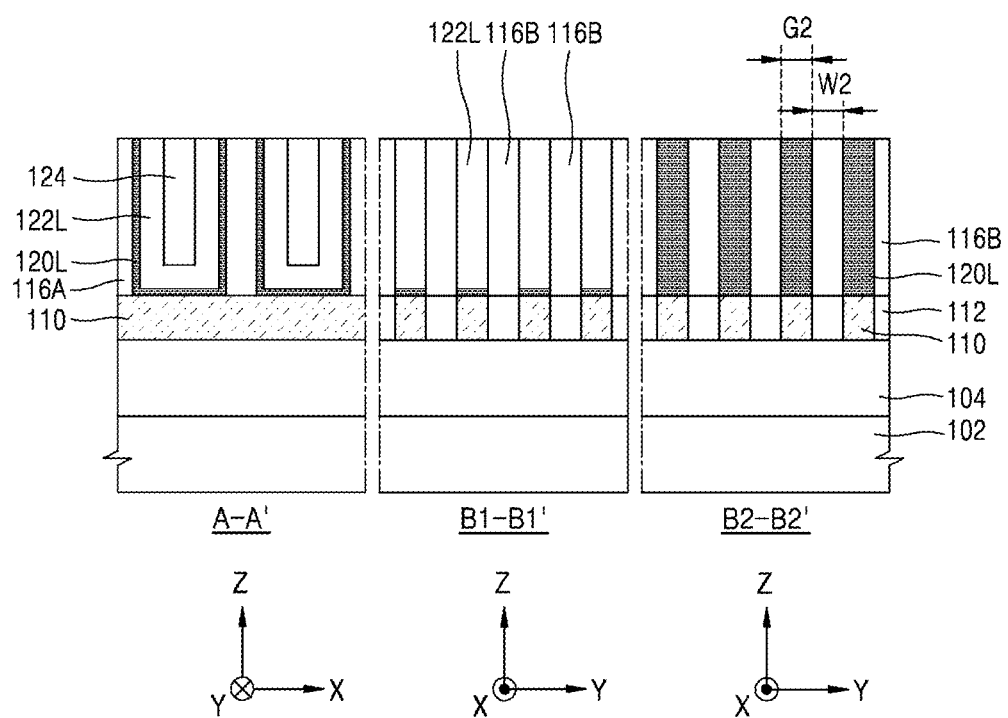
Figure 13G:
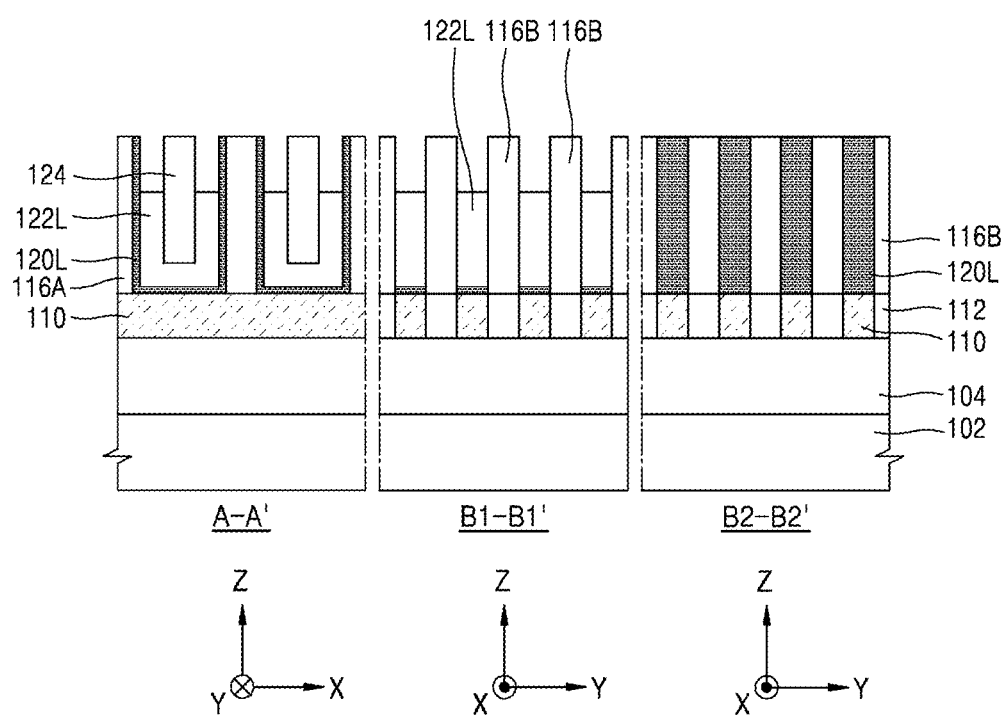
Figure 13H:
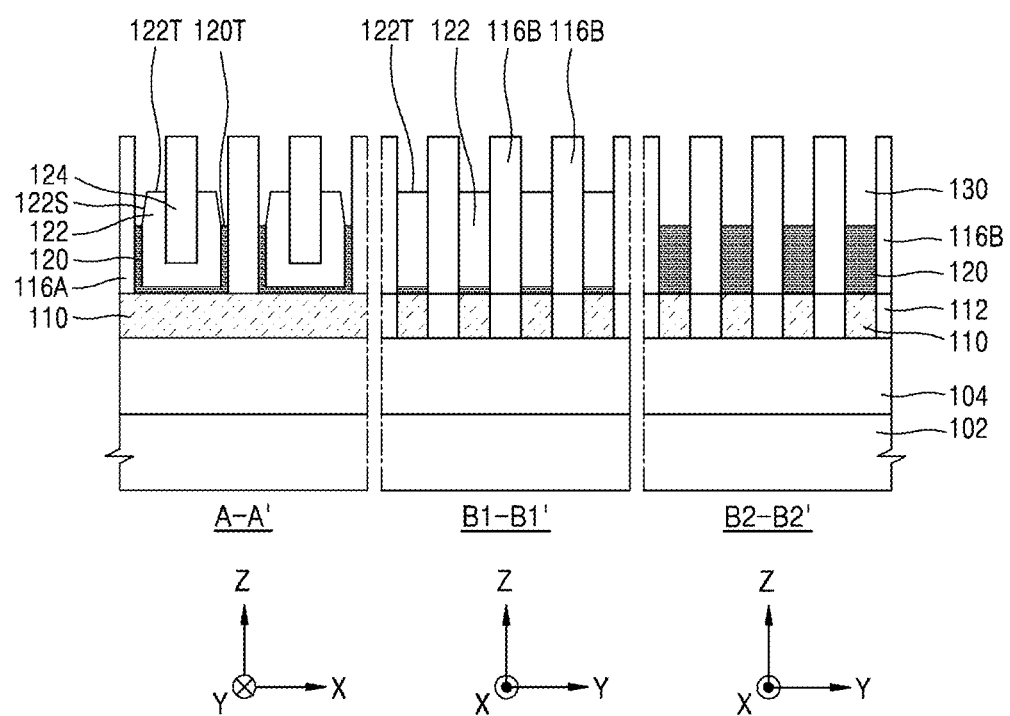
Figure 13I:
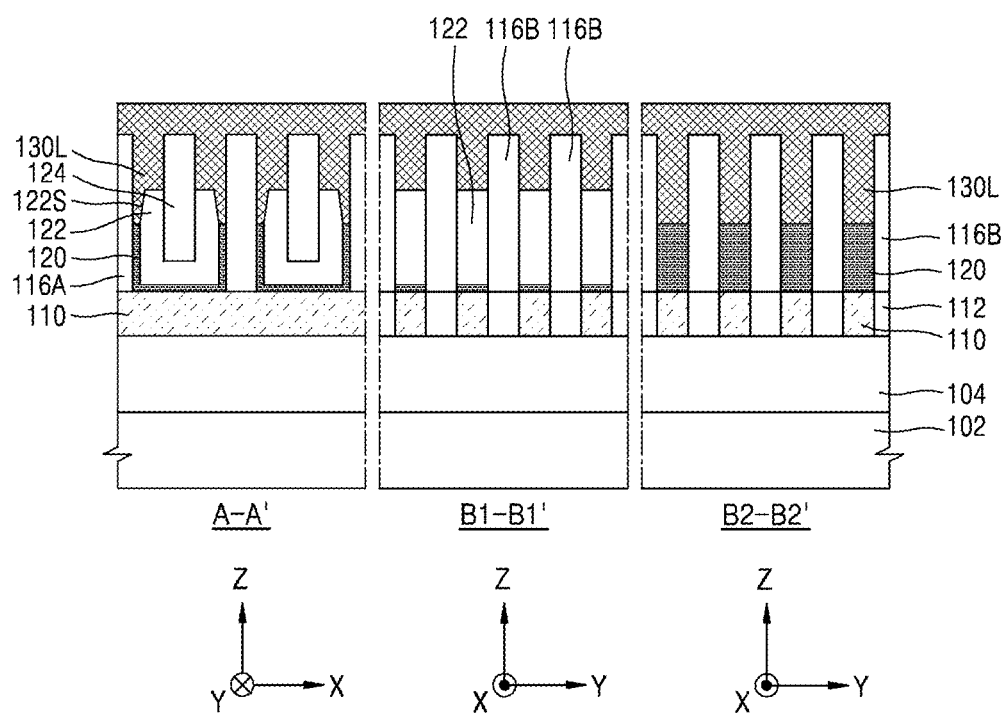
Figure 13J:
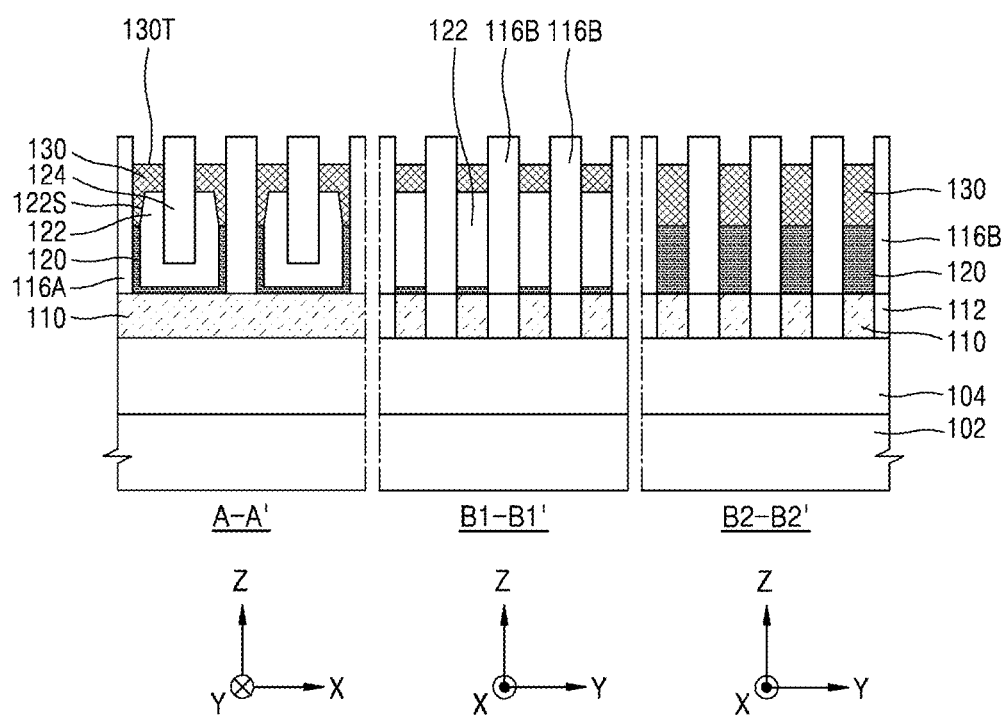
Figure 13K:
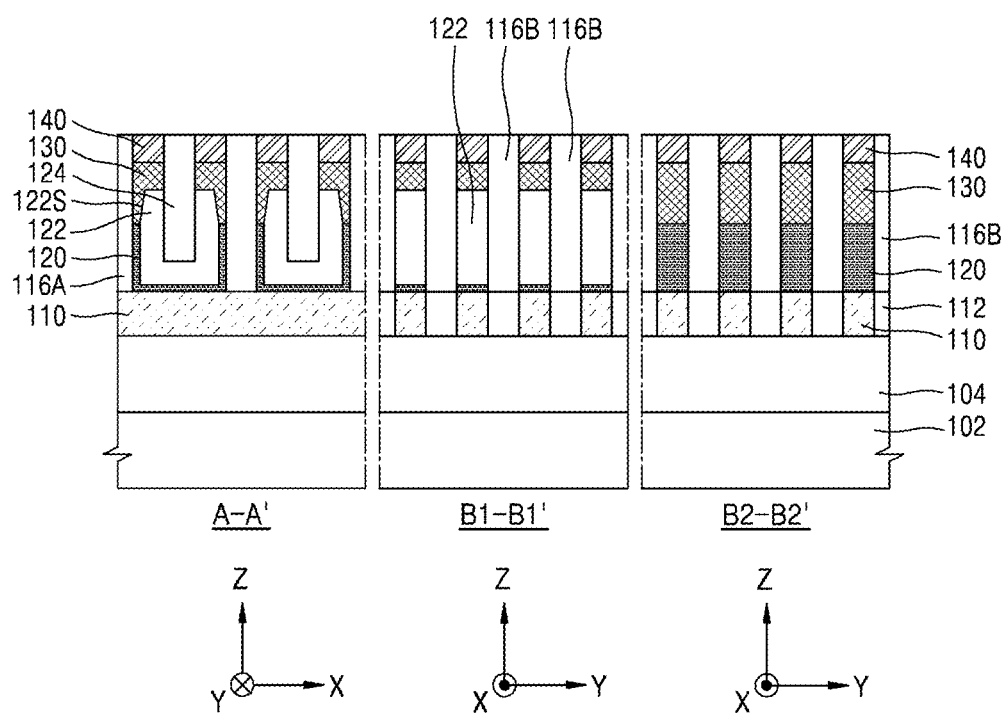
Figure 13L:
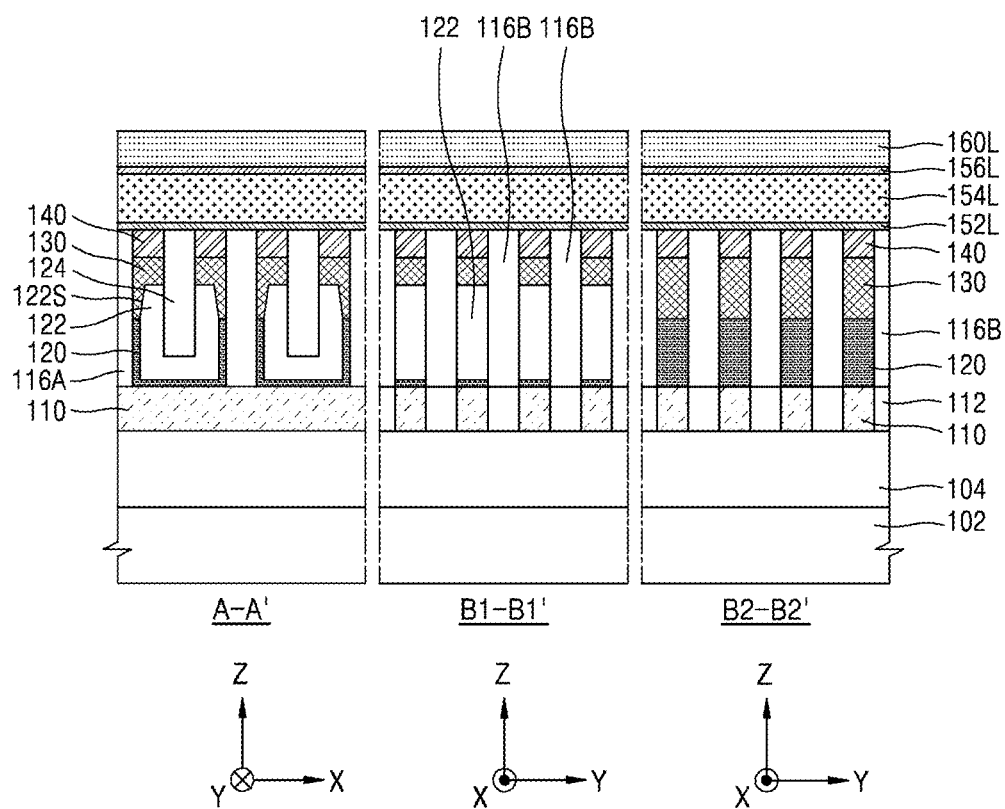
Figure 13M:
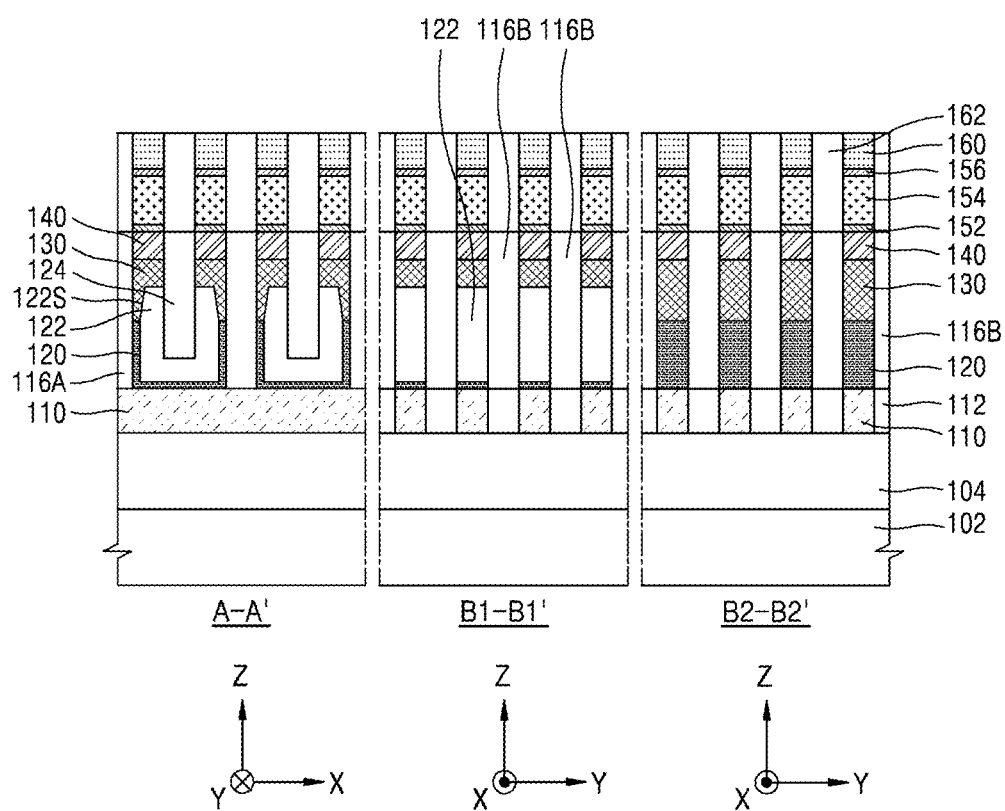
Figure 13N:
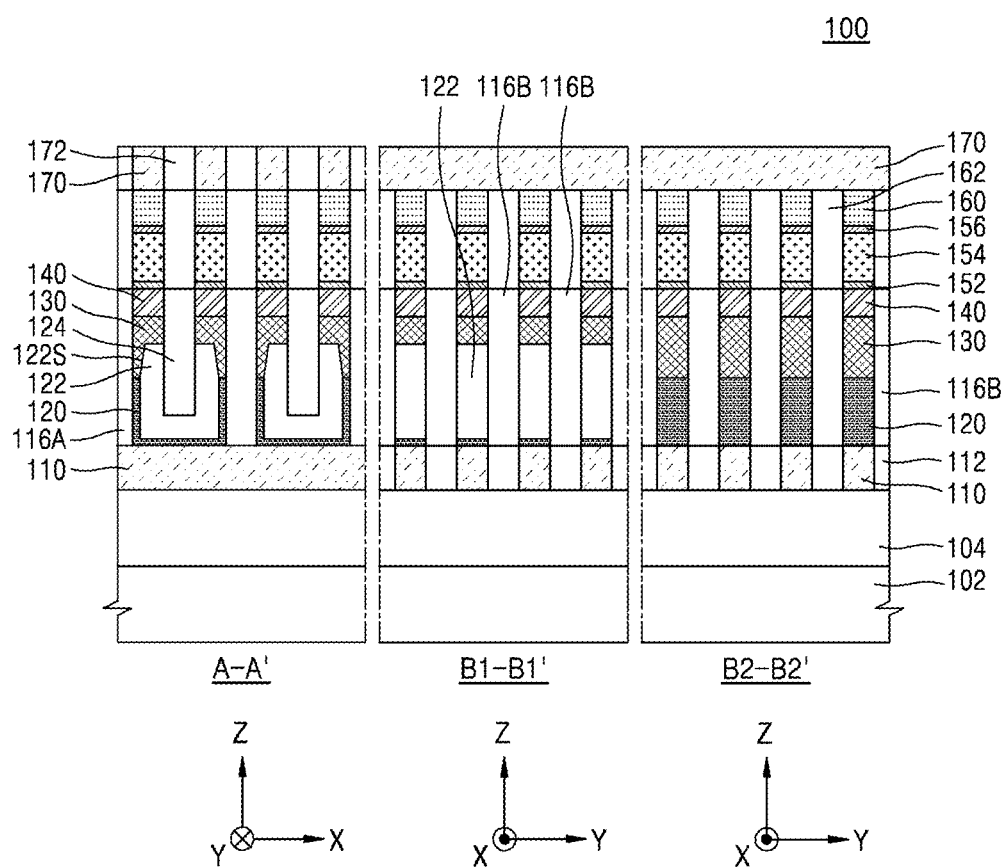

FIGS. 13A to 13N are cross-sectional views illustrating sequential processes of an example method of fabricating a memory device, according to some example embodiments. An example method of fabricating the memory device 100 shown in FIGS. 3A and 3B will be described with reference to FIGS. 13A to 13N. FIGS. 13A to 13N illustrate cross-sectional views of main components, which correspond to cross-sections respectively taken along the lines A-A', B1-B1', and B2-B2' of FIG. 3A, according to a process order.

Referring to FIG. 13A, the interlayer dielectric 104 is formed on the substrate 102, and the plurality of first conductive lines 110 and the plurality of first insulating patterns 112 are formed on the interlayer dielectric 104, the plurality of first insulating patterns 112 insulating the plurality of first conductive lines 110 from each other. The plurality of first conductive lines 110 may extend in one direction, for example, the X direction.

Referring to FIG. 13B, the plurality of first insulating walls 116A are formed on the plurality of first conductive lines 110 and the plurality of first insulating patterns 112.

The plurality of first insulating walls 116A may extend parallel to each other along the Y direction. Both sidewalls each of the plurality of first insulating walls 116A may extend approximately in a vertical direction (Z direction). The plurality of first insulating walls 116A may include a nitride film or an oxide film. For example, the plurality of first insulating walls 116A may include a silicon nitride film.

The plurality of first insulating walls 116A may each have a first width W1 in the X direction, and may be spaced apart from each other by a first gap G1. The first gap G1 may be about 3 times as large as the first width W1. The first gap G1 may provide filling spaces, which are filled with materials required to form the plurality of memory cell pillars P1 (see FIGS. 3A to 3C). The plurality of first conductive lines 110 and the plurality of first insulating patterns 112 may be exposed between the plurality of first insulating walls 116A by the first gap G1. The first gap G1 may be referred to as a filling space.

Referring to FIG. 13C, a preliminary heating electrode layer 120L and a first insulating spacer layer 122L are formed to conformally cover an exposed surface of each of the plurality of first insulating walls 116A, the plurality of first conductive lines 110, and the plurality of first insulating patterns 112, followed by forming a preliminary gap-fill insulating film 124L on the first insulating spacer layer 122L, the preliminary gap-fill insulating film 124L filling spaces between the plurality of first insulating walls 116A, such that the preliminary heating electrode layer 120L conformally covers the plurality of first insulating walls 116A and the first conductive line 110, and the first insulating spacer layer 122L and the preliminary gap-fill insulating film 124L sequentially cover the preliminary heating electrode layer 120L.

Descriptions of constitution materials of the preliminary heating electrode layer 120L, the first insulating spacer layer 122L, and the preliminary gap-fill insulating film 124L are respectively the same as the descriptions made as to constitution materials of the heating electrode layer 120, the first insulating spacer 122, and the gap-fill insulating film 124 with reference to FIGS. 3A to 3C. The first insulating spacer layer 122L and the preliminary gap-fill insulating film 124L may include materials having different etch selectivities from each other. For example, the first insulating spacer layer 122L may include a silicon oxide film, and the preliminary gap-fill insulating film 124L may include a silicon nitride film.

Referring to FIG. 13D, unnecessary portions over the plurality of first insulating walls 116A are removed to expose a top surface of each of the plurality of first insulating walls 116A, whereby the preliminary heating electrode layer 120L, the first insulating spacer layer 122L, and the preliminary gap-fill insulating film 124L may remain only between the plurality of first insulating walls 116A. During the removal of the unnecessary portions, each of the plurality of first insulating walls 116A, the preliminary heating electrode layer 120L, the first insulating spacer layer 122L, and the preliminary gap-fill insulating film 124L may be reduced in thickness. To remove the unnecessary portions, a chemical mechanical polishing (CMP) or etch-back process may be performed.

Referring to FIG. 13E, a plurality of mask patterns M1 are formed, and the result product of FIG. 13D is etched by using the plurality of mask patterns M1 as an etch mask, thereby forming a plurality of stacked structures having line shapes and including the plurality of first insulating walls 116A, the preliminary heating electrode layer 120L, the first insulating spacer layer 122L, and the preliminary gap-fill insulating film 124L. The plurality of first insulating patterns 112 may be exposed by line spaces LS1 between the plurality of stacked structures.

Like the plurality of first conductive lines 110, the plurality of mask patterns M1 may include a plurality of line patterns extending parallel to each other in the X direction. The plurality of mask patterns M1 may include polysilicon, without being limited thereto.

Referring to FIG. 13F, the plurality of mask patterns M1 are removed from the result product of FIG. 13E, followed by forming the plurality of second insulating walls 116B, which fill the line spaces LS1 between the plurality of stacked structures. Both sidewalls of each of the plurality of second insulating walls 116B may extend approximately in a vertical direction (Z direction). To form the plurality of second insulating walls 116B, an insulating film having a thickness enough to fill a plurality of line spaces LS1 is formed on the result product of FIG. 13E, followed by removing an unnecessary portion of the insulating film by CMP or etch-back so as to expose top surfaces of the plurality of first insulating walls 116A, the preliminary heating electrode layer 120L, the first insulating spacer layer 122L, and the preliminary gap-fill insulating film 124L. During the removal of the unnecessary portion of the insulating film, the plurality of first insulating walls 116A, the preliminary heating electrode layer 120L, the first insulating spacer layer 122L, and the preliminary gap-fill insulating film 124L may be reduced in height.

The plurality of second insulating walls 116B may each have a second width W2 in the Y direction, and may be spaced apart from each other by a second gap G2. A width of the second gap G2 may correspond to the width of preliminary heating electrode layer 120L along the Y direction.

Referring to FIG. 13G, a first etching process, in which an upper portion of the first insulating spacer layer 122L of the result product of FIG. 13F is selectively etched as much as a certain thickness, is performed, thereby reducing the height of the first insulating spacer layer 122L to form a lowered insulating spacer layer 122L as shown in FIG. 13G.

The first etching process may be performed by using a difference between etch selectivities of the first insulating wall 116A, the second insulating wall 116B, the preliminary heating electrode layer 120L, and the preliminary gap-fill insulating film 124L and etch selectivity of the first insulating spacer layer 122L. When the first insulating spacer layer 122L includes a silicon oxide film, the first etching process may include a wet etching process using a dilute HF (DHF) solution.

The height of the first insulating spacer layer 122L is adjusted during the first etching process, whereby heights of the resistive memory layer 130 and the electrode layer 140, which are formed in subsequent processes, may be determined.

Referring to FIG. 13H, a second etching process, in which an upper portion of the preliminary heating electrode layer 120L of the result product of FIG. 13G is selectively etched, is performed, thereby forming the heating electrode layer 120 having a top contact surface 120T that is at a lower level than a top surface 122T of the first insulating spacer layer 122L. During the second etching process, a portion of the (lowered) first insulating spacer layer 122L exposed to an etching atmosphere of the second etching process is removed together with upper portion of the preliminary heating electrode layer 120L, thereby forming the first insulating spacer 122 having the inclined sidewalls 122S from the first insulating spacer layer 122L.

The second etching process may be performed by using a difference in etch selectivity between the first insulating spacer layer 122L and the preliminary heating electrode layer 120L. In some example embodiments, when the preliminary heating electrode layer 120L includes TiN, the second etching process may include a wet etching process using an SC1 etchant including $NH_4OH$, $H_2O_2$, and $H_2O$. As shown in FIG. 13H, after the second etching process, a surface that is distal in the fin portion 120P of the heating electrode layer 120 from the first conductive line 110 (e.g., top contact surface 120T) is exposed by a space at least partially defined by the inclined sidewall 122S in the filling space.

Referring to FIG. 13I, a preliminary resistive memory layer 130L is formed on the heating electrode layer 120, the preliminary resistive memory layer 130L covering the plurality of first insulating walls 116A and the plurality of second insulating walls 116B while filling spaces defined by the first insulating spacer 122, the plurality of first insulating walls 116A, and the plurality of second insulating walls 116B. Restated, the preliminary resistive memory layer 130L may be formed in a region at least partially defined by the heating electrode layer 120, the inclined sidewall 122S of the first insulating spacer 122, the pair of first insulating walls 116A, and the gap-fill insulating film 124 in the first gap G1 The preliminary resistive memory layer 130L may include a material constituting the resistive memory layer 130.

In forming the preliminary resistive memory layer 130L, even when the heating electrode layer 120 has an extremely small thickness, since relatively narrow spaces, which are defined by the first insulating spacer 122, the plurality of first insulating walls 116A, and the plurality of second insulating walls 116B are gradually widened away from a top surface of the heating electrode layer 120 because of the inclined sidewalls 122S, a material constituting the preliminary resistive memory layer 130L may stably fill the spaces directly above the top surface of the heating electrode layer 120 without causing filling defects such as voids or the like. Therefore, even when the heating electrode layer 120 has an extremely small thickness, hole structures advantageous for a filling process are provided over the heating electrode layer 120 by the inclined sidewalls 122S, whereby a deposition process for forming the preliminary resistive memory layer 130L contacting the top surface of the heating electrode layer 120 may be easily performed.

Referring to FIG. 13J, an upper portion of the preliminary resistive memory layer 130L of the result product of FIG. 13I is removed, thereby forming the resistive memory layer 130 having a top surface 130T that is at a lower level than a top surface of each of the plurality of first insulating walls 116A and the plurality of second insulating walls 116B. Spaces defined by the plurality of first insulating walls 116A and the plurality of second insulating walls 116B may remain over the resistive memory layer 130.

Referring to FIG. 13K, the electrode layer 140 is formed on the resistive memory layer 130 and fills the spaces defined by the plurality of first insulating walls 116A and the plurality of second insulating walls 116B.

To form the electrode layer 140, a conductive material required to form the electrode layer 140 is deposited to a thickness enough to fill the spaces defined by the plurality of first insulating walls 116A and the plurality of second insulating walls 116B, followed by planarizing an obtained result product, thereby exposing the top surface of each of the plurality of first insulating walls 116A and the plurality of second insulating walls 116B.

Referring to FIG. 13L, a preliminary first interfacial layer 152L, a preliminary selection device layer 154L, a preliminary second interfacial layer 156L, and a preliminary electrode layer 160L are formed, in this stated order, on the result product in which the electrode layer 140 is formed.

Referring to FIG. 13M, the plurality of stacked structures, in which the first interfacial layer 152, the selection device layer 154, the second interfacial layer 156, and the electrode layer 160 are stacked in this stated order, are formed by patterning the preliminary first interfacial layer 152L, the preliminary selection device layer 154L, the preliminary second interfacial layer 156L, and the preliminary electrode layer 160L, and then, the insulating film 162 is formed and fills spaces between the plurality of stacked structures. The plurality of stacked structures may be respectively arranged one by one, on a plurality of electrode layers 140, at positions corresponding to the plurality of memory cells MC (see FIG. 2), and thus may be arranged in a matrix form in a plan view.

Referring to FIG. 13N, the plurality of second conductive lines 170 and the plurality of second insulating patterns 172 are formed on the result product of FIG. 13M, thereby forming the memory device 100.

According to the method of fabricating the memory device 100, which has been described with reference to FIGS. 13A to 13N, to minimize power consumption by reducing reset current in the memory device 100, in forming the heating electrode layer 120 to an extremely small thickness and forming the wedge memory portion 130W (see FIG. 3E) of the resistive memory layer 130 contacting the heating electrode layer 120 with a minimum contact area, since the widths of the spaces reaching the top surface of the heating electrode layer 120 are increased due to the inclined sidewalls 122S, a deposition process for forming the wedge memory portion 130W of the resistive memory layer 130 in the spaces defined by the plurality of first insulating walls 116A and the plurality of second insulating walls 116B may be stably and easily performed. Therefore, in the memory cell MC of the memory device 100 highly micronized due to high integration and down-scaling, a structure, in which the heating electrode layer 120 having an extremely small thickness contacts the wedge memory portion 130W (see FIG. 3E) of the resistive memory layer 130, is easily realized, whereby the memory device 100 configured to minimizing power consumption may be easily fabricated. As shown in at least FIG. 13N, the width of the wedge memory portion 130W is at least partially defined by the inclined sidewall 122S contacting the wedge memory portion 130W.

Heretofore, although the method of fabricating the memory device 100 shown in FIGS. 3A to 3E has been described with reference to FIGS. 13A to 13N, the memory devices 100A, 200, 200A, 300, 400, 500, 600, 700, and 800 shown in FIGS. 4 to 12B or memory devices having various structures modified and changed therefrom may be fabricated by using the processes described with reference to FIGS. 13A to 13N or using various methods modified and changed therefrom without departing from the spirit and scope of the inventive concepts.

For example, to fabricate the memory device 100A shown in FIG. 4, the plurality of first conductive lines 110 and the plurality of first insulating patterns 112 are formed in the same manner as described with reference to FIG. 13A, followed by performing the processes described with reference to FIGS. 13L and 13M, whereby the plurality of stacked structures, in which the first interfacial layer 152, the selection device layer 154, the second interfacial layer 156, and the electrode layer 160 are stacked in this stated order, and the insulating film 162 filling the spaces between the plurality of stacked structures may be formed directly on the plurality of first conductive lines 110. Next, the processes described with reference to FIGS. 13B to 13K are performed, whereby a structure including the heating electrode layer 120, the resistive memory layer 130, and the electrode layer 140, which are stacked in this stated order, may be formed, on the plurality of stacked structures, in the spaces defined by the plurality of first insulating walls 116A and the plurality of second insulating walls 116B. Next, the plurality of second conductive lines 170 directly connected to the plurality of electrode layers 140, and the plurality of second insulating patterns 172 insulating the plurality of second conductive lines 170 from each other may be formed in the same manner as described with reference to FIG. 13N.

FIGS. 14A to 14F are cross-sectional views illustrating sequential processes of an example method of fabricating a memory device, according to some example embodiments. An example method of fabricating the memory device 200 shown in FIG. 5A will be described with reference to FIGS. 14A to 14F. FIGS. 14A to 14F illustrate cross-sectional views of main components, which correspond to a cross-section taken along the line A-A' of FIG. 3A, according to a process order.

Figure 14A:
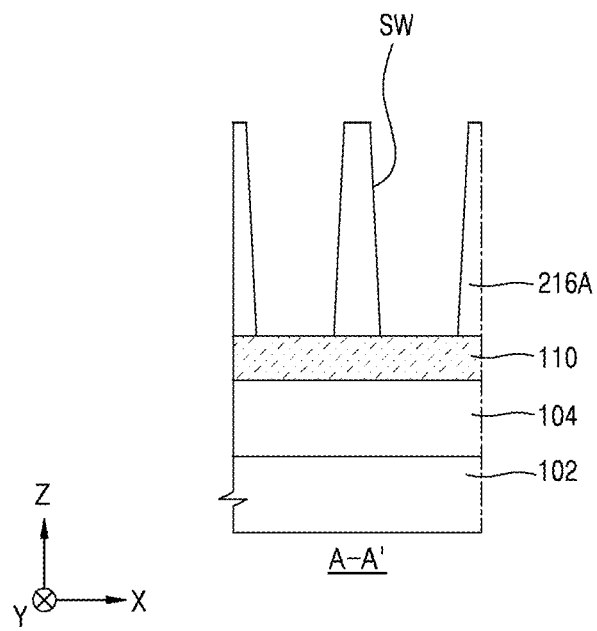
FIGS. 14A to 14F are cross-sectional views illustrating a method of fabricating a memory device, according to some example embodiments.

Referring to FIG. 14A, the plurality of first conductive lines 110 and the plurality of first insulating patterns 112 are formed on the interlayer dielectric 104 on the substrate 102 in the same manner as described with reference to FIG. 13A, followed by forming the plurality of first insulating walls 216A on the plurality of first conductive lines 110 and the plurality of first insulating patterns 112 in a similar manner to that described with reference to FIG. 13B. The plurality of first insulating walls 216A have substantially the same configuration as the plurality of first insulating walls 116A shown in FIG. 13B except that the plurality of first insulating walls 216A have the inclined sidewalls SW. The plurality of first insulating walls 216A having the inclined sidewalls SW may each have an increasing width in the X direction with decreasing distance from the substrate 102.

Figure 14B:
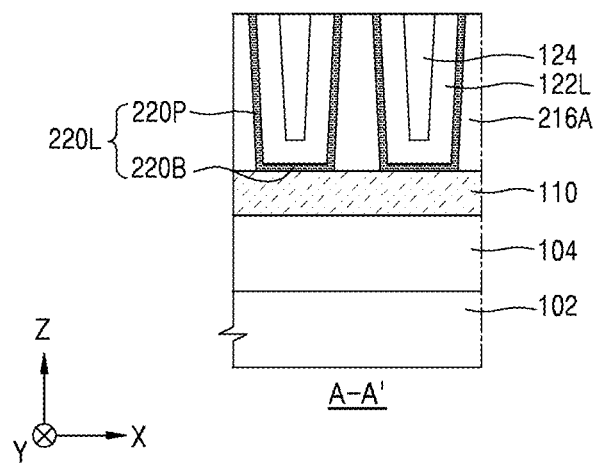

Referring to FIG. 14B, in a similar manner to that described with reference to FIGS. 13C to 13F, the preliminary heating electrode layer 220L, the first insulating spacer layer 122L, and the gap-fill insulating film 124 are formed in the spaces between the plurality of first insulating walls 216A. The preliminary heating electrode layer 220L may have substantially the same configuration as the preliminary heating electrode layer 120L shown in FIG. 13F except that the preliminary heating electrode layer 220L include: the base portion 220B; and the inclined fin portions 220P extending from both ends of the base portion 220B in a direction away from the substrate 102 along the inclined sidewalls SW.

Figure 14C:
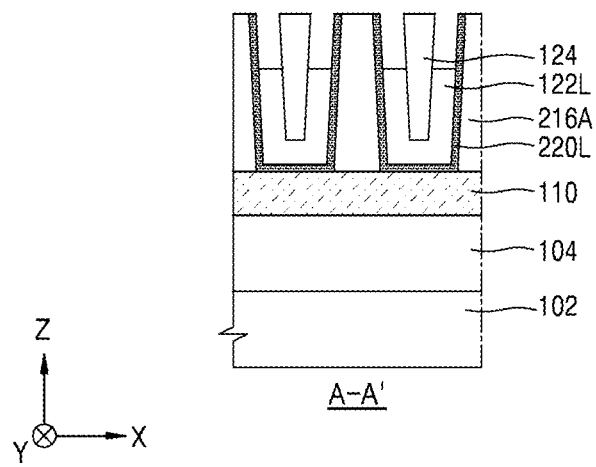

Referring to FIG. 14C, in a similar manner to that described with reference to FIG. 13G, the first etching process, in which the upper portion of the first insulating spacer layer 122L of the result product of FIG. 14B is selectively etched as much as a certain thickness, is performed, thereby reducing the height of the first insulating spacer layer 122L to form a lowered insulating spacer layer 122L as shown in FIG. 14C.

Figure 14D:
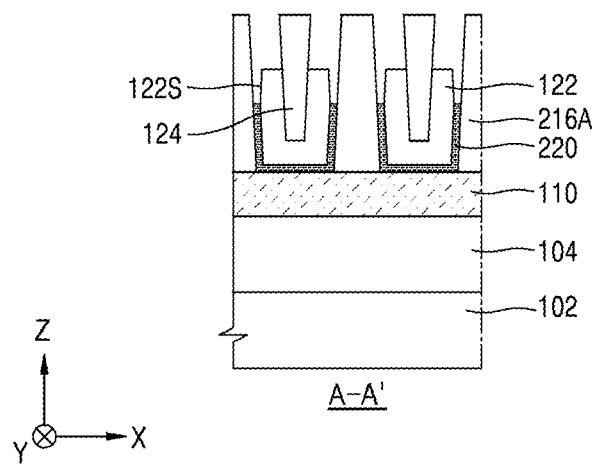

Referring to FIG. 14D, in a similar manner to that described with reference to FIG. 13H, the second etching process, in which an upper portion of the preliminary heating electrode layer 220L of the result product of FIG. 14C is selectively etched, is performed, thereby forming the heating electrode layer 220 having a top surface that is at a lower level than the top surface of the first insulating spacer layer 122L. During the second etching process for forming the heating electrode layer 220, a portion of the first insulating spacer layer 122L exposed to the etching atmosphere of the second etching process is removed together with the upper portion of the preliminary heating electrode layer 220L, thereby forming the first insulating spacer 122 having the inclined sidewalls 122S from the first insulating spacer layer 122L.

Figure 14E:
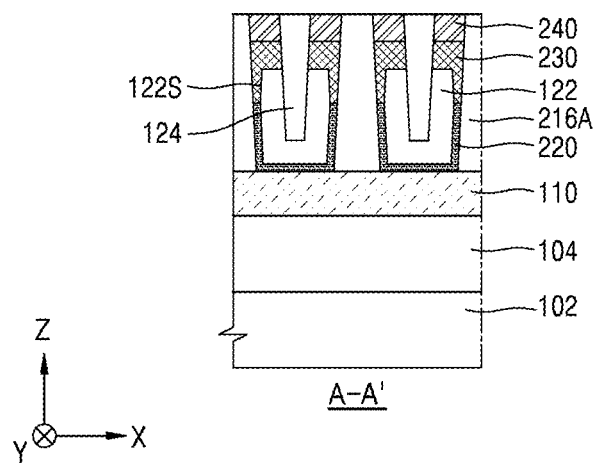

Referring to FIG. 14E, in a similar manner to the method of forming the resistive memory layer 130 and the electrode layer 140, which has been described with reference to FIGS. 13I to 13K, the resistive memory layer 230 and the electrode layer 240 are formed on the heating electrode layer 220.

Figure 14F:
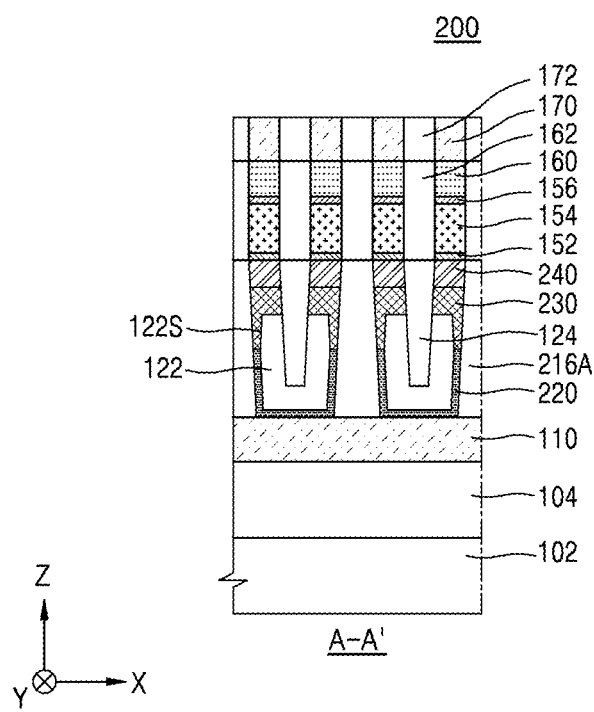

Referring to FIG. 14F, in the same manner as described with reference to FIGS. 13L and 13M, the plurality of stacked structures, in which the first interfacial layer 152, the selection device layer 154, the second interfacial layer 156, and the electrode layer 160 are stacked in this stated order, and the insulating film 162 filling the spaces between the plurality of stacked structures are formed. Next, in the same manner as described with reference to FIG. 13N, the plurality of second conductive lines 170 and the plurality of second insulating patterns 172 are formed, thereby forming the memory device 200.

According to the method of fabricating the memory device 200, which has been described with reference to FIGS. 14A to 14F, to minimize power consumption by reducing reset current in the memory device 200, in forming the heating electrode layer 220 to an extremely small thickness and forming the wedge memory portion 230W (see FIG. 5D) of the resistive memory layer 230 contacting the heating electrode layer 220 with a minimum contact area, since spaces reaching the top surface of the heating electrode layer 220 are gradually widened because of the inclined sidewalls 122S, a deposition process for forming the wedge memory portion 230W of the resistive memory layer 230 may be stably and easily performed. Therefore, the memory device 200, which includes the heating electrode layer 220 having an extremely small thickness and the wedge memory portion 230W (see FIG. 5D) of the resistive memory layer 230 so as to minimize the power consumption of the memory device 200, may be easily fabricated.

To fabricate the memory device 200A shown in FIG. 6, the method described with reference to FIGS. 14A to 14F may be used. However, in obtaining the result product of FIG. 14B, like in the process described with reference to FIG. 13E, the plurality of first insulating walls 216A, the preliminary heating electrode layer 220L, the first insulating spacer layer 122L, and the gap-fill insulating film 124, which fill the spaces between the plurality of first insulating walls 216A, may be etched by using the plurality of mask patterns M1 as an etch mask. Here, a plurality of stacked structures including the preliminary heating electrode layer 220L, the first insulating spacer layer 122L, and the gap-fill insulating film 124 may have inclined sidewalls, and thereby have increasing widths in the Y direction with decreasing distance from the substrate 102. Next, similarly to the method of forming the plurality of second insulating walls 116B, which has been described with reference to FIG. 13F, the plurality of second insulating walls 216C (see FIG. 6) may be formed. The plurality of second insulating walls 216C may have decreasing widths in the Y direction with decreasing distance from the substrate 102. Next, the processes described with reference to FIGS. 14C to 14F may be performed.

Figure 15A:
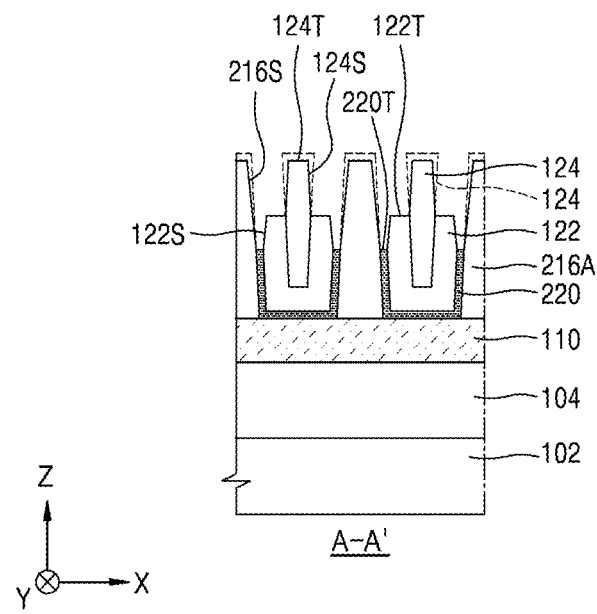
FIGS. 15A to 15C are cross-sectional views illustrating a method of fabricating a memory device, according to some example embodiments.
Figure 15B:
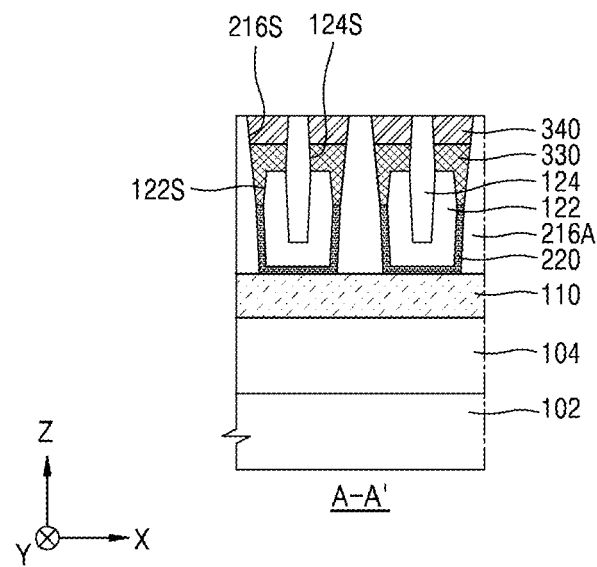
Figure 15C:
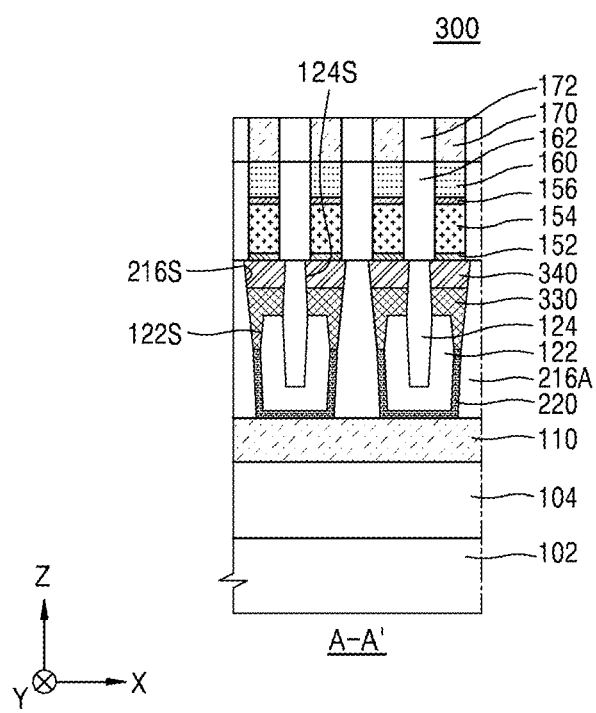

FIGS. 15A to 15C are cross-sectional views illustrating sequential processes of an example method of fabricating a memory device, according to some example embodiments. An example method of fabricating the memory device 300 shown in FIG. 7A will be described with reference to FIGS. 15A to 15C. FIGS. 15A to 15C illustrate cross-sectional views of main components, which correspond to a cross-section taken along the line A-A' of FIG. 3A, according to a process order.

Referring to FIG. 15A, the heating electrode layer 220 having the top contact surface 220T that is at a lower level than the top surface 122T of the first insulating spacer layer 122L, and the first insulating spacer 122 having the inclined sidewalls 122S are formed by performing the processes described with reference to FIGS. 14A to 14D, followed by performing a third etching process for selectively etching an exposed surface of each of the gap-fill insulating film 124, the plurality of first insulating walls 216A, and the plurality of second insulating walls 216B (see FIG. 7A), thereby increasing the widths of the spaces over the heating electrode layer 220 in the X direction and the Y direction, the spaces being defined by the gap-fill insulating film 124, the plurality of first insulating walls 216A, and the plurality of second insulating walls 216B.

In FIG. 15A, shapes of the plurality of first insulating walls 216A and the gap-fill insulating film 124 before the third etching process are marked by dashed lines. After the third etching process, the upper portion of each of the plurality of first insulating walls 216A and the plurality of second insulating walls 216B may have the inclined sidewall 216S. In addition, the upper portion of the gap-fill insulating film 124 may have the inclined sidewall 124S. Thus, the inclined sidewalls 216S, 124S may be formed after the forming of the first insulating spacer 122, and before the forming of the resistive memory layer 130, based on performing the third etching process in which exposed surfaces of the first insulating walls 216A, the second insulating walls 216B, and the gap-fill insulating film 124 are etched.

The third etching process may be performed by using a difference between etch selectivities of the heating electrode layer 220 and the first insulating spacer 122 and etch selectivities of the gap-fill insulating film 124, the plurality of first insulating walls 216A, and the plurality of second insulating walls 216B. For example, in the case that the heating electrode layer 220 includes TiN, that the first insulating spacer 122 includes a silicon oxide film, and that the gap-fill insulating film 124, the plurality of first insulating walls 216A, and the plurality of second insulating walls 216B include a silicon nitride film, the third etching process may include a dry etching process using carbon fluoride, for example, $CF_4$ gas. The dry etching process may include a process such as inductively coupled plasma (ICP) etching, transformer coupled plasma (TCP) etching, electron cyclotron resonance (ECR) plasma etching, reactive ion etching (RIE), or the like.

Referring to FIG. 15B, in a similar manner to the methods of forming the resistive memory layer 130 and the electrode layer 140, which have been described with reference to FIGS. 13I to 13K, the resistive memory layer 330 and the electrode layer 340 are formed on the heating electrode layer 220. Each of the resistive memory layer 330 and the electrode layer 340 may have increasing widths in the X direction and the Y direction with increasing distance from the substrate 102.

Referring to FIG. 15C, in the same manner as described with reference to FIGS. 13L and 13M, the plurality of stacked structures, in which the first interfacial layer 152, the selection device layer 154, the second interfacial layer 156, and the electrode layer 160 are stacked in this stated order, and the insulating film 162 filling the spaces between the plurality of stacked structures are formed. Next, in the same manner as described with reference to FIG. 13N, the plurality of second conductive lines 170 and the plurality of second insulating patterns 172 are formed, thereby forming the memory device 300.

According to the method of fabricating the memory device 300, which has been described with reference to FIGS. 15A to 15C, to minimize power consumption by reducing reset current in the memory device 300, in forming the heating electrode layer 220 to an extremely small thickness and forming the wedge memory portion 330W (see FIG. 7C) of the resistive memory layer 330 contacting the heating electrode layer 220 with a minimum contact area, since relatively narrow spaces reaching the top surface of the heating electrode layer 220 are gradually widened because of the inclined sidewalls 122S, a deposition process for forming the wedge memory portion 330W of the resistive memory layer 330 may be stably and easily performed. In addition, deposition processes for forming the resistive memory layer 330 and the electrode layer 340 may be stably and easily performed due to the inclined sidewall 216S of the upper portion of each of the plurality of first insulating walls 216A and the plurality of second insulating walls 216B and the inclined sidewall 124S of the upper portion of the gap-fill insulating film 124. Therefore, the memory device 300 having a structure configured to minimizing power consumption and improving reliability may be easily fabricated.

FIGS. 16A to 16F are cross-sectional views illustrating sequential processes of an example method of fabricating a memory device, according to some example embodiments. An example method of fabricating the memory device 400 shown in FIG. 8A will be described with reference to FIGS. 16A to 16F. FIGS. 16A to 16F illustrate cross-sectional views of main components, which correspond to a cross-section taken along the line A-A' of FIG. 3A, according to a process order.

Figure 16A:
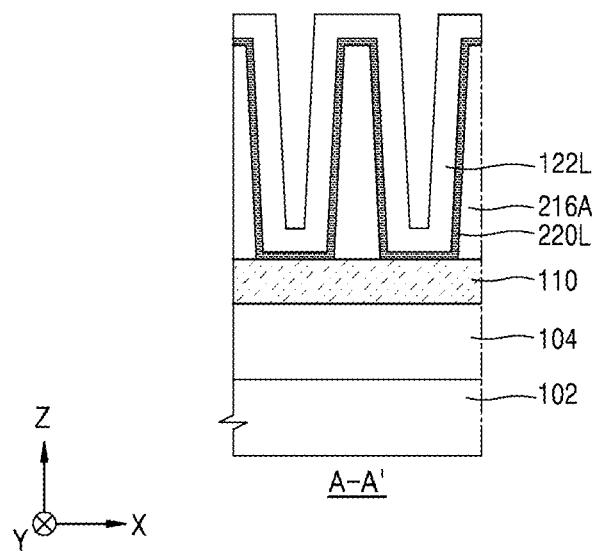
FIGS. 16A to 16F are cross-sectional views illustrating a method of fabricating a memory device, according to some example embodiments.

Referring to FIG. 16A, in the same manner as described with reference to FIG. 14A, the plurality of first conductive lines 110 and the plurality of first insulating patterns 112 are formed on the interlayer dielectric 104 on the substrate 102, followed by forming the plurality of first insulating walls 216A. Next, the preliminary heating electrode layer 120L and the first insulating spacer layer 122L are formed and conformally cover exposed surfaces of the plurality of first insulating walls 216A and the plurality of first conductive lines 110.

Figure 16B:
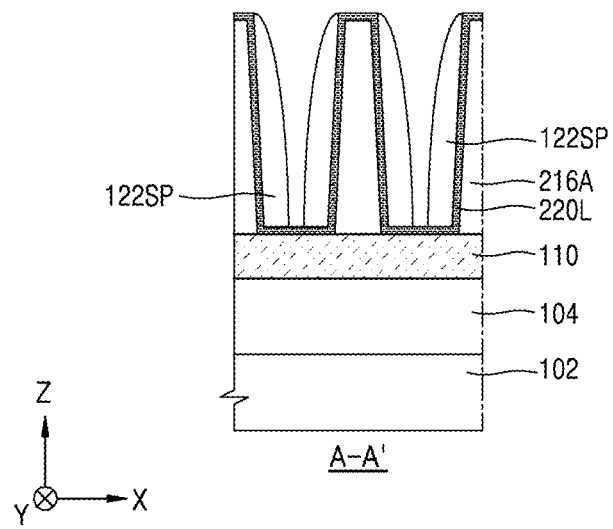

Referring to FIG. 16B, the first insulating spacer layer 122L of the result product of FIG. 16A undergoes etch-back, thereby forming the separated insulating spacer 122SP, which exposes a portion of the preliminary heating electrode layer 120L in the spaces between the plurality of first insulating walls 216A.

Figure 16C:
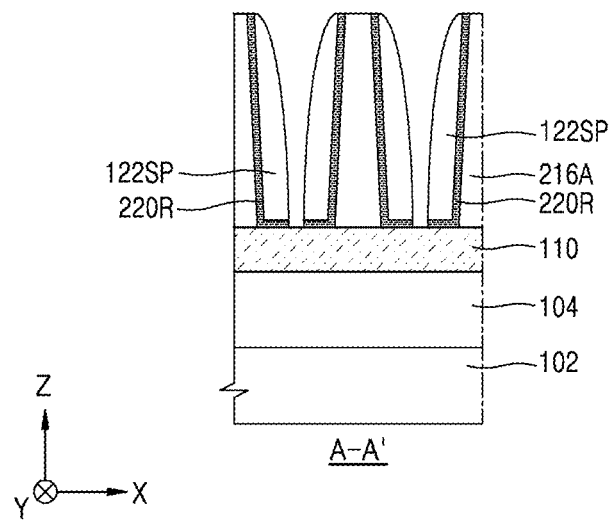

Referring to FIG. 16C, the exposed portion of the preliminary heating electrode layer 120L is etched by using the separated insulating spacer 122SP and the plurality of first insulating walls 216A as an etch mask, thereby leaving a pair of separated preliminary heating electrode layers 220R in each of the spaces between the plurality of first insulating walls 216A and exposing the first conductive line 110 between the pair of separated preliminary heating electrode layers 220R.

Figure 16D:
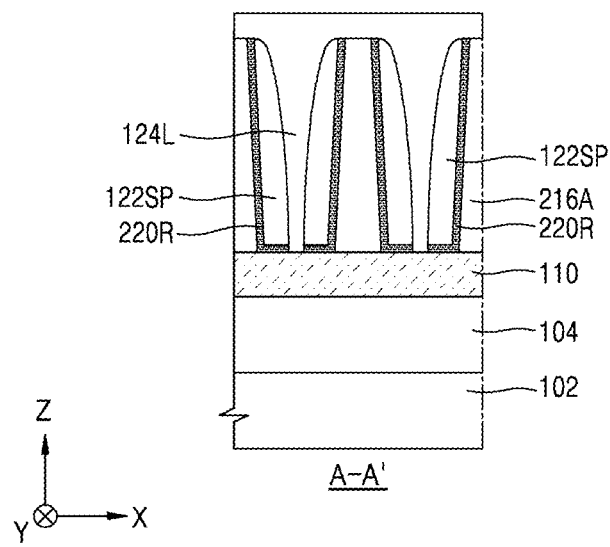

Referring to FIG. 16D, the preliminary gap-fill insulating film 124L is formed to fill the spaces between the plurality of first insulating walls 216A.

Figure 16E:
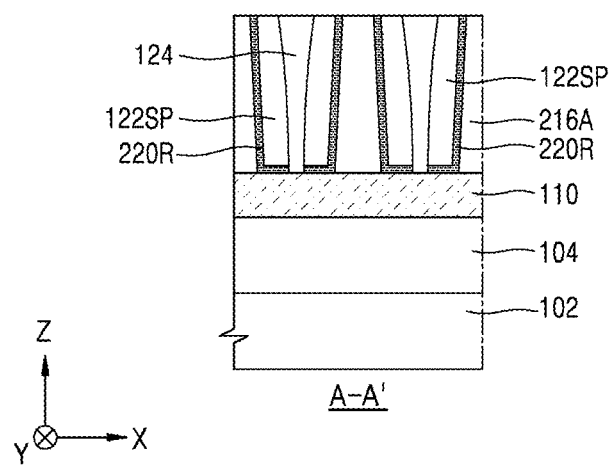

Referring to FIG. 16E, similar processes to those described with reference to FIGS. 13D to 13F are performed, thereby leaving the pair of separated preliminary heating electrode layers 220R, a pair of separated insulating spacers 122SP, and the gap-fill insulating film 124 in each of the spaces between the plurality of first insulating walls 216A.

Figure 16F:
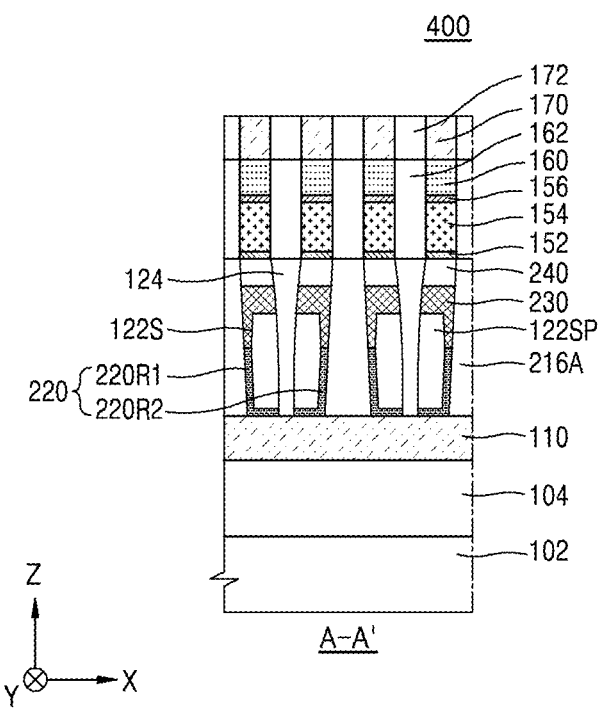

Referring to FIG. 16F, in a similar manner to that described with reference to FIG. 13G, there is performed the first etching process, in which heights of the pair of separated insulating spacers 122SP are reduced by selectively etching upper portions of the pair of separated insulating spacers 122SP of the result product of FIG. 16E as much as a certain thickness. Next, in a similar manner to that described with reference to FIG. 13H, there is performed the second etching process, in which the inclined sidewalls 122S are formed in the pair of separated insulating spacers 122SP by removing portions of the pair of separated insulating spacers 122SP while the heating electrode layer 220 including the pair of separated heating electrode layers 220R1 and 220R2 is formed by selectively etching the upper portions of the pair of separated insulating spacers 122SP, the pair of separated heating electrode layers 220R1 and 220R2 having top surfaces that are at a lower level than top surfaces of the pair of separated insulating spacers 122SP.

Next, in the same manner as described with reference to FIGS. 13I to 13M, the resistive memory layer 230 and the electrode layer 240 are formed on the heating electrode layer 220, followed by forming the plurality of stacked structures, in which the first interfacial layer 152, the selection device layer 154, the second interfacial layer 156, and the electrode layer 160 are stacked in this stated order, and the insulating film 162 filling the spaces between the plurality of stacked structures. Next, in the same manner as described with reference to FIG. 13N, the plurality of second conductive lines 170 and the plurality of second insulating patterns 172 are formed, thereby forming the memory device 400.

According to the method of fabricating the memory device 400, which has been described with reference to FIGS. 16A to 16F, the process of forming the resistive memory layer 230 including the wedge memory portion 230W (see FIG. 8B), which contacts the heating electrode layer 220 having an extremely small thickness, is stably and easily performed, whereby the memory device 400 configured to minimize power consumption by reducing reset current may be easily fabricated.

FIGS. 17A to 17G are cross-sectional views illustrating sequential processes of an example method of fabricating a memory device, according to some example embodiments. An example method of fabricating the memory device 500 shown in FIG. 9A will be described with reference to FIGS. 17A to 17G. FIGS. 17A to 17G illustrate cross-sectional views of main components, which correspond to a cross-section taken along the line A-A' of FIG. 3A, according to a process order.

Figure 17A:
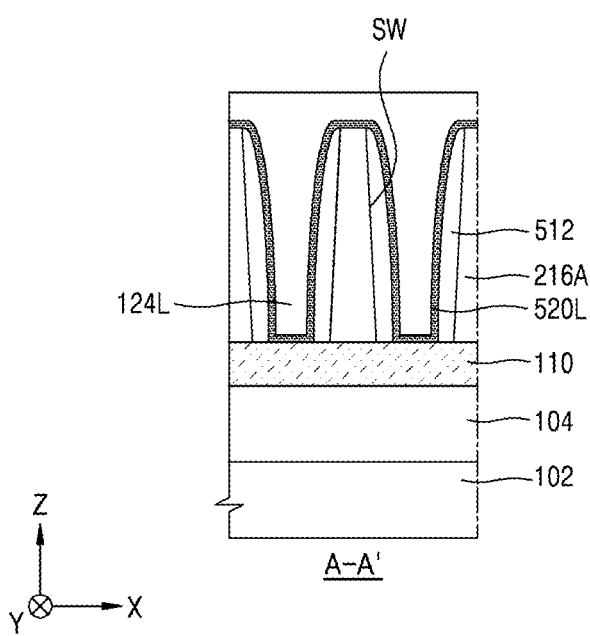
FIGS. 17A to 17G are cross-sectional views illustrating a method of fabricating a memory device, according to some example embodiments.

Referring to FIG. 17A, in the same manner as described with reference to FIG. 14A, the plurality of first conductive lines 110 and the plurality of first insulating patterns 112 are formed on the interlayer dielectric 104 on the substrate 102, followed by forming the plurality of first insulating walls 216A on the plurality of first conductive lines 110 and the plurality of first insulating patterns 112.

The first insulating spacer 512 is formed to cover the inclined sidewalls SW of the plurality of first insulating walls 216A, followed by forming a preliminary heating electrode layer 520L, which conformally covers exposed surfaces of the plurality of first insulating walls 216A, the plurality of first conductive lines 110, and the first insulating spacer 512. Next, the preliminary gap-fill insulating film 124L is formed on the preliminary heating electrode layer 520L and fills the spaces between the plurality of first insulating walls 216A.

The first insulating spacer 512 may include a different material from the plurality of first insulating walls 216A and the preliminary gap-fill insulating film 124L. In some example embodiments, the first insulating spacer 512 may include a silicon oxide film, and the plurality of first insulating walls 216A and the preliminary gap-fill insulating film 124L may include a silicon nitride film.

Figure 17B:
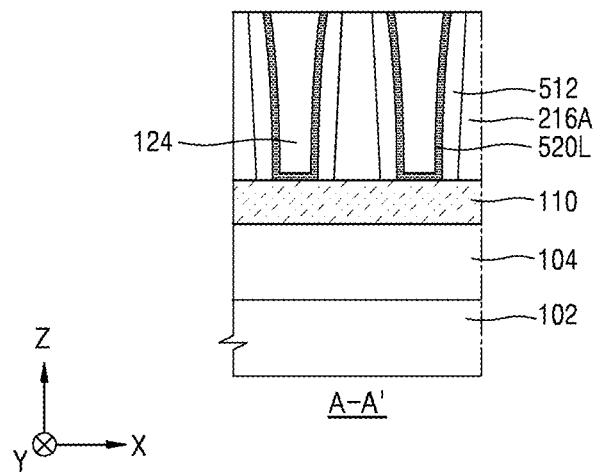

Referring to FIG. 17B, similar processes to those described with reference to FIGS. 13D to 13F are performed, thereby forming a structure in which the first insulating spacer 512, the preliminary heating electrode layer 520L, and the gap-fill insulating film 124 fill the spaces between the plurality of first insulating walls 216A.

Figure 17C:
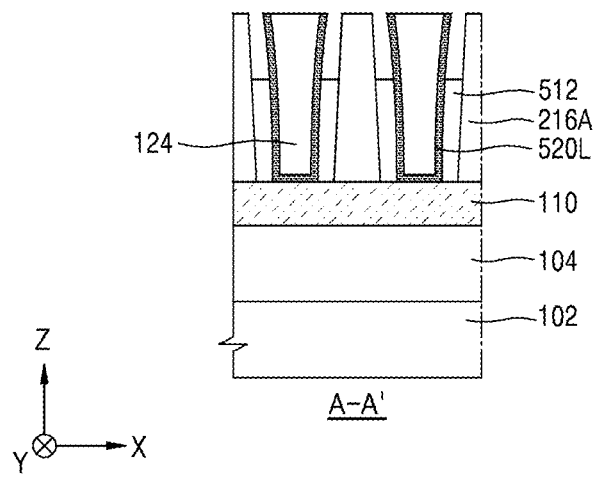

Referring to FIG. 17C, in a similar manner to that described with reference to FIG. 13G, the first etching process, in which an upper portion of the first insulating spacer 512 of the result product of FIG. 17B is selectively etched as much as a certain thickness, is performed, thereby reducing the height of the first insulating spacer 512.

Figure 17D:
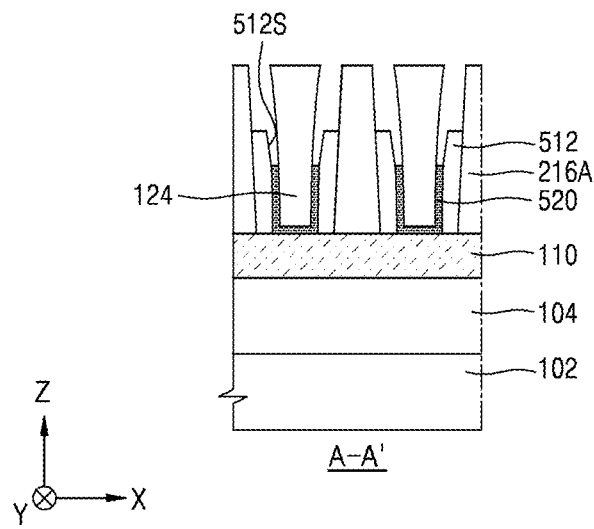

Referring to FIG. 17D, in a similar manner to that described with reference to FIG. 13H, the second etching process, in which an upper portion of the preliminary heating electrode layer 520L of the result product of FIG. 17C is selectively etched, is performed, thereby forming the heating electrode layer 520 having a top surface that is at a lower level than the top surface of the first insulating spacer 512. During the second etching process, a portion of the first insulating spacer 512 exposed to the etching atmosphere of the second etching process is removed together with the upper portion of the preliminary heating electrode layer 520L, thereby forming an inclined sidewall 512S in the first insulating spacer 512.

Figure 17E:
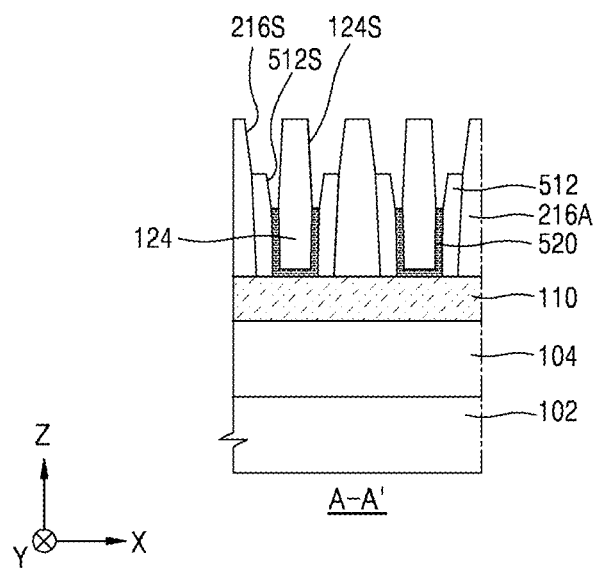

Referring to FIG. 17E, in a similar manner to that described with reference to FIG. 15A, the third etching process for selectively etching the exposed surface of each of the gap-fill insulating film 124, the plurality of first insulating walls 216A, and the plurality of second insulating walls 216B (see FIG. 9A) is performed, thereby increasing widths of spaces over the heating electrode layer 520 in the X direction and the Y direction, the spaces being defined by the gap-fill insulating film 124, the plurality of first insulating walls 216A, and the plurality of second insulating walls 216B. After the third etching process, the upper portion of each of the plurality of first insulating walls 216A and the plurality of second insulating walls 216B may have the inclined sidewall 216S. In addition, the upper portion of the gap-fill insulating film 124 may have the inclined sidewall 124S.

Figure 17F:
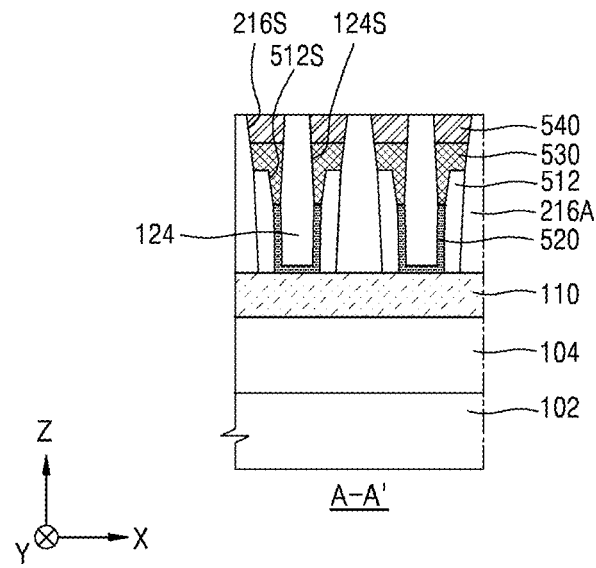

Referring to FIG. 17F, in a similar manner to the method of forming the resistive memory layer 130 and the electrode layer 140, which has been described with reference to FIGS. 13I to 13K, the resistive memory layer 530 and the electrode layer 540 are formed on the heating electrode layer 520. Each of the resistive memory layer 530 and the electrode layer 540 may have increasing widths in the X direction and the Y direction with increasing distance from the substrate 102.

Figure 17G:
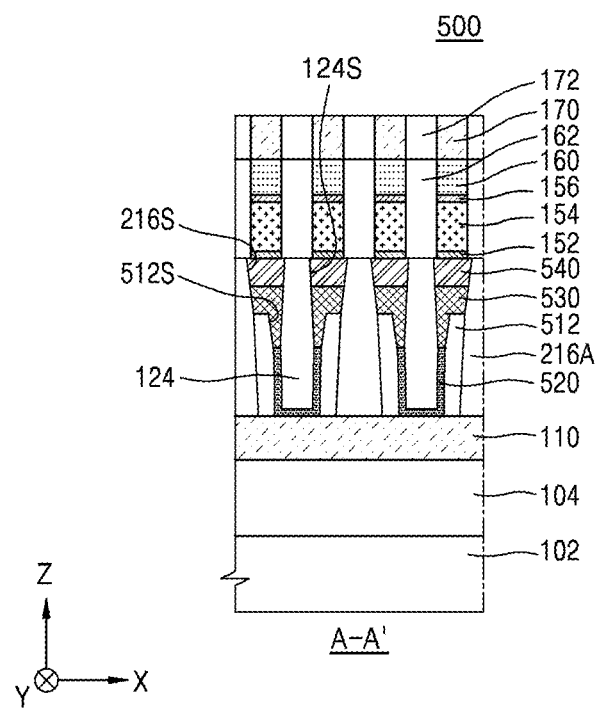

Referring to FIG. 17G, in the same manner as described with reference to FIGS. 13L and 13M, the plurality of stacked structures, in which the first interfacial layer 152, the selection device layer 154, the second interfacial layer 156, and the electrode layer 160 are stacked in this stated order, and the insulating film 162 filling the spaces between the plurality of stacked structures are formed. Next, in the same manner as described with reference to FIG. 13N, the plurality of second conductive lines 170 and the plurality of second insulating patterns 172 are formed, thereby forming the memory device 500.

According to the method of fabricating the memory device 500, which has been described with reference to FIGS. 17A to 17G, to minimize power consumption by reducing reset current in the memory device 500, in forming the heating electrode layer 520 to an extremely small thickness and forming the wedge memory portion 530W (see FIG. 9B) of the resistive memory layer 530 contacting the heating electrode layer 520 with a minimum contact area, since relatively narrow spaces reaching the top surface of the heating electrode layer 520 are gradually widened because of the inclined sidewall 512S, a deposition process for forming the wedge memory portion 530W may be stably and easily performed. In addition, deposition processes for forming the resistive memory layer 530 and the electrode layer 540 may be stably and easily performed due to the inclined sidewall 216S of the upper portion of each of the plurality of first insulating walls 216A and the plurality of second insulating walls 216B and the inclined sidewall 124S of the upper portion of the gap-fill insulating film 124. Therefore, the memory device 500 having a structure configured to minimizing power consumption and improving reliability may be easily fabricated.

FIGS. 18A to 18G are cross-sectional views illustrating sequential processes of an example method of fabricating a memory device, according to some example embodiments. An example method of fabricating the memory device 600 shown in FIG. 10A will be described with reference to FIGS. 18A to 18G. FIGS. 18A to 18G illustrate cross-sectional views of main components, which correspond to a cross-section taken along the line A-A' of FIG. 3A, according to a process order.

Figure 18A:
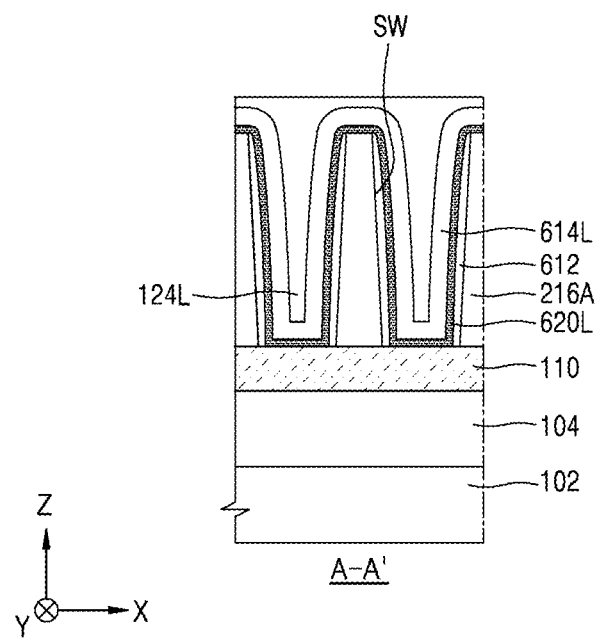
FIGS. 18A to 18G are cross-sectional views illustrating a method of fabricating a memory device, according to some example embodiments.

Referring to FIG. 18A, in the same manner as described with reference to FIG. 14A, the plurality of first conductive lines 110 and the plurality of first insulating patterns 112 are formed on the interlayer dielectric 104 on the substrate 102, followed by forming the plurality of first insulating walls 216A on the plurality of first conductive lines 110 and the plurality of first insulating patterns 112.

The first insulating spacer 612 is formed to cover the inclined sidewalls SW of the plurality of first insulating walls 216A, followed by forming a preliminary heating electrode layer 620L, which conformally covers exposed surfaces of the plurality of first insulating walls 216A, the plurality of first conductive lines 110, and the first insulating spacer 612. Next, a second insulating spacer layer 614L is formed to conformally cover the preliminary heating electrode layer 620L, and the preliminary gap-fill insulating film 124L is formed on the second insulating spacer layer 614L and fills the spaces between the plurality of first insulating walls 216A.

The first insulating spacer 612 and the second insulating spacer layer 614L may include different materials from the plurality of first insulating walls 216A and the preliminary gap-fill insulating film 124L. In some example embodiments, the first insulating spacer 612 and the second insulating spacer layer 614L may include a silicon oxide film, and the plurality of first insulating walls 216A and the preliminary gap-fill insulating film 124L may include a silicon nitride film.

Figure 18B:
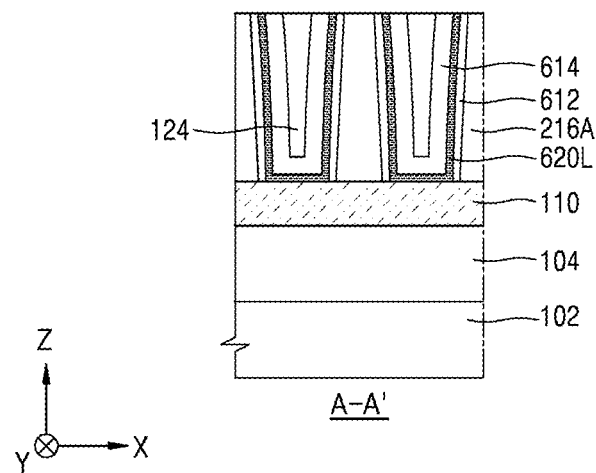

Referring to FIG. 18B, similar processes to those described with reference to FIGS. 13D to 13F are performed, thereby forming a structure in which the first insulating spacer 612, the preliminary heating electrode layer 620L, the second insulating spacer 614 corresponding to a remaining portion of the second insulating spacer layer 614L, and the gap-fill insulating film 124 fill the spaces between the plurality of first insulating walls 216A.

Figure 18C:
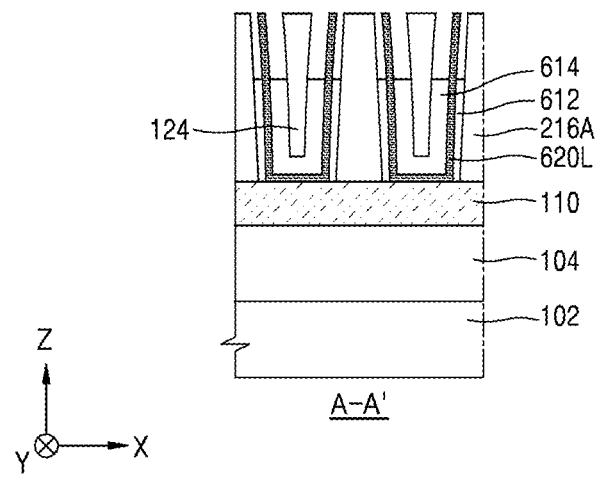

Referring to FIG. 18C, in a similar manner to that described with reference to FIG. 13G, the first etching process, in which an upper portion of each of the first insulating spacer 612 and the second insulating spacer 614 of the result product of FIG. 18B is selectively etched as much as a certain thickness, is performed, thereby reducing heights of the first insulating spacer 612 and the second insulating spacer 614.

Figure 18D:
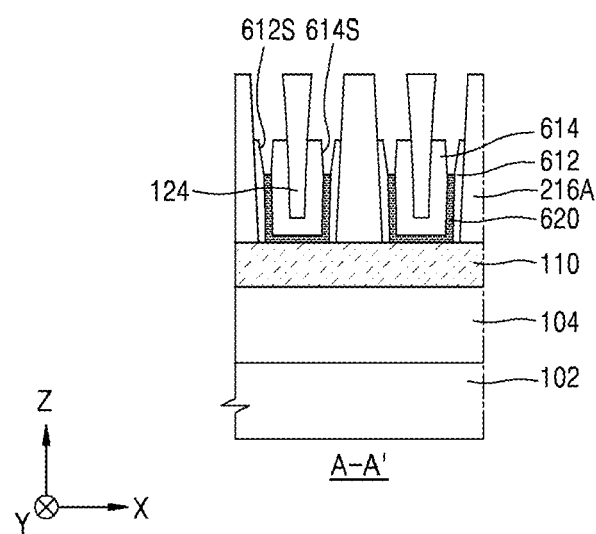

Referring to FIG. 18D, in a similar manner to that described with reference to FIG. 13H, the second etching process, in which an upper portion of the preliminary heating electrode layer 620L of the result product of FIG. 18C is selectively etched, is performed, thereby forming the heating electrode layer 620 having a top surface that is at a lower level than top surfaces of the first insulating spacer 612 and the second insulating spacer 614. During the second etching process, portions of the first insulating spacer 612 and the second insulating spacer 614 exposed to the etching atmosphere of the second etching process are removed together with the upper portion of the preliminary heating electrode layer 620L, thereby respectively forming inclined sidewalls 612S and 614S in the first insulating spacer 612 and the second insulating spacer 614.

Figure 18E:
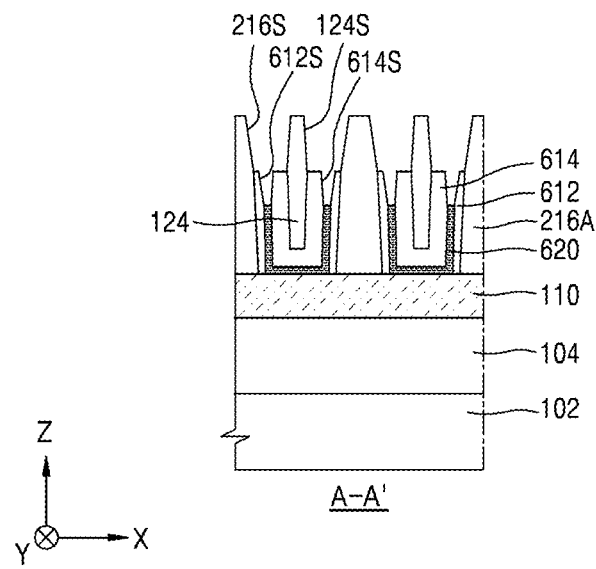

Referring to FIG. 18E, in a similar manner to that described with reference to FIG. 15A, the third etching process for selectively etching the exposed surface of each of the gap-fill insulating film 124, the plurality of first insulating walls 216A, and the plurality of second insulating walls 216B (see FIG. 10A) is performed, thereby increasing widths of spaces over the heating electrode layer 620 in the X direction and the Y direction, the spaces being defined by the gap-fill insulating film 124, the plurality of first insulating walls 216A, and the plurality of second insulating walls 216B. After the third etching process, the upper portion of each of the plurality of first insulating walls 216A and the plurality of second insulating walls 216B may have the inclined sidewall 216S. In addition, the upper portion of the gap-fill insulating film 124 may have the inclined sidewall 124S.

Figure 18F:
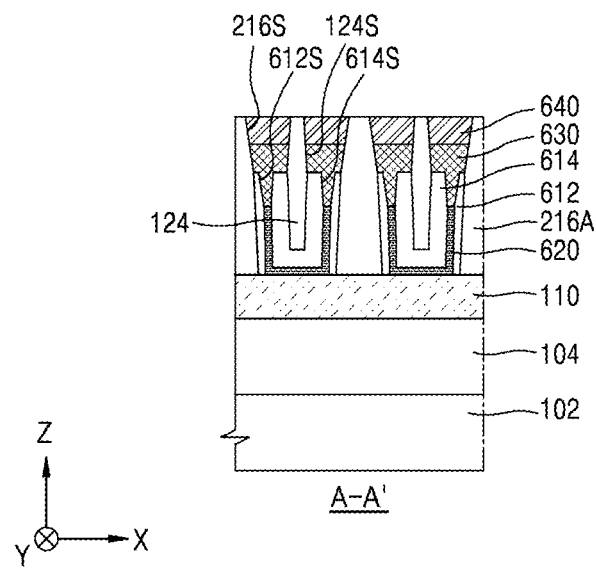

Referring to FIG. 18F, in a similar manner to the method of forming the resistive memory layer 130 and the electrode layer 140, which has been described with reference to FIGS. 13I to 13K, the resistive memory layer 630 and the electrode layer 640 are formed on the heating electrode layer 620. Each of the resistive memory layer 630 and the electrode layer 640 may have increasing widths in the X direction and the Y direction with increasing distance from the substrate 102.

Figure 18G:
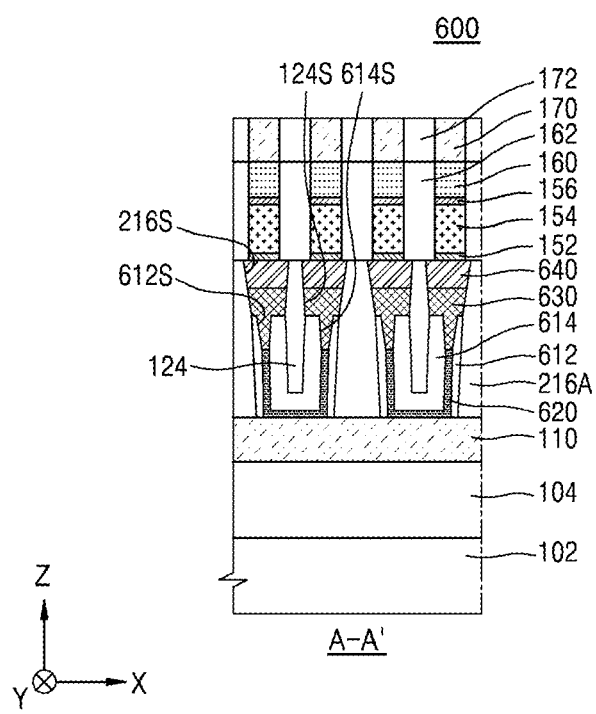

Referring to FIG. 18G, in the same manner as described with reference to FIGS. 13L and 13M, the plurality of stacked structures, in which the first interfacial layer 152, the selection device layer 154, the second interfacial layer 156, and the electrode layer 160 are stacked in this stated order, and the insulating film 162 filling the spaces between the plurality of stacked structures are formed. Next, in the same manner as described with reference to FIG. 13N, the plurality of second conductive lines 170 and the plurality of second insulating patterns 172 are formed, thereby forming the memory device 600.

According to the method of fabricating the memory device 600, which has been described with reference to FIGS. 18A to 18G, to minimize power consumption by reducing reset current in the memory device 600, in forming the heating electrode layer 620 to an extremely small thickness and forming the wedge memory portion 630W (see FIG. 10B) of the resistive memory layer 630 contacting the heating electrode layer 620 with a minimum contact area, since relatively narrow spaces reaching the top surface of the heating electrode layer 620 are gradually widened because of the inclined sidewalls 612S and 614S, a deposition process for forming the wedge memory portion 630W may be easily performed. In addition, deposition processes for forming the resistive memory layer 630 and the electrode layer 640 may be easily performed due to the inclined sidewall 216S of the upper portion of each of the plurality of first insulating walls 216A and the plurality of second insulating walls 216B (see FIG. 10A) and the inclined sidewall 124S of the upper portion of the gap-fill insulating film 124. Therefore, the memory device 600 having a structure configured to minimizing power consumption and improving reliability may be easily fabricated.

While the inventive concepts have been particularly shown and described with reference to embodiments thereof, it will be understood that various changes in form and details may be made therein without departing from the spirit and scope of the following claims.

What is claimed is:

1. A method of fabricating a memory device, the method comprising:
    forming a first conductive line extending over a substrate in a first direction;
    forming a memory cell pillar on the first conductive line, wherein the memory cell pillar includes a heating electrode layer and a resistive memory layer, the resistive memory layer including a wedge memory portion and a body memory portion, the wedge memory portion contacting the heating electrode layer and having a width that changes with increasing distance from the heating electrode layer, the body memory portion being connected to the wedge memory portion; and forming a second conductive line extending over the memory cell pillar in a second direction that intersects the first direction, such that the first conductive line and the second conductive line vertically overlap with the memory cell pillar interposed between the first conductive line and the second conductive line, wherein the forming of the memory cell pillar includes forming a pair of insulating walls over the first conductive line, the pair of insulating walls being spaced apart from each other with a filling space therebetween, and forming the heating electrode layer in the filling space, such that the heating electrode layer includes a base portion extending substantially parallel to the first conductive line, and a fin portion extending along a sidewall of one insulating wall of the pair of insulating walls from one end of the base portion in a direction away from the first conductive line.

2. The method according to claim 1, wherein the forming of the memory cell pillar further comprises:

forming the resistive memory layer in the filling space, such that the wedge memory portion contacts the heating electrode layer and the width of the wedge memory portion increases continuously with increasing distance from the heating electrode layer, and the body memory portion has a greater width than the wedge memory portion.

3. The method according to claim 2, further comprising: forming an electrode layer on the resistive memory layer in the filling space.

4. The method according to claim 1, wherein the forming of the memory cell pillar comprises:

forming the heating electrode layer, an insulating spacer, and a gap-fill insulating film sequentially covering the first conductive line in the filling space, such that the heating electrode layer conformally covers the pair of insulating walls and the first conductive line, and the insulating spacer has inclined sidewalls defining partial spaces exposing the heating electrode layer, and forming the resistive memory layer on the heating electrode layer and on the insulating spacer, such that the wedge memory portion of the resistive memory layer fills the partial spaces.

5. The method according to claim 4, wherein the forming of the memory cell pillar further comprises:

forming an inclined sidewall in each of the pair of insulating walls and the gap-fill insulating film before the forming of the resistive memory layer, wherein the body memory portion of the resistive memory layer has increasing widths with increasing distance from the substrate.

6. The method according to claim 1, wherein, in the forming of the memory cell pillar, the body memory portion is formed to have a greater width than the wedge memory portion.

7. The method according to claim 1, wherein, the wedge memory portion of the resistive memory layer contacts the fin portion of the heating electrode layer.

8. The method according to claim 1, the forming of the memory cell pillar further comprising:

forming an electrode layer on the resistive memory layer, wherein the heating electrode layer, the resistive memory layer, and the electrode layer are aligned with a line extending between the first conductive line and the second conductive line.

9. The method according to claim 4, wherein an included angle between the base portion and the fin portion is a right angle.

10. The method according to claim 1, wherein, in the forming of the memory cell pillar, the heating electrode layer and the resistive memory layer vertically overlap each other along an axis extending between the first conductive line and the second conductive line.

11. A method of fabricating a memory device, the method comprising:

forming a first conductive line over a substrate;

forming a pair of insulating walls over the first conductive line, the pair of insulating walls being spaced apart from each other with a filling space therebetween;

forming a preliminary heating electrode layer, an insulating spacer layer, and a gap-fill insulating film in the filling space, such that the preliminary heating electrode layer conformally covers the pair of insulating walls and the first conductive line, and the insulating spacer layer and the gap-fill insulating film sequentially cover the preliminary heating electrode layer;

forming a lowered insulating spacer layer based on performing a first etching process in which an upper portion of the insulating spacer layer in the filling space is selectively etched as much as a certain thickness;

forming a heating electrode layer and an insulating spacer in the filling space based on performing a second etching process in which a portion of the lowered insulating spacer layer is removed while an upper portion of the preliminary heating electrode layer is selectively etched, wherein the heating electrode layer has a top surface that is at a lower level than a top surface of the lowered insulating spacer layer, and the insulating spacer has an inclined sidewall; and forming a resistive memory layer in a region at least partially defined by the heating electrode layer, the inclined sidewall of the insulating spacer, the pair of insulating walls, and the gap-fill insulating film in the filling space.

12. The method according to claim 11, wherein, in the forming of the heating electrode layer, the heating electrode layer includes a base portion extending substantially parallel to the first conductive line, and a fin portion extending from one end of the base portion in a direction away from the first conductive line, after the second etching process, a surface that is distal in the fin portion from the first conductive line is exposed by a space at least partially defined by the inclined sidewall in the filling space, and wherein an included angle between the base portion and the fin portion is a right angle.

13. The method according to claim 11, wherein, in the forming of the heating electrode layer, the heating electrode layer includes a fin portion extending in a direction away from the first conductive line, and in the forming of the resistive memory layer, the resistive memory layer includes a wedge memory portion contacting the fin portion and having a width defined by the inclined sidewall.

14. The method according to claim 11, wherein, in the forming of the resistive memory layer, the resistive memory layer includes a wedge memory portion contacting a fin portion of the heating electrode layer and having a width defined by the inclined sidewall, and a body memory portion having a greater width than the wedge memory portion.

15. The method according to claim 11, further comprising:
forming an inclined sidewall in each of the pair of insulating walls and the gap-fill insulating film after the forming of the insulating spacer, and before the forming of the resistive memory layer, based on performing a third etching process in which exposed surfaces of the pair of insulating walls and the gap-fill insulating film are etched.

16. The method according to claim 11, after the forming of the resistive memory layer, further comprising:
forming an electrode layer on the resistive memory layer in the filling space.

17. A method of fabricating a memory device, the method comprising:
forming a first conductive line extending over a substrate in a first direction;
forming a memory cell pillar on the first conductive line; and
forming a second conductive line extending over the memory cell pillar in a second direction that intersects the first direction, such that the first conductive line and the second conductive line vertically overlap with the memory cell pillar between the first conductive line and the second conductive line,
wherein the forming of the memory cell pillar comprises forming an insulating wall over the first conductive line,
forming a heating electrode layer on the first conductive line, the heating electrode layer including a base portion extending substantially parallel to the first conductive line, and a fin portion extending along a sidewall of the insulating wall from one end of the base portion in a direction away from the first conductive line,
forming a gap-fill insulating film on the heating electrode layer, and
forming a resistive memory layer on the fin portion of the heating electrode layer, the resistive memory layer including a wedge memory portion and a body memory portion located in a space between the insulating wall and the gap-fill insulating film, the wedge memory portion contacting the fin portion of the heating electrode layer and having an inclined sidewall such that the wedge memory portion has a width that increases continuously with increasing distance from the heating electrode layer, the body memory portion being connected to the wedge memory portion.

18. The method according to claim 17, further comprising:
forming an insulating spacer covering the sidewall of the insulating wall before the forming of the heating electrode layer,
wherein a height of the insulating spacer is smaller than a height of the insulating wall, and
wherein the insulating spacer includes a different material from the insulating wall and the gap-fill insulating film.

19. The method according to claim 17, further comprising:
forming an insulating spacer on the heating electrode layer before the forming of the gap-fill insulating film,
wherein the gap-fill insulating film is formed on the insulating spacer, the insulating spacer being interposed between the heating electrode layer and the gap-fill insulating film, wherein a height of the insulating spacer is smaller than a height of the insulating wall,
wherein the insulating spacer includes a different material from the insulating wall and the gap-fill insulating film,
wherein the heating electrode layer conformally covers the insulating wall and the first conductive line, and
wherein an included angle between the base portion and the fin portion is a right angle.

20. The method according to claim 17, further comprising:
forming an insulating spacer on the heating electrode layer before the forming of the gap-fill insulating film,
wherein, in the forming of the resistive memory layer, the resistive memory layer is formed such that the body memory portion covers a top surface of the insulating spacer.

* * * * *